(12) United States Patent
Liu et al.

(10) Patent No.: US 10,879,932 B2
(45) Date of Patent: Dec. 29, 2020

(54) ENCODING METHOD AND DEVICE, AND APPARATUS

(71) Applicant: HUAWEI TECHNOLOGIES CO., LTD., Guangdong (CN)

(72) Inventors: Xiaocheng Liu, Hangzhou (CN); Ying Chen, Hangzhou (CN); Rong Li, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/261,220

(22) Filed: Jan. 29, 2019

(65) Prior Publication Data

US 2019/0165813 A1    May 30, 2019

Related U.S. Application Data

(63) Continuation of application No. PCT/CN2017/090359, filed on Jun. 27, 2017.

(30) Foreign Application Priority Data

Jul. 29, 2016    (CN) .......................... 2016 1 0619696
Jun. 13, 2017    (WO) ................. PCT/CN2017/088023

(51) Int. Cl.
*H03M 13/13*    (2006.01)
*H04L 1/00*    (2006.01)
(Continued)

(52) U.S. Cl.
CPC ......... *H03M 13/13* (2013.01); *H03M 13/033* (2013.01); *H03M 13/2906* (2013.01);
(Continued)

(58) Field of Classification Search
CPC ............. H03M 13/13; H03M 13/2906; H03M 13/033; H03M 13/616; H03M 13/6362; H04L 1/0057; H04L 1/0009; H04L 1/0056
See application file for complete search history.

(56) References Cited

U.S. PATENT DOCUMENTS

2009/0086839 A1*  4/2009  Xu .................... H03M 13/19
                                                    375/262
2014/0173376 A1   6/2014  Jeong et al.
(Continued)

FOREIGN PATENT DOCUMENTS

CN    102164025 B    6/2013
CN    104079382 A    10/2014
(Continued)

OTHER PUBLICATIONS

M. Valipour and S. Yousefi, "On Probabilistic Weight Distribution of Polar Codes," in IEEE Communications Letters, vol. 17, No. 11, pp. 2120-2123, Nov. 2013 (Year: 2013).*
(Continued)

*Primary Examiner* — Cynthia Britt
(74) *Attorney, Agent, or Firm* — Fish & Richardson P.C.

(57) ABSTRACT

The present disclosure relates to encoding method and devices. One example method includes determining N to-be-encoded bits, where the N to-be-encoded bits include information bits and frozen bits, obtaining a first polarization weight vector including polarization weights of N polarized channels, where the N to-be-encoded bits correspond to the N polarized channels, determining positions of the information bits based on the first polarization weight vector, and performing polar encoding on the N to-be-encoded bits to obtain polar-encoded bits.

18 Claims, 9 Drawing Sheets

(51) Int. Cl.
  *H03M 13/03* (2006.01)
  *H03M 13/29* (2006.01)
  *H03M 13/00* (2006.01)
(52) U.S. Cl.
  CPC ........ *H03M 13/616* (2013.01); *H04L 1/0057* (2013.01); *H03M 13/6362* (2013.01); *H04L 1/0009* (2013.01)

(56) References Cited

U.S. PATENT DOCUMENTS

| | | | |
|---|---|---|---|
| 2015/0194987 A1 | 7/2015 | Li et al. | |
| 2016/0182187 A1* | 6/2016 | Kim | H03M 13/09 714/807 |
| 2018/0026663 A1* | 1/2018 | Wu | H03M 13/6362 714/776 |
| 2018/0166148 A1* | 6/2018 | Huang | G11C 29/44 |
| 2019/0081735 A1* | 3/2019 | Chen | H03M 13/13 |
| 2019/0140663 A1* | 5/2019 | Noh | H03M 13/6306 |
| 2019/0326933 A1* | 10/2019 | Zhang | H03M 13/13 |
| 2020/0021315 A1* | 1/2020 | Chen | H03M 13/6368 |

FOREIGN PATENT DOCUMENTS

| | | |
|---|---|---|
| CN | 105680883 A | 6/2016 |
| EP | 3444980 A1 | 2/2019 |
| WO | 2014092502 A1 | 6/2014 |

OTHER PUBLICATIONS

Extended European Search Report issued in European Application No. 17833376.1 on May 20, 2019, 10 pages.
Wang et al., "A Novel Puncturing Scheme for Polar Codes," IEEE Communications Letters, vol. 18, No. 12, Dec. 1, 2014, 4 pages.
Erdal Arikan,"Channel polarization: A method for constructing capacity-achieving codes for symmetric binary-input memoryless channels", IEEE Transactions on Information Theory ( vol. 55 , Issue: 7 , Jul. 2009 ),pp. 3051-3073.
Bin Duo et al.,"Low complexity Polar-LDGM code construction scheme near Shannon capacity limit",High Technology Letters vol. 23,No. 6,dated 2003,total 8 pages.
3GPP TS 36.212 V13.2.0 (Jun. 2016),3rd Generation Partnership Project;Technical Specification Group Radio Access Network;Evolved Universal Terrestrial Radio Access (E-UTRA);Multiplexing and channel coding(Release 13),total 140 pages.
International Search Report and Written Opinion issued in International Application No. PCT/CN2017/088023 dated Jul. 24, 2017, 17 pages.
International Search Report and Written Opinion issued in International Application No. PCT/CN2017/090359 dated Oct. 9, 2017, 21 pages.
Huawei, HiSilicon, "Polar code design and rate matching," 3GPP TSG-RAN WG1 Meeting #86, R1-167209; Gothenburg, Sweden, Aug. 22-26, 2016, 5 pages.
Office Action issued in Japanese Application No. 2019-504681 dated Feb. 25, 2020, 8 pages. (with English translation).
Office Action issued in Indian Application No. 201917000585 dated Jul. 30, 2020, 7 pages.

* cited by examiner

ENCODING METHOD AND DEVICE, AND APPARATUS

CROSS-REFERENCE TO RELATED APPLICATIONS

This application is a continuation of International Application No. PCT/CN2017/090359, filed on Jun. 27, 2017, which claims priority to International Application No. PCT/CN2017/088023, filed on Jun. 13, 2017, and Chinese Patent Application No. 201610619696.5, filed on Jul. 29, 2016. The disclosures of the aforementioned applications are hereby incorporated by reference in their entireties.

TECHNICAL FIELD

This application relates to the field of encoding and decoding technologies, and in particular, to an encoding method and device.

BACKGROUND

Channel encoding is a radio access technology used in a communications system to improve data transmission reliability and ensure communication quality. A polar (polar) code is an encoding scheme that has low encoding and decoding complexity and that theoretically proves that a Shannon limit can be reached. The polar code is a linear block code whose generator matrix is $G_N$ and whose encoding process is $x_1^N = u_1^N G_N$, where $x_1^N$ is an encoded bit and $u_1^N$ is a to-be-encoded bit; $u_1^N = (u_1, u_2, \ldots, u_N)$ is a binary row vector whose length is N (that is, a code length); and $G_N$ is an N×N matrix, and $G_N = B_N F_2^{\otimes(log_2(N))}$.

$$F_2 = \begin{bmatrix} 1 & 0 \\ 1 & 1 \end{bmatrix},$$

and $B_N$ is an N×N transposed matrix, for example, a bit reversal (Bit Reversal) matrix. $F_2^{\otimes(log_2(N))}$ is defined as a Kronecker (Kronecker) product of $log_2 N$ matrices $F_2$. In a polar code encoding process, positions of information bits and those of frozen bits in $u_1^N$ need to be first determined. A bit used to carry information is referred to as an information bit, and a remaining bit that is set to a fixed value pre-agreed on by a transmit end and a receive end is referred to as a frozen bit. Then, encoding is performed based on $x_1^N = u_1^N G^N$. Specifically, polarized channel reliability corresponding to each input bit may be estimated in different manners, and a polarized channel with high reliability is preferentially selected to place an information bit. In actual application, positions of information bits needs to be indicated by using a sequence, and positions of information bits may keep the same between a transmit end and a receive end in an online calculation manner or an offline storage manner.

In the prior art, there are three methods for estimating polarized channel reliability. One method is to calculate a Bhattacharyya (Bhattacharyya) parameter of each polarized channel, where the parameter reflects an error probability of the polarized channel, and then to select polarized channels corresponding to K smallest Bhattacharyya parameters to place information bits. However, this method is applicable to only a binary erasure channel, and cannot accurately perform reliability estimation on other channels, resulting in low performance. The other two methods are a density evolution (Density evolution, DE) method and a Gaussian approximation (Gaussian approximation, GA) method, respectively. The DE method and the GA method have relatively high calculation complexity and are unsuitable for online calculation. For offline storage, the DE method and the GA method depend on a parameter rate matching manner, a code rate, and a modulation scheme of an actual channel during reliability calculation. A change in any one of the foregoing parameters results in a change in a reliability estimation result of the polarized channel and a change in a position of a corresponding information bit. This consequently causes excessively high storage overheads.

SUMMARY

This application provides an encoding method and device, to reduce calculation complexity and storage complexity of polar code encoding.

According to a first aspect, this application provides an encoding method, including:

after input information bits are received, determining a quantity N of to-be-encoded bits based on a target code length M of a polar code, where N is a positive integer; afterwards obtaining a first polarization weight vector including polarization weights of N polarized channels, where the polarization weights are a basis for information bit selection; then determining positions of the information bits based on the first polarization weight vector; and finally performing polar encoding on the N to-be-encoded bits to obtain polar-encoded bits. Therefore, positions of the information bits and those of frozen bits are determined by calculating polarization weights of polar-code polarized channels, without relating to a channel parameter and a code rate. This can reduce calculation complexity of polar code encoding. In addition, polarization weights corresponding to polar codes with different code lengths and code rates have a same part, so that storage space is greatly reduced, and storage complexity of polar code encoding can also be reduced.

In a possible design, the target code length M of the polar code is equal to a positive integer power of 2, M is a positive integer, and the determining N to-be-encoded bits includes: determining that N is equal to M, where the target code length of the polar code is an output code length of the polar code; and the obtaining a first polarization weight vector including polarization weights of N polarized channels includes: calculating the polarization weights of the N polarized channels to obtain the first polarization weight vector.

In a possible design, the calculating the polarization weights of the N polarized channels to obtain the first polarization weight vector includes: calculating the polarization weights $W_i$ of the N polarized channels according to the following formula, to obtain the first polarization weight vector:

$$W_i = \sum_{j=0}^{n-1} B_j * (2^j + \phi)^\alpha,$$

where $i \triangleq B_{n-1} B_{n-2} \ldots B_0$, i is a channel index number, $B_{n-1} B_{n-2} \ldots B_0$ is a binary representation of i. $B_{n-1}$ is a most significant bit, $B_0$ is a least significant bit, $B_j \in \{0,1\}$, $j \in \{0, 1, \ldots, n-1\}$, $i \in \{0, 1, \ldots, N-1\}$, $N=2^n$, n is a positive integer, and ϕ and α are parameters that are preset based on the target code length and a code rate of the polar code.

In a possible design, the calculating the polarization weights of the N polarized channels to obtain the first polarization weight vector includes: obtaining the first polarization weight vector $W_0^{N-1}$ through recursion calculation according to the following formulas:

$\beta_i = (2^{i-1} + \phi)^\alpha;$ $W_{2^{i-1}}^{2^{i}-1} = W_0^{2^{i-1}-1} + \beta_i;$ and $W_0^{2^i-1} = [W_0^{2^{i-1}-1}, W_{2^{i-1}}^{2^i-1}];$ where $W_0^1 = [W_0, W_1], W_0^{2^i-1} = [W_0, W_1, \ldots, W_{2^i-1}],$ where $i \in \{1, \ldots, N-1\}$, $\beta_i$ is an intermediate variable related to a channel index number i, ϕ and α are parameters that are preset based on the target code length and a code rate of the polar code, and $W_0$ is an arbitrary constant.

In a possible design, the target code length M of the polar code is equal to a positive integer power of 2, and the obtaining a first polarization weight vector including polarization weights of N polarized channels includes: obtaining the first polarization weight vector from a prestored second polarization weight vector, where the second polarization weight vector includes polarization weights of $N_{max}$ polarized channels, $N_{max}$ is a preset mother code length corresponding to a maximum code length supported by a communications system, and the mother code length is a positive integer power of 2.

After the input information bits are received, the quantity N of to-be-encoded bits is determined based on the target code length M of the polar code; afterwards, the first polarization weight vector is obtained from the prestored second polarization weight vector, where the second polarization weight vector includes the polarization weights of the $N_{max}$ polarized channels, and $N_{max}$ is the mother code length corresponding to the maximum code length supported by the communications system; then, positions of the information bits are determined based on the first polarization weight vector; and finally, polar encoding is performed on the N to-be-encoded bits to obtain the polar-encoded bits. Therefore, the position of the information bits and those of the frozen bits are determined by obtaining polarization weights of polar-code polarized channels in an offline storage manner. For polar codes with different code lengths and code rates, an element set in a polarization weight vector corresponding to a short-code length is a subset of an element set in a weight vector corresponding to a long-code length, and polarized channels with a same index number (sequence number) have a same polarization weight value. Therefore, storage space can be reduced, and storage complexity of polar code encoding can be reduced. Compared with online calculation, when there is enough storage space, the offline storage manner can shorten latency caused by online calculation.

In a possible design, when the target code length M of the polar code is less than or equal to $N_{max}$, an element set in the first polarization weight vector is a subset of an element set in the second polarization weight vector; or when the target code length M of the polar code is greater than or equal to $N_{max}$, a polarization weight of a polarized channel whose channel index number is less than or equal to $N_{max}$ is in a one-to-one correspondence with a polarization weight in the second polarization weight vector, and a polarization weight of a polarized channel whose channel index number is greater than $N_{max}$ is equal to a weight increment $$\beta = \sum_{j=log_2(N_{max})}^{\lfloor log_2(M-1) \rfloor} (2^j + \phi)^\alpha$$

plus the corresponding polarization weight of the polarized channel whose channel index number is less than or equal to $N_{max}$, where ϕ and α are parameters that are preset based on the target code length and a code rate of the polar code.

After the input information bits are received, the quantity N of to-be-encoded bits is determined based on the target code length M of the polar code; afterwards, the first polarization weight vector is obtained from the prestored second polarization weight vector, where the second polarization weight vector includes the polarization weights of the $N_{max}$ polarized channels, and $N_{max}$ is the maximum mother code length supported by the communications system; then, positions of the information bits are determined based on the first polarization weight vector; and finally, polar encoding is performed on the N to-be-encoded bits to obtain the polar-encoded bits. Therefore, the positions of the information bits and those of the frozen bits are determined by obtaining polarization weights of polar-code polarized channels in a half-online-calculation half-offline-storage manner. For polar codes with different code lengths and code rates, an element set in a polar-code polarization weight vector corresponding to a code length less than prestored $N_{max}$ is a subset of an element set in a weight vector corresponding to $N_{max}$, and polarized channels with a same index number (sequence number) have a same polarization weight value; and in a polar-code polarization weight vector corresponding to a code length greater than prestored $N_{max}$, a polarization weight of a polarized channel whose channel index number is less than or equal to $N_{max}$ is in a one-to-one correspondence with the polarization weight in the second polarization weight vector, and a polarization weight of a polarized channel whose channel index number is greater than $N_{max}$ is equal to a weight increment $$\beta = \sum_{j=log_2(N_{max})}^{\lfloor log_2(M-1) \rfloor} (2^j + \phi)^\alpha$$

plus the corresponding polarization weight of the polarized channel whose channel index number is less than or equal to $N_{max}$. Therefore, storage space can be reduced, and storage complexity of polar code encoding can be reduced. This manner can not only shorten latency caused by online calculation but also reduce storage complexity.

In a possible design, ϕ=0, and α=¼.

In a possible design, the target code length M of the polar code is not equal to a positive integer power of 2, and the determining N to-be-encoded bits includes: determining that $N=2^{\lfloor log_2(M-1) \rfloor + 1}$, where the symbol $\lfloor \ \rfloor$ denotes rounding down.

In a possible design, before the obtaining a first polarization weight vector including polarization weights of N polarized channels, the method further includes: determining positions of N−M to-be-deleted bits in the N to-be-encoded bits, and calculating, based on a result of the determining, a set of modification coefficients including the polarization weights corresponding to the N to-be-encoded bits, where the modification coefficient is used to represent an amount of modification to each polarization weight resulting from bit deletion; and the obtaining a first polarization weight vector including polarization weights of N polarized channels includes: calculating the polarization weights of the N polarized channels based on the set of modification coefficients, to obtain the first polarization weight vector.

In a possible design, the determining positions of N−M to-be-deleted bits in the N to-be-coded bits includes: determining a channel index number sequence $P_0^{N-1}=[0, 1, \ldots, N-1]$ of the N polarized channels; and performing the following operations on each index number in the channel index number sequence; performing bit reversal on a binary number corresponding to each index number, and converting, to a decimal number, a binary number obtained after bit reversal, to obtain a new channel index number sequence $P_0^{N-1'}$; sorting index numbers in the new channel index number sequence $P_0^{N-1'}$; and selecting, in ascending order, N−M index numbers in the channel index number sequence $P_0^{N-1'}$ as index numbers of the to-be-deleted bits.

It should be noted that in this step, an operation performed on each index number is not limited to a bit reversal operation, for example, interleaving, scrambling, or the like may be performed on the binary number corresponding to each index number, or no processing is performed on each index number.

In a possible design, the set of modification coefficients is $$g = \begin{bmatrix} g_{(0,0)} & \cdots & g_{(0,n-1)} \\ g_{(1,0)} & & g_{(1,n-1)} \\ \vdots & \vdots & \vdots \\ g_{(N-1,0)} & & g_{(N-1,n-1)} \\ g_{(N,0)} & g_{(N,1)} & \cdots & g_{(N,n-1)} \end{bmatrix};$$

and the calculating, based on a result of the determining, a set of modification coefficients including modification coefficients of the N bits includes: calculating each item $g_{(i,j)}$ in the set g of modification coefficients according to the following formulas:

$$g_{(i,j)}=(p_i+p_{i+2^{j-2}})/2; \text{ and}$$

$$g_{(i+2^j,j)}=g_{(i,j)}, \text{ where}$$

$i \in \{0, 1, \ldots, N-1\}$, $j \in \{0, 1, \ldots, n-1\}$, $N=2^n$, $P_i$ is an identifier indicating whether a bit corresponding to a polarized channel whose channel index number is i is to be deleted, and $p_i \in \{0,1\}$.

In a possible design, the calculating the polarization weights of the N polarized channels based on the set of modification coefficients, to obtain the first polarization weight vector includes: calculating the polarization weights $W_i$ of the N polarized channels according to the following formula, to obtain the first polarization weight vector:

$$W_i = \sum_{j=0}^{n-1} B_j * (1 - g_{(i,j)}) * (2^j + \phi)^{\alpha},$$

where $i \triangleq B_{n-1}B_{n-2} \ldots B_0$, i is a channel index number, $B_{n-1}B_{n-2} \ldots B_0$ is a binary representation of i. $B_{n-1}$ is a most significant bit, $B_0$ is a least significant bit, $B_j \in \{0,1\}$, $j \in \{0, 1, \ldots, n-1\}$, $i \in \{0, 1, \ldots, N-1\}$, $N=2^n$, $g_{(i,j)}$ is an element in row i and column j in the set g of modification coefficients, and $\phi$ and $\alpha$ are parameters that are preset based on the target code length and a code rate of the polar code.

In a possible design, the calculating the polarization weights of the N polarized channels based on the set of modification coefficients, to obtain the first polarization weight vector includes: obtaining the first polarization weight vector $W_0^{N-1}$ through recursion calculation according to the following formulas:

$$\beta_i = (2^{i-1}+\phi)^{\alpha};$$

$$W_{2^{i-1}}^{2^i-1} = W_0^{2^{i-1}-1} + g_{(i,j)} * \beta_i; \text{ and}$$

$$W_0^{2^i-1} = [W_0^{2^{i-1}-1}, W_{2^{i-1}}^{2^i-1}]; \text{ where}$$

$$W_0^1 = [W_0, W_1], W_0^{2^i-1} = [W_0, W_1, \ldots, W_{2^i-1}], \text{ where}$$

$i \in \{1, \ldots, N-1\}$, $\beta_i$ is an intermediate variable related to a channel index number i, $\phi$ and $\alpha$ are parameters that are preset based on the target code length and a code rate of the polar code, $g_{(i,j)}$ is an element in row i and column j in the set g of modification coefficients, and $W_0$ is an arbitrary constant.

In the foregoing possible design, after the input information bits are received, the quantity N of to-be-encoded bits is determined based on the target code length M of the polar code; afterwards, the positions of the N−M to-be-deleted bits in the N to-be-encoded bits are determined, and the set of modification coefficients including the modification coefficients of the N to-be-encoded bits is calculated based on the result of the determining; then, the polarization weights of the N polarized channels are calculated based on the set of modification coefficients, to obtain the first polarization weight vector; and finally, positions of the information bits are determined based on the first polarization weight vector, and polar encoding is performed on the N to-be-encoded bits to obtain the polar-encoded bits. Therefore, for a polar code with any target code length, positions of information bits and those of frozen bits are determined by calculating polarization weights of polar-code polarized channels, without relating to a channel parameter and a code rate. This can reduce calculation and implementation complexity of polar code encoding.

In a possible design, $\phi=0$, and $\alpha=\frac{1}{4}$.

In a possible design, the determining positions of the information bits based on the first polarization weight vector includes: sorting the polarization weights in the first polarization weight vector in descending order, and selecting bits corresponding to the first K polarization weights as information bits.

In a possible design, the encoding method is executed by a base station or a terminal.

According to a second aspect, this application provides an encoding device, including:

a first determining module, configured to determine N to-be-encoded bits, where the N to-be-encoded bits include information bits and frozen bits, and N is a positive integer; an obtaining module, configured to obtain a first polarization weight vector including polarization weights of N polarized channels, where the polarization weights are a basis for information bit selection, and the N to-be-encoded bits are corresponding to the N polarized channels; a second determining module, configured to determine positions of the information bits based on the first polarization weight vector; and an encoding module, configured to perform polar encoding on the N to-be-encoded bits to obtain polar-encoded bits.

In a possible design, a target code length M of a polar code is equal to a positive integer power of 2, M is a positive integer, and the first determining module is specifically configured to determine that N is equal to M, where the target code length of the polar code is an output code length of the polar code; and the obtaining module is specifically configured to calculate the polarization weights of the N polarized channels to obtain the first polarization weight vector.

In a possible design, the obtaining module is specifically configured to calculate the polarization weights $W_i$ of the N polarized channels according to the following formula, to obtain the first polarization weight vector:

$$W_i = \sum_{j=0}^{n-1} B_j * (2^j + \phi)^\alpha,$$

where $i \triangleq B_{n-1}B_{n-2} \ldots B_0$, i is a channel index number, $B_{n-1}B_{n-2} \ldots B_0$ is a binary representation of i, $B_{n-1}$ is a most significant bit, $B_0$ is a least significant bit, $B_j \in \{0, 1\}$, $j \in \{0, 1, \ldots, n-1\}$, $i \in \{0, 1, \ldots, N-1\}$, $N=2^n$, n is a positive integer, and $\phi$ and $\alpha$ are parameters that are preset based on the target code length and a code rate of the polar code.

In a possible design, the obtaining module is specifically configured to obtain the first polarization weight vector $W_0^{N-1}$ through recursion calculation according to the following formulas:

$\beta_i = (2^{i-1} + \phi)^\alpha$;

$W_{2^{i-1}}^{2^i-1} = W_0^{2^{i-1}-1} + g_{(i,j)} * \beta_i$; and $W_0^{2^i-1} = [W_0^{2^{i-1}-1}, W_{2^{i-1}}^{2^i-1}]$; where $W_0^1 = [W_0, W_1], W_0^{2^i-1} = [W_0, W_1, \ldots, W_{2^i-1}]$, where $i \in \{1, \ldots, N-1\}$, $\beta_i$ is an intermediate variable related to a channel index number i, $\phi$ and $\alpha$ are parameters that are preset based on the target code length and a code rate of the polar code, and $W_0$ is an arbitrary constant.

In a possible design, a target code length M of a polar code is equal to a positive integer power of 2, and the obtaining module is specifically configured to obtain the first polarization weight vector from a prestored second polarization weight vector, where the second polarization weight vector includes polarization weights of $N_{max}$ polarized channels, $N_{max}$ is a preset mother code length corresponding to a maximum code length supported by a communications system, and the mother code length is a positive integer power of 2.

In a possible design, when the target code length M of the polar code is less than or equal to $N_{max}$, an element set in the first polarization weight vector is a subset of an element set in the second polarization weight vector; or when the target code length M of the polar code is greater than or equal to $N_{max}$, a polarization weight of a polarized channel whose channel index number is less than or equal to $N_{max}$, is in a one-to-one correspondence with a polarization weight in the second polarization weight vector, and a polarization weight of a polarized channel whose channel index number is greater than $N_{max}$ is equal to a weight increment $$\beta = \sum_{j=log_2(N_{max})}^{\lfloor log_2(M-1) \rfloor} (2^j + \phi)^\alpha$$

plus the corresponding polarization weight of the polarized channel whose channel index number is less than or equal to $N_{max}$, where $\phi$ and $\alpha$ are parameters that are preset based on the target code length and a code rate of the polar code.

In a possible design, $\phi=0$, and $\alpha=\frac{1}{4}$.

In a possible design, a target code length M of a polar code is not equal to a positive integer power of 2, and the first determining module is specifically configured to determine that $N=2^{\lfloor log_2(M-1) \rfloor +1}$, where the symbol $\lfloor \ \rfloor$ denotes rounding down.

In a possible design, the encoding device further includes: a third determining module, configured to: before the obtaining module obtains the first polarization weight vector including the polarization weights of the N polarized channels, determine positions of N−M to-be-deleted bits in the N to-be-encoded bits; and a calculation module, configured to calculate, based on a result of the determining performed by the third determining module, a set of modification coefficients including the polarization weights corresponding to the N to-be-encoded bits, where the modification coefficient is used to represent an amount of modification to each polarization weight resulting from bit deletion, where the obtaining module is specifically configured to calculate the polarization weights of the N polarized channels based on the set of modification coefficients, to obtain the first polarization weight vector.

In a possible design, the third determining module is specifically configured to: determine a channel index number sequence $P_0^{N-1} = [0, 1, \ldots, N-1]$ of the N polarized channels; and perform the following operations on each index number in the channel index number sequence: performing bit reversal on a binary number corresponding to each index number, and converting, to a decimal number, a binary number obtained after bit reversal, to obtain a new channel index number sequence $P_0^{N-1'}$; sorting index numbers in the new channel index number sequence $P_0^{N-1'}$; and selecting, in ascending order, N−M index numbers in the channel index number sequence $P_0^{N-1'}$ as index numbers of the to-be-deleted bits.

In a possible design, the set of modification coefficients is $$g = \begin{bmatrix} g_{(0,0)} & \cdots & g_{(0,n-1)} \\ g_{(1,0)} & & g_{(1,n-1)} \\ \vdots & \vdots & \vdots \\ g_{(N-1,0)} & & g_{(N-1,n-1)} \\ g_{(N,0)} & g_{(N,1)} & \cdots & g_{(N,n-1)} \end{bmatrix};$$

and the calculation module is specifically configured to calculate each item $g_{(i,j)}$ in the set g of modification coefficients according to the following formulas:

$g_{(i,j)} = (p_i + p_{i+2^j-2})/2$; and $g_{(i+2^j,j)} = g_{(i,j)}$, where $i \in \{0, 1, \ldots, N-1\}$, $j \in \{0, 1, \ldots, n-1\}$, $N=2^n$, $P_i$ is an identifier indicating whether a bit corresponding to a polarized channel whose channel index number is i is to be deleted, and $p_i \in \{0,1\}$.

In a possible design, the obtaining module is specifically configured to calculate the polarization weights $W_i$ of the N polarized channels according to the following formula, to obtain the first polarization weight vector:

$$W_i = \sum_{j=0}^{n-1} B_j * (1 - g_{(i,j)}) * (2^j + \phi)^\alpha,$$

where $i \triangleq B_{n-1}B_{n-2} \ldots B_0$, i is a channel index number, $B_{n-1}B_{n-2} \ldots B_0$ is a binary representation of i. $B_{n-1}$ is a most significant bit, $B_0$ is a least significant bit, $B_j \in \{0,1\}$, $j \in \{0, 1, \ldots, n-1\}$, $i \in \{0, 1, \ldots, N-1\}$, $N=2^n$, $g_{(i,j)}$ is an element in row i and column j in the set g of modification coefficients, and $\phi$ and $\alpha$ are parameters that are preset based on the target code length and a code rate of the polar code.

In a possible design, the obtaining module is specifically configured to obtain the first polarization weight vector $W_0^{N-1}$ through recursion calculation according to the following formulas:

$$\beta_i = (2^{i-1} + \phi)^\alpha;$$

$$W_{2^{i-1}}^{2^i-1} = W_0^{2^{i-1}-1} + g_{(i,j)} * \beta_i; \text{ and}$$

$$W_0^{2^i-1} = [W_0^{2^{i-1}-1}, W_{2^{i-1}}^{2^i-1}]; \text{ where}$$

$W_0^1 = [W_0, W_1], W_0^{2^i-1} = [W_0, W_1, \ldots, W_{2^i-1}]$, where $i \in \{1, \ldots, N-1\}$, $\beta_i$ is an intermediate variable related to a channel index number i, $\phi$ and $\alpha$ are parameters that are preset based on the target code length and a code rate of the polar code, $g_{(i,j)}$ is an element in row i and column j in the set g of modification coefficients, and $W_0$ is an arbitrary constant.

In a possible design, $\phi=0$, and $\alpha=14$.

In a possible design, the second determining module is specifically configured to: sort the polarization weights in the first polarization weight vector in descending order, and select bits corresponding to the first K polarization weights as information bits.

In a possible design, the encoding device is a base station or a terminal.

For beneficial effects of the encoding device provided in the second aspect and all the possible designs of the second aspect, refer to beneficial effects brought by the first aspect and all the possible designs of the first aspect, and details are not repeated herein.

According to a third aspect, this application provides a communications apparatus, including:

a memory, configured to store an instruction for performing an operation; and a processor, coupled with the memory, and according to the instruction, configured to: determine N to-be-encoded bits, where the N to-be-encoded bits include information bits and frozen bits, and N is a positive integer; obtain a first polarization weight vector including polarization weights of N polarized channels, where the polarization weights are a basis for information bit selection, and the N to-be-encoded bits are corresponding to the N polarized channels; determine positions of the information bits based on the first polarization weight vector; and perform polar encoding on the N to-be-encoded bits to obtain polar-encoded bits.

In a possible design, the communications apparatus is a base station or a terminal.

According to a fourth aspect, this application provides a computer storage medium, where the computer storage medium stores a computer-executable instruction, and when the computer-executable instruction is invoked by a computer, the computer executes the method according to all the foregoing embodiments.

DESCRIPTION OF EMBODIMENTS

Figure 1:
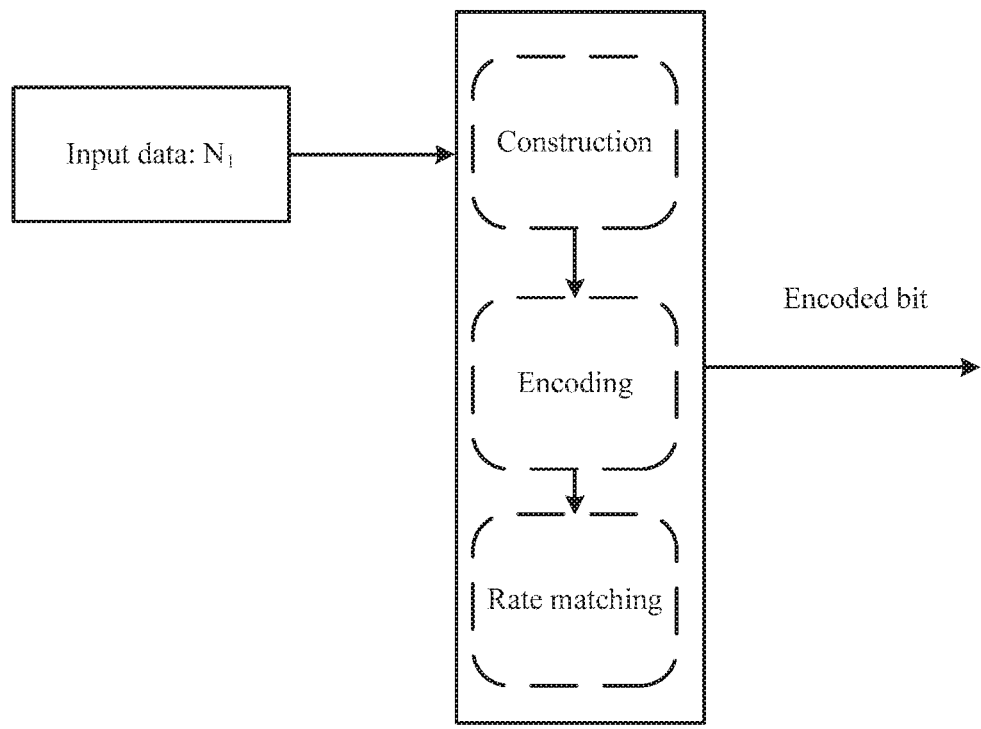
FIG. 1 is a schematic diagram of an existing polar code encoding process.

FIG. 1 is a schematic diagram of an existing polar code encoding process. Polar code encoding is performed by a transmit end. As shown in FIG. 1, a polar code encoding process includes three processing processes: construction, encoding, and rate matching. First, in the construction process, after input data (namely, input information bits, for example, $N_1$ information bits) is received, a quantity N of to-be-encoded bits needs to be determined based on a target code length M obtained after encoding, where the to-be-encoded bits include information bits (whose quantity is $N_1$) and frozen bits (whose quantity is $N_2$), and $N=N_1+N_2$; and positions of the information bits and those of the frozen bits need to be determined, where one bit is corresponding to one polarized channel. Then, in the encoding process, polar encoding is performed on the to-be-encoded bits to obtain polar-encoded bits. Finally, in the rate matching process, because a code length obtained after polar code encoding is a positive integer power of 2, and during actual implementation, the code length needs to be flexibly configured, rate matching needs to be performed to obtain a code with any code length. A specific implementation is deleting some N−M bits from a code with the code length of a positive integer power of 2, to obtain a code with a target code length. N, M, $N_1$, and $N_2$ are all positive integers. An encoding method provided in this application mainly relates to the polar code encoding process shown in FIG. 1, and mainly relates to the construction process. In an existing construction process, in the prior art, channel reliability estimation is performed mostly based on actual parameters and code rates of all polarized channels, so as to determine positions of information bits, and remaining positions are positions of frozen bits. In actual application, the positions of the information bits need to be indicated by using a sequence, and positions of information bits may keep the same in an online calculation manner or an offline storage manner. During offline storage, a quite large table is required to store the sequence, and due to different channel parameters, code rates, and code lengths, millions of sequences need to be stored. Therefore, in an existing manner of determining positions of information bits, both online calculation and offline storage are relatively complex. In view of the foregoing problem, this application provides an encoding method. Positions of information bits and those of frozen bits are determined by calculating polarization weights of polar-code polarized channels, without relating to a channel parameter and a code rate. This can reduce calculation complexity and storage complexity of polar code encoding. The following describes in detail the encoding method and device provided in this application with reference to the accompanying drawings.

This application is mainly applied to various wireless communications systems, and acts on digital signal processing units in the systems, to improve reliability of wireless communication.

Network elements in this application are mainly a base station and a terminal. The base station implements communication with the terminal.

Figure 2:
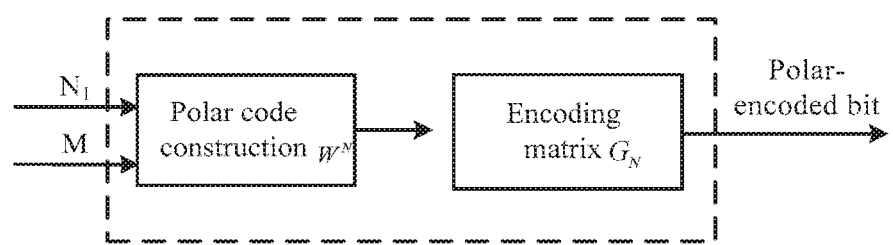
FIG. 2 is a block diagram of an encoding structure in Embodiment 1 of an encoding method according to this application.

FIG. 2 is a block diagram of an encoding structure in Embodiment 1 of an encoding method according to this application. As shown in FIG. 2, both information bits (whose quantity is $N_1$) and a target code length M of a polar code are inputs, and then polar code construction is performed. N to-be-encoded bits are first determined based on the target code length M of the polar code. A quantity of frozen bits is $N_2$, and $N=N_1+N_2$. Positions of the information bits and those of the frozen bits are then determined. Then, encoding is performed by using an encoding matrix $G_N$, to obtain polar-encoded bits.

Figure 3:
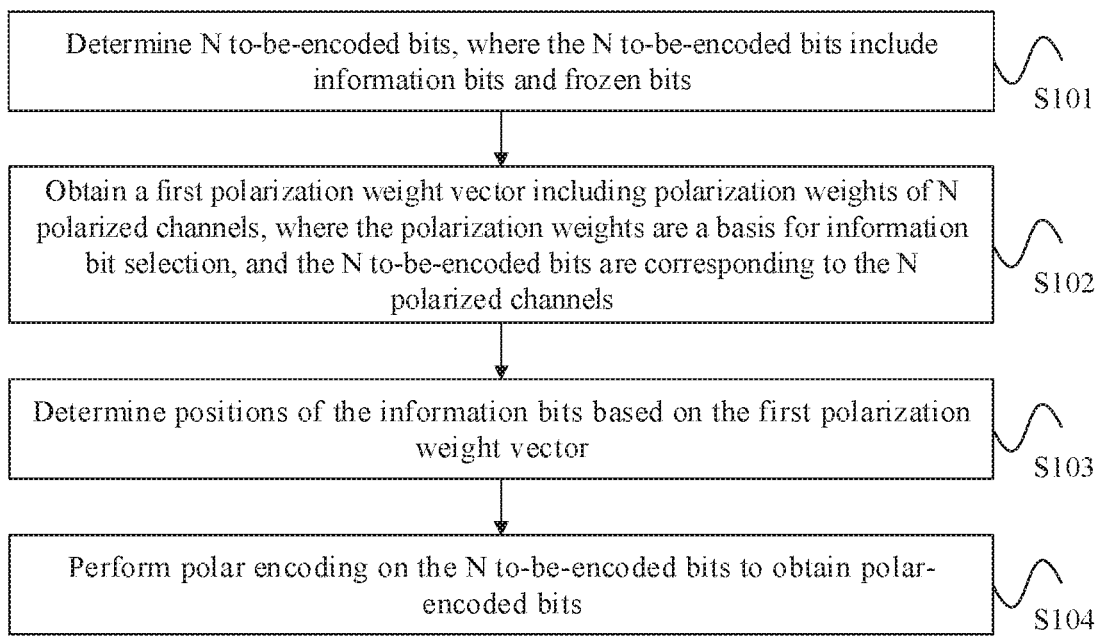
FIG. 3 is a flowchart of Embodiment 1 of an encoding method according to this application.

FIG. 3 is a flowchart of Embodiment 1 of an encoding method according to this application. As shown in FIG. 3, the method in this embodiment may include the following steps.

S101: Determine N to-be-encoded bits, where the N to-be-encoded bits include information bits and frozen bits.

Specifically, a code length obtained after polar code encoding is a positive integer power of 2, and during actual implementation, the code length needs to be flexibly configured, in other words, a polar code with any code length needs to be obtained. Therefore, after input information bits are received, the quantity N of to-be-encoded bits needs to be determined based on a target code length M of a polar code. The N to-be-encoded bits include the information bits and the frozen bits. The target code length of the polar code is an output code length of the polar code. Specifically, there are two cases. One case is that the target code length M of the polar code is equal to a positive integer power of 2, to be specific, there is no need to perform rate matching. In this case, the determined quantity N of to-be-encoded bits is equal to M. The other case is that the target code length M of the polar code is not equal to a positive integer power of 2, to be specific, rate matching needs to be performed. In this case, the determined quantity of to-be-encoded bits is $N=2^{\lfloor \log_2(M-1) \rfloor+1}$, where the symbol $\lfloor \ \rfloor$ denotes rounding down.

S102: Obtain a first polarization weight vector including polarization weights of N polarized channels, where the polarization weights are a basis for information bit selection, and the N to-be-encoded bits are corresponding to the N polarized channels.

Specifically, one bit is corresponding to one polarized channel, and a polarization weight of the polarized channel is a basis for information bit selection. The polarization weight is different from channel reliability in the prior art. For a case in which the target code length M of the polar code is equal to a positive integer power of 2 and a case in which the target code length M of the polar code is not equal to a positive integer power of 2, manners of obtaining the polarization weights are different. The following describes in detail how to obtain the first polarization weight vector when the quantity N of to-be-encoded bits is equal to the target code length M of the polar code. Specifically, the polarization weights $W_i$ of the N polarized channels in the first polarization weight vector are calculated according to the following formula:

$$W_i = \sum_{j=0}^{n-1} B_j * (2^j + \phi)^\alpha,$$

where $i \triangleq B_{n-1}B_{n-2} \ldots B_0$, i is a channel index number, $B_{n-1}B_{n-2} \ldots B_0$ is a binary representation of i. $B_{n-1}$ is a most significant bit, $B_0$ is a least significant bit, $B_j \in \{0, 1\}$, $j \in \{0, 1, \ldots, n-1\}$, $i \in \{0, 1, \ldots, N-1\}$, $N=2^n$, and $\phi$ and $\alpha$ are parameters that are preset based on the target code length and a code rate of the polar code. For polar codes with different code lengths and code rates, the parameters $\phi$ and $\alpha$ may be adjusted, to obtain an information bit indication sequence of the polar code for better performance.

Optionally, in $$W_i = \sum_{j=0}^{n-1} B_j * (2^j + \phi)^\alpha,$$

$\phi=0$, $\alpha=\frac{1}{4}$, and therefore the calculation formula is $$W_i = \sum_{j=0}^{n-1} B_j * 2^{\frac{j}{4}}.$$

The polarization weight of the polarized channel is calculated according to the formula, to determine the information bit, to be specific, to obtain the information bit indication sequence for better performance. For example, if $N=8$, $n=\log_2(8)=3$. For $i=3$ ($i \triangleq 011$), a process of calculating a polarization weight $W_3$ is as follows:

$$W_3 = 1 \times 2^{(0 \times (1/4))} + 1 \times 2^{(1 \times (1/4))} + 0 \times 2^{(2 \times (1/4))} = 2.8192.$$

It should be noted that corresponding polarization weights in all the embodiments of this application are corresponding to a polar-code encoding matrix $F_N$ excluding a bit reversal operation $B_N$. If the encoding matrix includes the bit reversal operation $B_N$, a corresponding bit reversal operation needs to be performed on the calculated polarization weights.

In another implementation, the first polarization weight vector $W_0^{N-1}$ is obtained through recursion calculation according to the following formulas:

$$\beta_i = (2^{i-1} + \phi)^\alpha;$$

$$W_{2^{i-1}}^{2^i-1} = W_0^{2^{i-1}-1} + \beta_i; \text{ and}$$

$W_0^{2^i-1} = [W_0^{2^{i-1}-1}, W_{2^{i-1}}^{2^{i-1}-1}]$; where $W_0^1 = [W_0, W_1], W_0^{2^i-1} = [W_0, W_1, \ldots, W_{2^i-1}]$, where $i \in \{1, \ldots, N-1\}$, $\beta_i$ is an intermediate variable related to a channel index number i, $\phi$ and $\alpha$ are parameters that are preset based on the target code length and a code rate of the polar code, and $W_0$ is an arbitrary constant.

It can be learned from the foregoing formulas that a relationship between polarization weights of polar codes in two adjacent orders may be simply described as $W^N = [W^{N/2}, W^{N/2} + \beta_i]$, where $i = \log_2(N)$. When $i=1$, the value is substituted into the foregoing recursion calculation formulas, to obtain initial formulas for recursion calculation: $\beta_1 = (1+\phi)^\alpha$. $W_1 = W_0 + \beta_1$, and $W_0^1 = [W_0, W_1]$.

For example, when $W_0 = 0$, a calculation formula $$W_i = \sum_{j=0}^{n-1} B_j * (2^j + \phi)^\alpha$$

may be obtained. When $W_0 = 0$, $\phi = 0$, and $\alpha = 1/4$, a calculation formula $$W_i = \sum_{j=0}^{n-1} B_j * 2^{\frac{j}{4}}$$

may be obtained.

The following uses N=8 as an example, and a recursion calculation process is as follows:

First, a polarization weight of a polarized channel is initialized as $W_0 = a$, where a is a constant value, and usually may be set to 0. Then, based on a code length N ($N=2^n$) of the polar code, i is set to 1 to n, and the polarization weight of the polarized channel increases order by order to the target code length N, and the calculation process is shown as follows:

(1) Set an initial value: $W_0 = a$.
(2) $i=1$, $\beta_1 = (1+\phi)^\alpha$, $W_1 = W_0 + \beta_1$, and $W_0^1 = [W_0, W_1] = [W_0, W_0 + \beta_1]$.
(3) $i=2$, $\beta_2 = (2+\phi)^\alpha$, and $[W_0, W_1, W_2, W_3] = [W_0, W_1, W_0+\beta_2, W_1+\beta_2]$.
(4) $i=3$, $\beta_3 = (4+\phi)^\alpha$, and $[W_0, W_1, W_2, W_3, W_4, W_5, W_6, W_7] = [W_0, W_1, W_2, W_3, W_0+\beta_3, W_1+\beta_3, W_2+\beta_3, W_3+\beta_3]$ Finally, $W_0^7 = [W_0, W_1, W_2, W_3, W_4, W_5, W_6, W_7]$ is obtained.

S103: Determine positions of the information bits based on the first polarization weight vector.

Specifically, the polarization weights in the first polarization weight vector may be sorted in descending order, and bits corresponding to the first K polarization weights are selected as information bits. To be specific, positions of the information bits are selected, and remaining positions are set for the frozen bits, so as to obtain the complete to-be-encoded bits with a length of N.

S104: Perform polar encoding on the N to-be-encoded bits to obtain polar-encoded bits.

Specifically, the polar-code encoding matrix $F_N$ is used to complete an encoding process of the to-be-encoded bits.

According to the encoding method provided in this embodiment, after the input information bits are received, the quantity N of to-be-encoded bits is determined based on the target code length M of the polar code; afterwards, the first polarization weight vector including the polarization weights of the N polarized channels is obtained; then, positions of the information bits are determined based on the first polarization weight vector; and finally, polar encoding is performed on the N to-be-encoded bits to obtain the polar-encoded bits. Therefore, the positions of the information bits and those of the frozen bits are determined by calculating polarization weights of polar-code polarized channels, without relating to a channel parameter and a code rate. This can reduce calculation complexity of polar code encoding. In addition, polarization weights corresponding to polar codes with different code lengths and code rates have a same part, so that storage space is greatly reduced, and storage complexity of polar code encoding can also be reduced.

Still further, it can be learned, according to the calculation formula of the polarization weights in Embodiment 1 shown in FIG. 3, that a difference between polarization weights of polar codes in two adjacent orders is a weight increment $\beta_i$. In a specific implementation of S102 in Embodiment 1, the first polarization weight vector is obtained through online calculation. In another implementation, the first polarization weight vector may be obtained in an offline storage manner. Compared with online calculation, when there is enough storage space, the offline storage manner can shorten latency caused by online calculation. The following describes in detail the offline storage manner with reference to FIG. 4. It should be noted that the offline storage manner is applicable to a scenario in which a target code length M of a polar code is equal to a positive integer power of 2.

Figure 4:
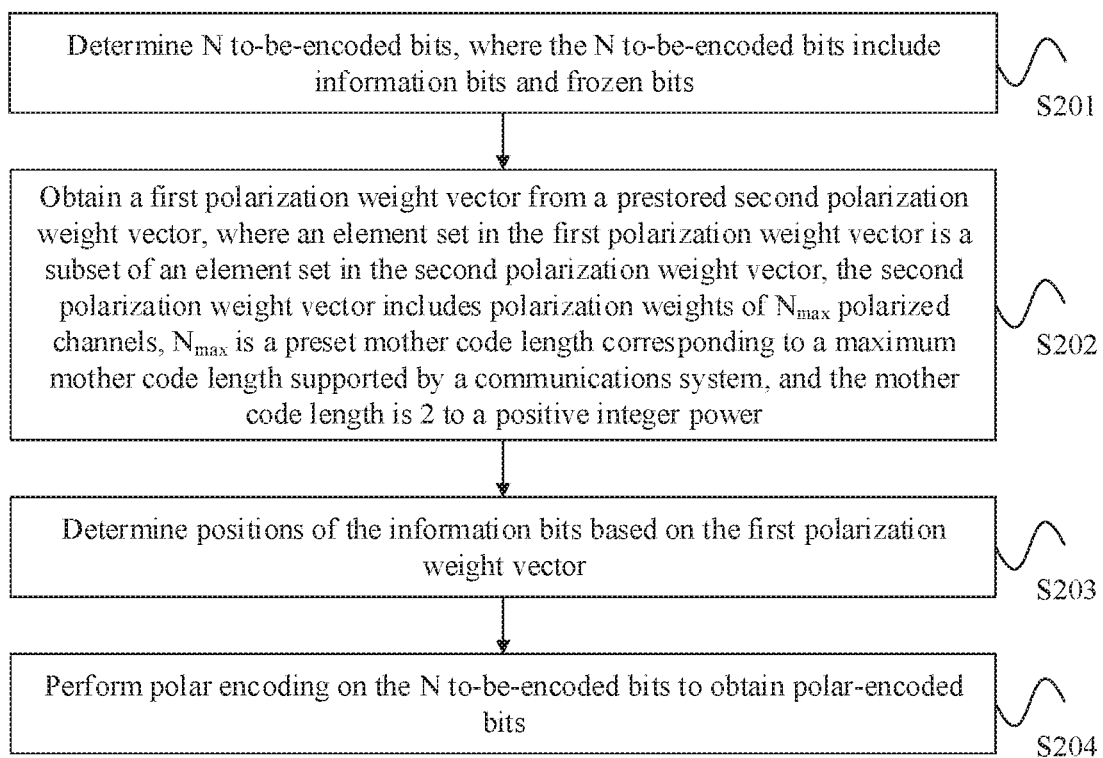
FIG. 4 is a flowchart of Embodiment 2 of an encoding method according to this application.

FIG. 4 is a flowchart of Embodiment 2 of an encoding method according to this application. As shown in FIG. 4, the method in this embodiment may include the following steps.

S201: Determine N to-be-encoded bits, where the N to-be-encoded bits include information bits and frozen bits.

S202: Obtain a first polarization weight vector from a prestored second polarization weight vector, where an element set in the first polarization weight vector is a subset of an element set in the second polarization weight vector, the second polarization weight vector includes polarization weights of $N_{max}$ polarized channels, $N_{max}$ is a preset mother code length corresponding to a maximum code length supported by a communications system, and the mother code length is a positive integer power of 2.

Specifically, the mother code length $N_{max}$ corresponding to the maximum code length supported by the communications system may be preset based on an actual communication scenario, where the mother code length is a positive integer power of 2; and the second polarization weight vector is calculated in advance by using the calculation formulas shown in Embodiment 1, and is stored offline. During usage, the first polarization weight vector is directly obtained from the prestored second polarization weight vector. It can be learned from the calculation formulas shown in Embodiment 1 that when a code length is a positive integer power of 2, an element set in a polarization weight vector corresponding to a short-code length is a subset of an element set in a weight vector corresponding to a long-code length, and polarized channels with a same index number (sequence number) have a same polarization weight value.

Figure 5:
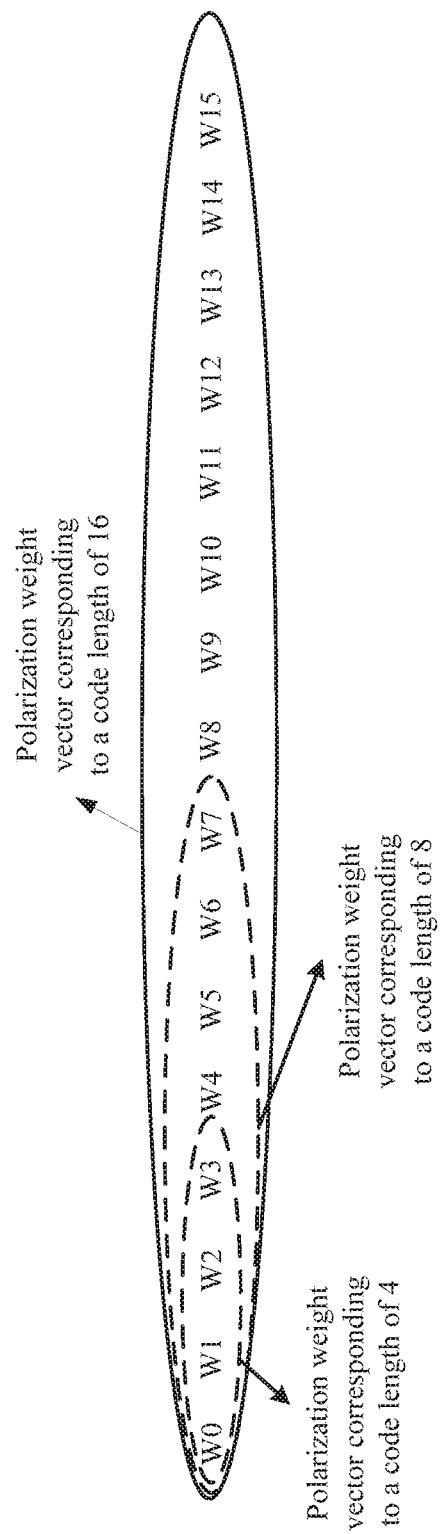
FIG. 5 is a schematic diagram of polarization weight vectors respectively corresponding to polar codes with code lengths N being 4, 8, and 16 according to Embodiment 2 of this application.

An example of polar codes with code lengths N being 4, 8, and 16 is used. FIG. 5 is a schematic diagram of polarization weight vectors respectively corresponding to polar codes with code lengths N being 4, 8, and 16 according to Embodiment 2 of this application. As shown in FIG. 5, an element set in the polarization weight vector corresponding to the code length N=8 is a subset of an element set in the polarization weight vector corresponding to the code length N=16, and an element set in the polarization weight vector corresponding to the code length N=4 is a subset of an element set in the polarization weight vector corresponding to the code length N=8. In addition, polarization weights of polarized channels are the same in a same position. Therefore, a polarization weight vector, corresponding to a maximum code length $N_{max}$, of polarized channels is prestored, so that a polarized channel weight vector corresponding to any code length N less than or equal to $N_{max}$ can be obtained.

S203: Determine positions of the information bits based on the first polarization weight vector.

Specifically, the polarization weights in the first polarization weight vector may be sorted in descending order, and bits corresponding to the first K polarization weights are selected as information bits. To be specific, positions of the information bits are selected, and remaining positions are set for the frozen bits, so as to obtain the complete to-be-encoded bits with a length of N.

S204: Perform polar encoding on the N to-be-encoded bits to obtain polar-encoded bits.

Specifically, a polar-code encoding matrix $F_N$ is used to complete an encoding process of the to-be-encoded bits.

According to the encoding method provided in this embodiment, after input information bits are received, the quantity N of to-be-encoded bits is determined based on the target code length M of the polar code; afterwards, the first polarization weight vector is obtained from the prestored second polarization weight vector, where the second polarization weight vector includes the polarization weights of the $N_{max}$ polarized channels, and $N_{max}$ is the mother code length corresponding to the maximum code length supported by the communications system; then, positions of the information bits are determined based on the first polarization weight vector; and finally, polar encoding is performed on the N to-be-encoded bits to obtain the polar-encoded bits. Therefore, the positions of the information bits and those of the frozen bits are determined by obtaining polarization weights of polar-code polarized channels in an offline storage manner. For polar codes with different code lengths and code rates, an element set in a polarization weight vector corresponding to a short-code length is a subset of an element set in a weight vector corresponding to a long-code length, and polarized channels with a same index number (sequence number) have a same polarization weight value. Therefore, storage space can be reduced, and storage complexity of polar code encoding can be reduced. Compared with online calculation, when there is enough storage space, the offline storage manner can shorten latency caused by online calculation.

Optionally, in a specific implementation different from that in S202 in Embodiment 2, the first polarization weight vector is obtained in the offline storage manner. In another implementation, the first polarization weight vector may be obtained in a half-online-calculation half-offline-storage manner. The following describes in detail the half-online-calculation half-offline-storage manner in Embodiment 3 of this application. It should be noted that this manner is applicable to a scenario in which a target code length M of a polar code is equal to a positive integer power of 2.

Figure 6:
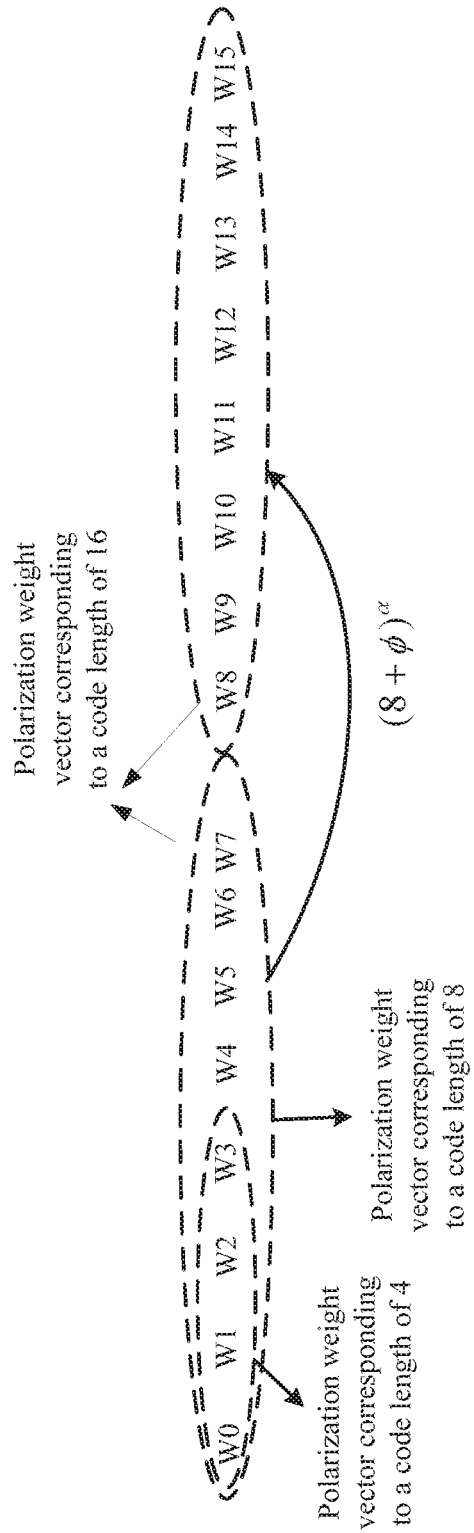
FIG. 6 is a schematic diagram of polarization weight vectors respectively corresponding to polar codes with code lengths N being 4, 8, and 16 according to Embodiment 3 of this application.

The obtaining a first polarization weight vector from a prestored second polarization weight vector in S202 may be specifically: When the target code length M of the polar code is less than or equal to $N_{max}$, the element set in the first polarization weight vector is the subset of the element set in the second polarization weight vector; or when the target code length M of the polar code is greater than or equal to $N_{max}$, a polarization weight of a polarized channel whose channel index number is less than or equal to $N_{max}$ is in a one-to-one correspondence with a polarization weight in the second polarization weight vector, and a polarization weight of a polarized channel whose channel index number is greater than $N_{max}$ is equal to a weight increment $$\beta = \sum_{j=\log_2(N_{max})}^{\lfloor \log_2(M-1) \rfloor} (2^j + \phi)^\alpha$$

plus the corresponding polarization weight of the polarized channel whose channel index number is less than or equal to $N_{max}$, where $\phi$ and $\alpha$ are parameters that are preset based on the target code length and a code rate of the polar code. For example, FIG. 6 is a schematic diagram of polarization weight vectors respectively corresponding to polar codes with code lengths N being 4, 8, and 16 according to Embodiment 3 of this application. In this embodiment, $N_{max}$=8. As shown in FIG. 6, polarization weights stored in the second polarization weight vector are W0 to W7. Polarization weights corresponding to code lengths less than $N_{max}$=8 are extracted from the second polarization weight vector, and polarization weights corresponding to index numbers 8 to 15 in a polarization weight vector corresponding to a code length 16 are obtained by adding a weight increment $(8+\phi)^\alpha$ to the polarization weights corresponding to index numbers 0 to 7.

Optionally, in the foregoing embodiment, $\phi$=0, and $\alpha$=¼.

According to the encoding method provided in this embodiment, after input information bits are received, the quantity N of to-be-encoded bits is determined based on the target code length M of the polar code; afterwards, the first polarization weight vector is obtained from the prestored second polarization weight vector, where the second polarization weight vector includes the polarization weights of the $N_{max}$ polarized channels, and $N_{max}$ is the maximum mother code length supported by the communications system: then, positions of the information bits are determined based on the first polarization weight vector; and finally, polar encoding is performed on the N to-be-encoded bits to obtain the polar-encoded bits. Therefore, the positions of the information bits and those of the frozen bits are determined by obtaining polarization weights of polar-code polarized channels in the half-online-calculation half-offline-storage manner. For polar codes with different code lengths and code rates, an element set in a polar-code polarization weight vector corresponding to a code length less than prestored $N_{max}$ is a subset of an element set in a weight vector corresponding to $N_{max}$, and polarized channels with a same index number (sequence number) have a same polarization weight value; and in a polar-code polarization weight vector corresponding to a code length greater than prestored $N_{max}$, a polarization weight of a polarized channel whose channel index number is less than or equal to $N_{max}$ is in a one-to-one correspondence with the polarization weight in the second polarization weight vector, and a polarization weight of a polarized channel whose channel index number is greater than $N_{max}$ is equal to a weight increment $$\beta = \sum_{j=\log_2(N_{max})}^{\lfloor \log_2(M-1) \rfloor} (2^j + \phi)^\alpha$$

plus the corresponding polarization weight of the polarized channel whose channel index number is less than or equal to $N_{max}$. Therefore, storage space can be reduced, and storage complexity of polar code encoding can be reduced. This manner can not only shorten latency caused by online calculation but also reduce storage complexity.

Figure 7:
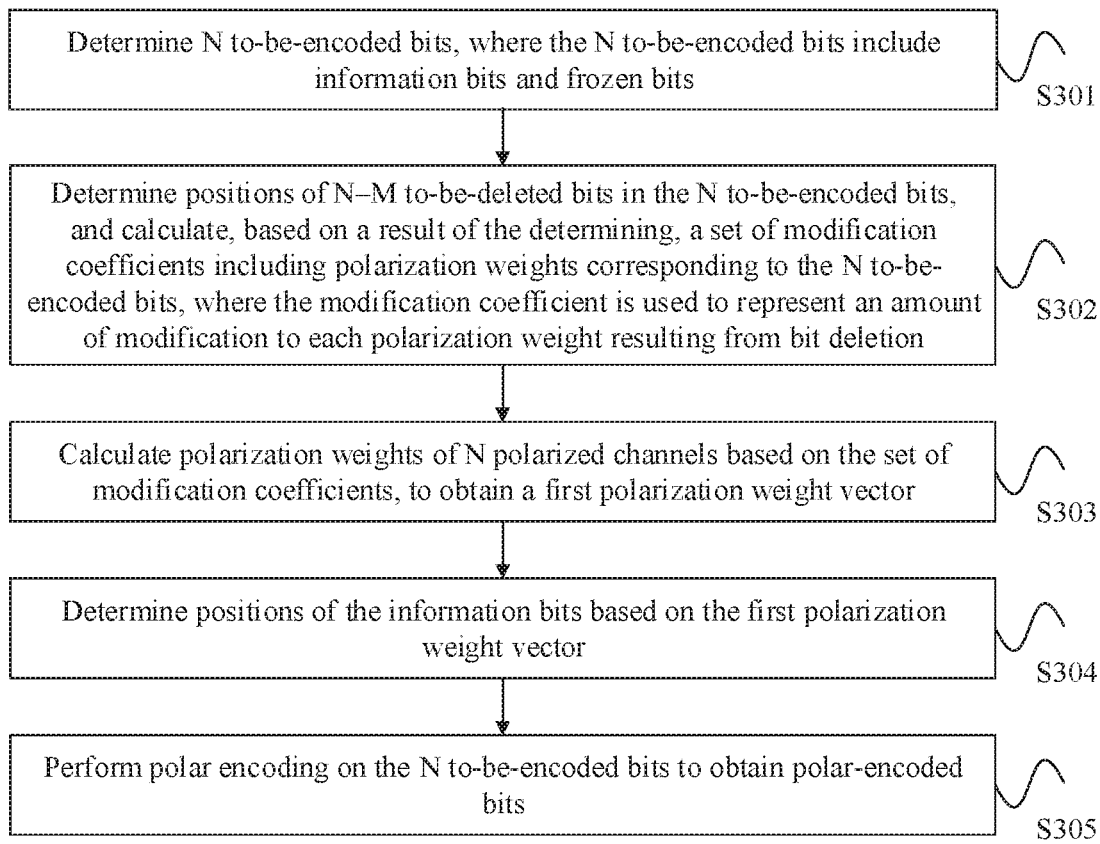
FIG. 7 is a flowchart of Embodiment 4 of an encoding method according to this application.

FIG. 7 is a flowchart of Embodiment 4 of an encoding method according to this application. In this embodiment, the following describes in detail how to obtain a first polarization weight vector when a target code length M of a polar code is not equal to a positive integer power of 2, to be specific, when rate matching needs to be performed. As shown in FIG. 7, the method in this embodiment may include the following steps.

S301: Determine N to-be-encoded bits, where the N to-be-encoded bits include information bits and frozen bits.

Specifically, a code length obtained after polar code encoding is a positive integer power of 2, and during actual implementation, the code length needs to be flexibly configured, in other words, a polar code with any code length needs to be obtained. Therefore, after input information bits are received, the quantity N of to-be-encoded bits needs to be determined based on a target code length M of a polar code. The N to-be-encoded bits include the information bits and the frozen bits. When the target code length M of the polar code is not equal to a positive integer power of 2, to be specific, rate matching needs to be performed, the determined quantity of to-be-encoded bits is $N=2^{\lfloor \log_2(M-1) \rfloor + 1}$, where the symbol $\lfloor \ \rfloor$ denotes rounding down.

S302: Determine positions of N−M to-be-deleted bits in the N to-be-encoded bits, and calculate, based on a result of the determining, a set of modification coefficients including polarization weights corresponding to the N to-be-encoded bits, where the modification coefficient is used to represent an amount of modification to each polarization weight resulting from bit deletion.

Specifically, the determining positions of N−M to-be-deleted bits in the N to-be-encoded bits includes the following steps:

(1) Determine a channel index number sequence $P_0^{N-1} = [0, 1, \ldots, N-1]$ of N polarized channels.

(2) Perform the following operations on each index number in the channel index number sequence:

(3) Perform bit reversal on a binary number corresponding to each index number, and convert, to a decimal number, a binary number obtained after bit reversal, to obtain a new channel index number sequence $P_0^{N-1'}$.

It should be noted that in this step, an operation performed on each index number is not limited to a bit reversal operation, for example, interleaving, scrambling, or the like may be performed on the binary number corresponding to each index number, or no processing is performed on each index number.

(4) Sort index numbers in the new channel index number sequence $P_0^{N-1'}$.

(5) Select, in ascending order, N−M index numbers in the channel index number sequence $P_0^{N-1'}$ as index numbers of the to-be-deleted bits.

For example, in the original channel index number sequence $P_0^{N-1} = [0, 1, \ldots, N-1]$, a binary number corresponding to an index number in the original channel index number sequence is $A_i \triangleq B_{n-1} B_{n-2} \ldots B_0$, and a binary number obtained after bit reversal is $A'_i \triangleq B_0 B_1 \ldots B_{n-1}$, where $B_j \in \{0,1\}$ and $j \in \{0, 1, \ldots, n-1\}$. After the bit reversal operation is performed on all elements in $P_0^{N-1}$, $P_0^{N-1'}$ is obtained. After all the index numbers in $P_0^{N-1'}$ are re-sorted, bits corresponding to N−M index numbers are selected from the channel index number sequence $P_0^{N-1'}$ in ascending order as to-be-deleted bits.

Due to introduction of bit deletion, coefficients of the polarization weights need to be modified, and the corresponding set g of modification coefficients is in a one-to-one correspondence with each computing node in a butterfly decoding tree, and therefore is an N×n vector. The set of modification coefficients is $$g = \begin{bmatrix} g_{(0,0)} & \cdots & g_{(0,n-1)} \\ g_{(1,0)} & & g_{(1,n-1)} \\ \vdots & \vdots & \vdots \\ g_{(N-1,0)} & & g_{(N-1,n-1)} \\ g_{(N,0)} & g_{(N,1)} & \cdots & g_{(N,n-1)} \end{bmatrix};$$

and the calculating, based on a result of the determining, a set of modification coefficients including modification coefficients of the N bits may be specifically: calculating each item $g_{(i,j)}$ in the set g of modification coefficients according to the following formulas:

$g_{(i,j)} = (p_i + p_{i+2_{j-2}})/2$; and $g_{(i+2^j, j)} = g_{(i,j)}$, where $i \in \{0, 1, \ldots, N-1\}$, $j \in \{0, 1, \ldots, n-1\}$, $N=2^n$, $P_i$ is an identifier indicating whether a bit corresponding to a polarized channel whose channel index number is i is to be deleted, and $p_i \in \{0,1\}$.

Specifically, when j=n−1, initial g is calculated by using the following formulas:

$g_{(i,j)} = (p_i + p_{i+2_{j-2}})/2$; and $g_{(i+2^j, j)} = g_{(i,j)}$; and when $I = [n−2, n−3, \ldots, 1, 0]$, remaining coefficients of g are calculated by using the following formulas:

$g_{(i,j)} = (p_i + p_{i+2_{j-2}})/2$; and $g_{(i+2^j, j)} = g_{(i,j)}$.

The following provides an example for description. For example, $N=2^n$:

when j=2, $g_{(0,2)} = (P_0 + P_4)/2$, and $g_{(4,2)} = g_{(0,2)}$;

$g_{(1,2)} = (P_1 + P_5)/2$, and $g_{(5,2)} = g_{(1,2)}$;

$g_{(2,2)} = (P_2 + P_6)/2$, and $g_{(6,2)} = g_{(2,2)}$; and $g_{(3,2)} = (P_3 + P_7)/2$, and $g_{(7,2)} = g_{(3,2)}$;

when $j \in \{0,1\}$ $g_{(0,1)} = (g_{(0,2)} + g_{(2,2)})/2$, and $g_{(2,1)} = g_{(0,1)}$;

$g_{(1,1)} = (g_{(1,2)} + g_{(3,2)})/2$, and $g_{(3,1)} = g_{(1,1)}$; and $g_{(0,0)} = (g_{(0,1)} + g_{(1,1)})/2$, and $g_{(1,0)} = g_{(0,1)}$;

Remaining $g_{(i,j)}$ is calculated according to the same rule.

S303: Calculate polarization weights of N polarized channels based on the set of modification coefficients, to obtain a first polarization weight vector.

Specifically, in an implementation, the polarization weights $W_i$ of the N polarized channels are calculated according to the following formula, to obtain the first polarization weight vector:

$$W_i = \sum_{j=0}^{n-1} B_j * (1 - g_{(i,j)}) * (2^j + \phi)^\alpha,$$

$i \triangleq B_{n-1} B_{n-2} \ldots B_0$, i is a channel index number, $B_{n-1} B_{n-2} \ldots B_0$ is a binary representation of i. $B_{n-1}$ is a most significant bit, $B_0$ is a least significant bit, $B_j \in \{0,1\}$, $j \in \{0, 1, \ldots, n-1\}$, $i \in \{0, 1, \ldots, N-1\}$, $N=2^n$, $g_{(i,j)}$ is an element in row i and column j in the set g of modification coefficients, and $\phi$ and $\alpha$ are parameters that are preset based on the target code length and a code rate of the polar code.

In another implementation, the first polarization weight vector $W_0^{N-1}$ is obtained through recursion calculation according to the following formulas:

$$\beta_i = (2^{i-1} + \phi)^\alpha;$$

$$W_{2^{i-1}}^{2^i-1} = W_0^{2^{i-1}-1} + g_{(i,j)} * \beta_i; \text{ and}$$

$$W_0^{2^i-1} = [W_0^{2^{i-1}-1}, W_{2^{i-1}}^{2^i-1}]; \text{ where}$$

$$W_0^1 = [W_0, W_1], W_0^{2^i-1} = [W_0, W_1, \ldots, W_{2^i-1}], \text{ where}$$

$i \in \{1, \ldots, N-1\}$, $\beta_i$ is an intermediate variable related to a channel index number i, i, $\phi$ and $\alpha$ are parameters that are preset based on the target code length and a code rate of the polar code, $g_{(i,j)}$ is an element in row i and column j in the set g of modification coefficients, and $W_0$ is an arbitrary constant.

Optionally, in the foregoing formula, $4=0$, and $\alpha=\frac{1}{4}$.

S304: Determine positions of the information bits based on the first polarization weight vector.

Specifically, the polarization weights in the first polarization weight vector may be sorted in descending order, and bits corresponding to the first K polarization weights are selected as information bits. To be specific, positions of the information bits are selected, and remaining positions are set for the frozen bits, so as to obtain the complete to-be-encoded bits with a length of N.

S305: Perform polar encoding on the N to-be-encoded bits to obtain polar-encoded bits.

Specifically, a polar-code encoding matrix $F_N$ is used to complete an encoding process of the to-be-encoded bits.

According to the encoding method provided in this embodiment, after the input information bits are received, the quantity N of to-be-encoded bits is determined based on the target code length M of the polar code; afterwards, the positions of the N–M to-be-deleted bits in the N to-be-encoded bits are determined, and the set of modification coefficients including the modification coefficients of the N to-be-encoded bits is calculated based on the result of the determining; then, the polarization weights of the N polarized channels are calculated based on the set of modification coefficients, to obtain the first polarization weight vector; and finally, positions of the information bits are determined based on the first polarization weight vector, and polar encoding is performed on the N to-be-encoded bits to obtain the polar-encoded bits. Therefore, for a polar code with any target code length, positions of information bits and those of frozen bits are determined by calculating polarization weights of polar-code polarized channels, without relating to a channel parameter and a code rate. This can reduce calculation and implementation complexity of polar code encoding.

Figure 8:
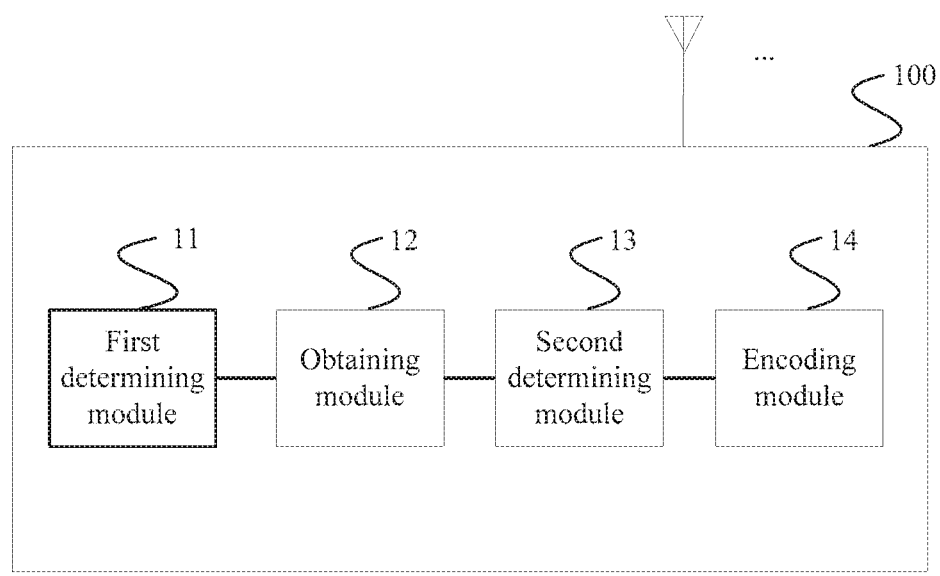
FIG. 8 is a schematic structural diagram of Embodiment 1 of an encoding device according to this application.

FIG. 8 is a schematic structural diagram of Embodiment 1 of an encoding device according to this application. As shown in FIG. 8, the encoding device 100 in this embodiment may include a first determining module 11, an obtaining module 12, a second determining module 13, and an encoding module 14. The first determining module 11 is configured to determine N to-be-encoded bits. The N to-be-encoded bits include information bits and frozen bits. The obtaining module 12 is configured to obtain a first polarization weight vector including polarization weights of N polarized channels. The polarization weights are a basis for information bit selection, and the N to-be-encoded bits are corresponding to the N polarized channels. The second determining module 13 is configured to determine positions of the information bits based on the first polarization weight vector. The encoding module 14 is configured to perform polar encoding on the N to-be-encoded bits to obtain polar-encoded bits.

Further, a target code length M of a polar code is equal to a positive integer power of 2, and the first determining module 11 is specifically configured to determine that N is equal to M. The target code length of the polar code is an output code length of the polar code. The obtaining module 12 is specifically configured to calculate the polarization weights of the N polarized channels to obtain the first polarization weight vector.

Optionally, the obtaining module 12 is specifically configured to calculate the polarization weights $W_i$ of the N polarized channels according to the following formula, to obtain the first polarization weight vector:

$$W_i = \sum_{j=0}^{n-1} B_j * (2^j + \phi)^\alpha,$$

where $i \triangleq B_{n-1} B_{n-2} \ldots B_0$, i is a channel index number, $B_{n-1} B_{n-2} \ldots B_0$ is a binary representation of i. $B_{n-1}$ is a most significant bit, $B_0$ is a least significant bit, $B_j \in \{0,1\}$, $j \in \{0, 1, \ldots, n-1\}$, $i \in \{0, 1, \ldots, N-1\}$, $N=2^n$, $\phi$ and $\alpha$ are parameters that are preset based on the target code length and a code rate of the polar code.

Optionally, the obtaining module 12 is specifically configured to obtain the first polarization weight vector $W_0^{N-1}$ through recursion calculation according to the following formulas:

$$\beta_i = (2^{i-1} + \phi)^\alpha;$$

$$W_{2^{i-1}}^{2^i-1} = W_0^{2^{i-1}-1} + \beta_i; \text{ and}$$

$$W_0^{2^i-1} = [W_0^{2^{i-1}-1}, W_{2^{i-1}}^{2^i-1}]; \text{ where}$$

$$W_0^1 = [W_0, W_1], W_0^{2^i-1} = [W_0, W_1, \ldots, W_{2^i-1}], \text{ where}$$

$i \in \{1, \ldots, N-1\}$, $\beta_i$ is an intermediate variable related to a channel index number i, $\phi$ and $\alpha$ are parameters that are preset based on the target code length and a code rate of the polar code, and $W_0$ is an arbitrary constant.

The encoding device in this embodiment may be configured to execute the technical solution in the method embodiment shown in FIG. 3. Their implementation principles are similar, and details are not repeated herein.

It should be noted that the encoding device in this application may be a base station or a terminal.

After receiving input information bits, the encoding device provided in this embodiment determines the quantity N of to-be-encoded bits based on the target code length M of the polar code; afterwards obtains the first polarization weight vector including the polarization weights of the N polarized channels, where the polarization weights are a basis for information bit selection; then determines positions of the information bits based on the first polarization weight vector; and finally performs polar encoding on the N to-be-encoded bits to obtain the polar-encoded bits. Therefore, the position of the information bits and those of the frozen bits are determined by calculating polarization weights of polar-code polarized channels, without relating to a channel parameter and a code rate. This can reduce calculation complexity of polar code encoding. In addition, polarization weights corresponding to polar codes with different code lengths and code rates have a same part, so that storage space is greatly reduced, and storage complexity of polar code encoding can also be reduced.

Optionally, a target code length M of a polar code is equal to a positive integer power of 2, and the obtaining module 12 is specifically configured to obtain the first polarization weight vector from a prestored second polarization weight vector. The second polarization weight vector includes polarization weights of $N_{max}$ polarized channels, $N_{max}$ is a preset mother code length corresponding to a maximum code length supported by a communications system, and the mother code length is a positive integer power of 2.

In this implementation, the polarization weights are obtained in an offline storage manner. Compared with online calculation, when there is enough storage space, the offline storage manner can shorten latency caused by online calculation.

Optionally, when the target code length M of the polar code is less than or equal to $N_{max}$, an element set in the first polarization weight vector is a subset of an element set in the second polarization weight vector; or when the target code length M of the polar code is greater than or equal to $N_{max}$, a polarization weight of a polarized channel whose channel index number is less than or equal to $N_{max}$ is in a one-to-one correspondence with a polarization weight in the second polarization weight vector, and a polarization weight of a polarized channel whose channel index number is greater than $N_{max}$ is equal to a weight increment $$\beta = \sum_{j=\log_2(N_{max})}^{\lfloor \log_2(M-1) \rfloor} (2^j + \phi)^\alpha$$

plus the corresponding polarization weight of the polarized channel whose channel index number is less than or equal to $N_{max}$, where $\phi$ and $\alpha$ are parameters that are preset based on the target code length and a code rate of the polar code.

In this implementation, a half-online-calculation half-offline-storage manner is used, so that not only latency caused by online calculation can be shortened, but also storage complexity can be reduced.

In the foregoing implementation, further, $\phi=0$, and $\alpha=\frac{1}{4}$.

Further, a target code length M of a polar code is not equal to a positive integer power of 2, and the first determining module 11 is specifically configured to determine that $N=2^{\lfloor \log_2(M-1) \rfloor +1}$, where the symbol $\lfloor \; \rfloor$ denotes rounding down.

Figure 9:
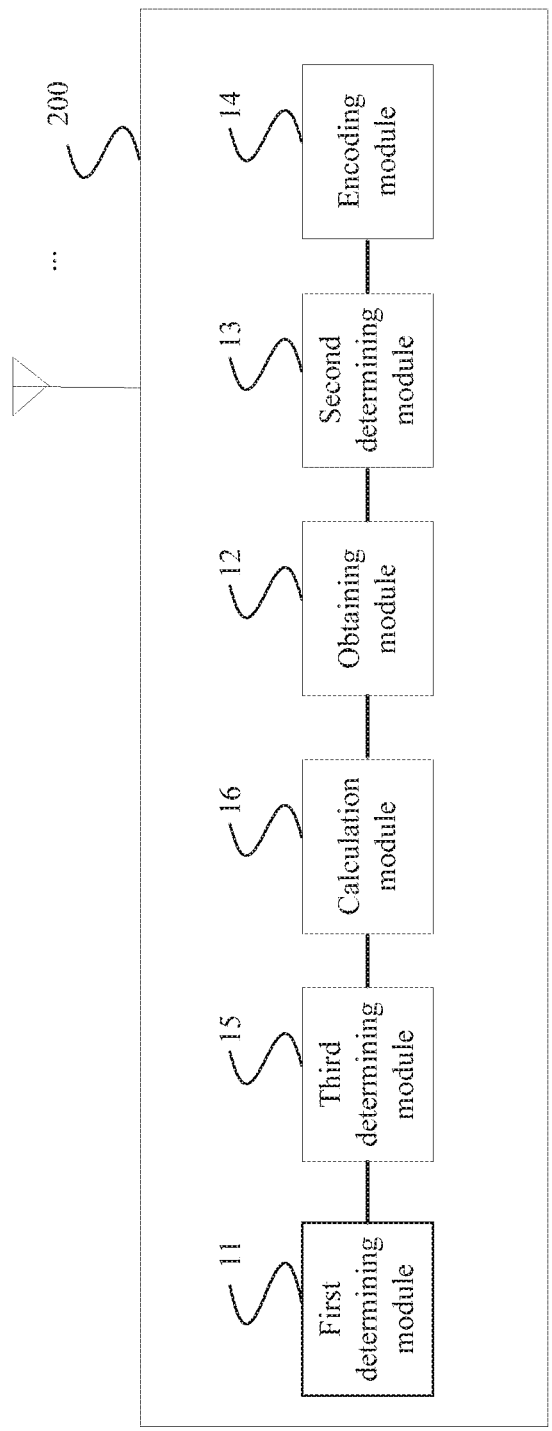
FIG. 9 is a schematic structural diagram of Embodiment 2 of an encoding device according to this application.

FIG. 9 is a schematic structural diagram of Embodiment 2 of an encoding device according to this application. As shown in FIG. 9, based on a structure of the encoding device shown in FIG. 8, the encoding device 200 in this embodiment may further include a third determining module 15 and a calculation module 16. The third determining module 15 is configured to: before the obtaining module 12 obtains the first polarization weight vector including the polarization weights of the N polarized channels, determine positions of N−M to-be-deleted bits in the N to-be-encoded bits. The calculation module 16 is configured to calculate, based on a result of the determining performed by the third determining module 15, a set of modification coefficients including the polarization weights corresponding to the N to-be-encoded bits. The modification coefficient is used to represent an amount of modification to each polarization weight resulting from bit deletion. The obtaining module 12 is specifically configured to calculate the polarization weights of the N polarized channels based on the set of modification coefficients, to obtain the first polarization weight vector.

Further, the third determining module 15 is specifically configured to: determine a channel index number sequence $P_0^{N-1}=[0, 1, \ldots, N-1]$ of the N polarized channels; and perform the following operations on each index number in the channel index number sequence: performing bit reversal on a binary number corresponding to each index number, and converting, to a decimal number, a binary number obtained after bit reversal, to obtain a new channel index number sequence $P_0^{N-1'}$; sorting index numbers in the new channel index number sequence $P_0^{N-1'}$; and selecting, in ascending order, N−M index numbers in the channel index number sequence $P_0^{N-1'}$ as index numbers of the to-be-deleted bits.

Optionally, the set of modification coefficients is $$g = \begin{bmatrix} g_{(0,0)} & \cdots & g_{(0,n-1)} \\ g_{(1,0)} & & g_{(1,n-1)} \\ \vdots & \vdots & \vdots \\ g_{(N-1,0)} & & g_{(N-1,n-1)} \\ g_{(N,0)} & g_{(N,1)} & \cdots & g_{(N,n-1)} \end{bmatrix};$$

and the calculation module 16 is specifically configured to calculate each item $g_{(i,j)}$ in the set g of modification coefficients according to the following formulas:

$$g_{(i,j)} = (p_i + p_{i+2_{j-2}})/2; \text{ and}$$

$$g_{(i+2^j,j)} = g_{(i,j)}, \text{ where}$$

$i \in \{0, 1, \ldots, N-1\}$, $j \in \{0, 1, \ldots, n-1\}$, $N=2^n$, $P_i$ is an identifier indicating whether a bit corresponding to a polarized channel whose channel index number is i is to be deleted, and $p_i \in \{0,1\}$.

Optionally, the obtaining module 12 is specifically configured to calculate the polarization weights $W_i$ of the N polarized channels according to the following formula, to obtain the first polarization weight vector:

$$W_i = \sum_{j=0}^{n-1} B_j * (1 - g_{(i,j)}) * (2^j + \phi)^\alpha,$$

where $i \triangleq B_{n-1} B_{n-2} \ldots B_0$, i is a channel index number, $B_{n-1} B_{n-2} \ldots B_0$ is a binary representation of i. $B_{n-1}$ is a most significant bit, $B_0$ is a least significant bit, $B_j \in \{0,1\}$, $j \in \{0, 1, \ldots, n-1\}$, $i \in \{0, 1, \ldots, N-1\}$, $N=2^n$, $g_{(i,j)}$ is an element in row i and column j in the set g of modification coefficients, and $\phi$ and $\alpha$ are parameters that are preset based on the target code length and a code rate of the polar code.

Optionally, the obtaining module 12 is specifically configured to obtain the first polarization weight vector $W_0^{N-1}$ through recursion calculation according to the following formulas:

$$\beta_i = (2^{i-1} + \phi)^\alpha;$$

$$W_{2^{i-1}}^{2^{i}-1} = W_0^{2^{i-1}-1} + g_{(i,j)} * \beta_i; \text{ and}$$

$$W_0^{2^{i}-1} = [W_0^{2^{i-1}-1}, W_{2^{i-1}}^{2^{i}-1}]; \text{ where}$$

$$W_0^1 = [W_0, W_1], W_0^{2^{i}-1} = [W_0, W_1, \ldots, W_{2^{i}-1}], \text{ where}$$

$i \in \{1, \ldots, N-1\}$, $\beta_i$ is an intermediate variable related to a channel index number i, $\phi$ and $\alpha$ are parameters that are preset based on the target code length and a code rate of the polar code, $g_{(i,j)}$ is an element in row i and column j in the set g of modification coefficients, and $W_0$ is an arbitrary constant.

In the foregoing implementation, $\phi=0$, and $\alpha=\frac{1}{4}$.

In the foregoing implementation, the second determining module 13 is specifically configured to: sort the polarization weights in the first polarization weight vector in descending order, and select bits corresponding to the first K polarization weights as information bits.

The encoding device in this embodiment may be configured to execute the technical solution in the method embodiment shown in FIG. 7. Their implementation principles are similar, and details are not repeated herein.

After receiving input information bits, the encoding device provided in this embodiment determines the quantity N of to-be-encoded bits based on the target code length M of the polar code; afterwards determines the positions of the N−M to-be-deleted bits in the N to-be-encoded bits, and calculates, based on the result of the determining, the set of modification coefficients including modification coefficients of the N to-be-encoded bits; then calculates the polarization weights of the N polarized channels based on the set of modification coefficients, to obtain the first polarization weight vector; and finally determines positions of the information bits based on the first polarization weight vector, and performs polar encoding on the N to-be-encoded bits to obtain the polar-encoded bits. Therefore, for a polar code with any target code length, positions of information bits and those of frozen bits are determined by calculating polarization weights of polar-code polarized channels, without relating to a channel parameter and a code rate. This can reduce calculation and implementation complexity of polar code encoding.

A person of ordinary skill in the art may understand that some or all of the steps in the method embodiments may be implemented by a program instructing relevant hardware. The program may be stored in a computer-readable storage medium. When the program runs, the steps in the method embodiments are performed. The storage medium includes various media that can store program code, such as a ROM, a RAM, a magnetic disk, or an optical disc.

As shown in the foregoing method and the corresponding device, when the polarization weights in the first polarization weight vector are sorted in descending order, according to a method for calculating a polarization weight according to a formula or a polynomial corresponding to a binary representation manner of a polarized channel sequence number, if a polarization weight of one polarized channel is greater than a polarization weight of another polarized channel, a position of the "one polarized channel" in the first polarization weight vector is necessarily before that of the "another polarized channel". Certainly, when the polarization weights in the first polarization weight vector are sorted in ascending order, if a polarization weight of one polarized channel is greater than a polarization weight of another polarized channel, a position of the "one polarized channel" in the first polarization weight vector is necessarily after that of the "another polarized channel". In addition, a position of each polarized channel in the first polarization weight vector may be considered as a polarization weight multiplied by a factor.

According to the foregoing method and the corresponding device for generating the first polarization weight vector including the polarization weights of the N polarized channels, the following several examples of the first polarization weight vector may be provided. The polarization weights may be sorted in descending order, or the polarization weights may be sorted in ascending order. Without loss of generality, sequence numbers in all the examples are ranked from 1, in other words, a minimum sequence number value is 1. This is equivalent to that the sequence numbers are ranked from 0. If the sequence numbers are ranked from 0, 1 only needs to be subtracted from each sequence number in a corresponding sequence.

The polarization weights in the first polarization weight vector may be sorted in descending order. Herein, a minimum sequence number value is 1. Correspondingly, if a minimum sequence number value is 0, 1 may be subtracted from each of all sequence numbers.

(1) N=16, and the first polarization weight vector is:
16,15,14,12,8,13,11,10,7,6,4,9,5,3,2,1.

(2) N=32, and the first polarization weight vector is:
32,31,30,28,24,16,29,27,26,23,22,15,20,14,12,25,8,21, 19,13,18,11,10,7,6,4,17,9,5, 3,2,1.

(3) N=64, and the first polarization weight vector is:
64,63,62,60,56,48,61,32,59,58,55,54,47,52,46,31,44,30, 57,40,28,53,24,51,45,50,1 6,43,29,42,39,27,38,26,23,36,22, 49,15,20,14,41,12,37,25,8,35,21,34, 19,13,18,11,10,7,6,33, 4, 17,9,5,3,2,1.

(4) N=128, and the first polarization weight vector is:
128,127,126,124,120,112,125,96,123,122,119,64,118, 111,116,110,95,108,94,121,104, 92,63,117,62,88,115,109, 60,114,80,107,56,93,106,103,91,48,102,90,61,87,100,32, 59,86,113, 79,58,84,55,78,105,54,76,47,101,52,89,46,72, 99,31,44,85,98,30,57,83,40,77,28,82,53,75,24, 51,74,45,71, 50,16,43,70,97,29,42,68,39,27,81,38,26,23,36,73,22,49,15, 69,20,14,41,67,12,66, 37,25,8,35,21,34,19,13,18,11,65,10, 7,6,33,4,17,9,5,3,2,1.

(5) N=256, and the first polarization weight vector is:
256,255,254,252,248,240,253,224,251,250,247,192,246, 239,244,238,128,223,236, 222,249,232,220,191,245,190, 216,243,237,188,242,127,208,235,184,126,221,234,231, 124,219, 176,230,218,189,120,215,228,160,187,214,241, 112,207,186,212,183,125,206,233,182,96,123, 204,175, 229,180,122,217,174,119,200,227,64,159,118,172,213,226, 111,158,185,116,211,168, 110,205,156,210,181,95,108, 203,152,179,94,121,202,173,104,199,178,92,63,144,117, 171, 198,225,62,157,88,170,115,196,167,109,60,155,114, 209,166,80,107,54,56,151,164,93,106,201, 103,150,177,91, 48,143,102,197,148,90,61,142,87,169,100,195,32,59,86, 140,113,194,165, 79,58,153,84,55,136,163,78,105,54,149, 162,76,47,101,52,147,89,46,141,72,99,146,31,44,85, 139,98,193,30,57,138,83,40,135,77,28,82,53,134,161,75,24,51, 132,74,45,71,50,145,16,43,70, 97,29,42,137,68,39,27,81, 38,133,26,23,36,131,73,22,49,130,15,69,20,14,41,67,12,66, 37,25,8, 35,21,34,129,19,13,18,11,65,10,7,6,33,4,17,9,5,3, 2,1.

(6) N=512, and the first polarization weight vector is:
512,511,510,508,504,496,509,480,507,506,503,448,502, 495,500,494,384,479,492, 478,505,488,476,447,501,256, 446,472,499,493,444,498,383,464,491,440,382,477,490, 487,380, 475,432,486,474,255,445,376,471,484,254,416, 443,470,497,368,463,252,442,468,439,381, 462,489,248, 438,352,379,460,431,485,436,378,473,240,430,375,456, 483,253,320,415,374,428, 469,482,367,224,414,251,441, 372,467,424,366,461,250,412,466,247,437,351,364,459, 192, 246,408,435,350,377,458,239,429,360,455,244,434, 348,238,319,400,373,427,454,481,128,223, 318,413,236, 344,426,371,452,423,365,222,249,316,411,370,465,232, 422,336,363,220,410, 191,245,312,407,420,349,362,457, 190,359,216,406,243,433,347,237,304,399,358,188,453, 242, 404,346,127,208,317,398,235,343,425,356,451,184, 126,221,288,234,315,342,396,369,450, 231,421,335,124, 219,314,409,176,340,230,311,392,419,334,361,218,189, 120,215,310,405,228, 418,332,303,160,357,187,214,241, 308,403,345,112,207,302,397,328,186,355,212,402,183, 125,206,287,233,300,341,395,354,449,182,96,286,123,204, 313,394,175,339,229,296,391,180, 333,122,217,284,174, 338,119,200,309,390,227,417,331,64,159,118,172,213,280, 226,307,388, 330,111,301,158,327,185,116,211,306,401, 168,110,205,272,299,326,156,353,210,181,95,285, 108, 203,298,393,324,295,152,179,94,121,202,283,173,337,104, 199,294,389,178,92,282,63, 144,117,171,198,279,225,292, 387,329,62,157,88,170,278,115,196,305,386,167,109,271, 60, 325,155,114,209,276,166,80,270,107,297,154,323,56, 151,164,93,106,201,268,322,103,293,150, 177,91,281,48, 143,102,197,264,291,148,90,61,142,87,169,277,100,195, 29,385,32,59,86, 140,113,194,275,165,79,269,58,153,84, 274,55,136,163,78,105,267,321,54,149,162,76,266,47, 101, 263,52,147,89,46,141,72,262,99,289,146,31,44,85,139,98, 193,260,30,57,138,83,273,40, 135,77,28,82,53,134,161,75, 265,24,51,132,74,45,71,261,50,145,16,43,70,97,259,29,42, 137,68, 258,39,27,81,38,133,26,23,36,131,73,22,49,130,15, 69,20,14,41,67,257,12,66,37,25,8,35,21, 34,129,19,13,18, 11,65,10,7,6,33,4,17,9,5,3,2,1.

(7) N=1024, and the first polarization weight vector is:
1024,1023,1022,1020,1016,1008,1021,992,1019,1018, 1015,960,1014,1007,1012,1006, 896,991,1004,990,1017, 1000,988,959,1013,768,958,984,1011,1005,956,1010,895, 976,1003, 952,894,989,1002,999,512,892,987,944,998,986, 767,957,888,983,996,766,928,955,982,1009, 880,975,764, 954,980,951,893,974,1001,760,950,864,511,891,972,943, 997,948,510,890,985, 752,942,887,968,995,508,765,832, 927,886,940,981,994,879,736,926,763,953,504,884,979, 936,878,973,762,924,978,759,949,863,496,876,971,704, 758,920,947,862,509,889,970,751,941, 872,967,756,946, 480,860,507,750,831,912,885,939,966,993,506,640,735, 830,925,748,856, 938,503,883,964,935,877,734,448,761, 828,923,502,882,977,744,934,848,495,875,732,922,703, 500,757,824,919,932,861494,874,969,702,871,728,918, 755,945,384,479,859,492,749,816, 911,870,700,965,754, 916,478,858,505,639,720,829,910,747,855,937,488,868, 963,696,476,638, 733,800,447,746,827,854,908,501,881, 962,743,933,847,256,446,636,731,826,921,472,688, 852, 499,742,823,904,931,846,493,873,730,444,701,498,632, 727,822,917,740,930,383,464,844, 491,815,672,869,699, 726,440,753,820,915,382,477,857,490,624,719,814,909, 840,698,487, 867,724,914,695,380,475,637,718,799,432, 745,812,853,907,486,866,961,694,474,608,255,798, 445, 635,716,825,376,906,471,687,851,484,741,808,903,692, 845,254,416,634,729,796,443, 470,686,850,497,631,712, 821,902,739,929,368,463,843,252,442,576,671,468,630, 684,725,792, 439,738,819,900,381,462,842,489,623,813, 670,839,697,248,438,628,723,818,913,352,680, 379,460, 622,717,784,431,811,838,668,485,865,722,436,693,378, 473,607,240,797,430,620,75, 810,375,905,456,836,483, 807,664,691,606,253,320,415,633,714,795,374,428,469, 685,849, 482,616,711,806,901,690,367,224,414,604,251, 794,441,575,656,372,467,629,683,710,791,424, 737,804, 899,366,461,841,250,412,574,669,466,600,682,247,790, 437,627,708,817,898,351, 679,364,459,621,783,192,572, 837,667,246,408,626,721,788,435,350,678,377,458,592, 239,782, 429,619,809,360,666,455,835,244,434,568,663, 348,676,605,238,319,400,618,713,780,373, 427,454,834, 481,615,805,662,689,128,223,318,413,603,236,793,344, 426,560,655,371,452,614, 709,776,423,803,660,365,222, 602,249,316,411,573,654,370,465,599,681,232,789,422, 612, 707,802,897,336,363,220,410,544, 191,571,598,652, 245,312,407,625,706,787,420,349,677,362, 457,591,781, 190,570,359,665,216,406,596,243,786,433,567,648,347, 675,590,237,304,399, 617,779,358,188,453,833,242,404, 566,661,346,674,127,208,317,398,588,235,778,343,425, 559, 356,451,613,775,184,564,659,126,221,288,601,234, 315,342,396,558,653,369,450,584,231, 774,421,611,801, 658,335,124,219,314,409,543,176,340,556,597,651,230, 311,392,610,705,772, 419,334,361,218,542,189,569,120, 650,215,310,405,595,228,785,418,552,647,332,589,303, 160,540,357,187,214,594,241,308,403,565,646,345,673, 112,207,302,397,587,777,328,186,355, 212,402,536,183, 563,644,125,206,287,586,233,300,341,395,557,354,449, 583,773,182,562, 657,96,286,123,204,313,394,528,175, 339,555,582,229,296,391,609,771,180,333,122,217,284, 541,174,338,554,119,649,200,309,390,580,227,770,417, 551,331,64,159,539,118,172,213,280, 593,226,307,388, 550,645,330,111,301,158,538,327,185,116,211,306,401, 535,168,548,643, 110,205,272,585,299,326,156,353,210, 534,181,561,642,95,285,108,203,298,393,527,324,581, 295,152,532,179,94,121,202,283,526,173,337,553,104,199, 294,389,579,769,178,92,282,63,144, 524,117,171,198,279, 578,225,292,387,549,329,62,157,537,88,170,278,115,196, 305,386,520, 167,547,109,271,60,325,155,114,209,276, 533,166,546,641,80,270,107,297,154,323,56,151, 531,164, 93,106,201,268,525,322,103,293,150,530,177,91,281,48, 143,523,102,197,264,577, 291,148,90,61,142,522,87,169, 277,100,195,290,385,519,32,59,86,140,113,194,275,518, 165,545, 79,269,58,153,84,274,55,136,516163,78,105,267, 321,54,149,529,162,76,266,47,101,263, 52,147,89,46,141, 521,72,262,99,289,146,31,44,85,139,98,193,260,517,30,57, 138,83,273,40,135, 515,77,28,82,53,134,514,161,75,265, 24,51,132,74,45,71,261,50,145,16,43,70,97,259,29,42, 137, 68,258,39,27,81,38,133,513,26,23,36,131,73,22,49,130,15, 69,20,14,41,67,257,12,66,37, 25,8,35,21,34,129,19,13,18, 11,65,10,7,6,33,4,17,9,5,3,2,1.

(8) N=2048, and the first polarization weight vector is:
2048,2047,2046,2044,2040,2032,2045,2016,2043,2042, 2039,1984,2038,2031,2036, 2030,1920,2015,2028,2014, 2041,2024,2012,1983,2037,1792,1982,2008,2035,2029, 1980,2034, 1919,2000,2027,1976,1918,2013,2026,2023, 1536,1916,2011,1968,2022,2010,1791,1981,1912, 2007, 2020,1790,1952,1979,2006,2033,1904,1999,1788,1978, 2004,1975,1917,1998,2025, 1024,1784,1974,1888,1535, 1915,1996,1967,2021,1972,1534,1914,2009,1776,1966, 1911,1992, 2019,1532,1789,1856,1951,1910,1964,2005, 2018,1903,1760,1950,1787,1977,1528,1908,2003, 1960, 1902,1997,1786,1948,1023,2002,1783,1973,1887,1520, 1900,1995,1728,1022,1782,1944, 1971,1886,1533,1913,
1994,1775,1965,1896,1991,1020,1780,1970,1504,1884,
1531,1774, 1855,1936,1909,1963,1990,2017,1016,1530,
1664,1759,1854,1949,1772,1880,1962,1527,1907, 1988,
1959,1901,1758,1472,1785,1852,1947,1526,1906,1008,
2001,1768,1958,1872,1519,1899, 1756,1946,1727,1021,
1524,1781,1848,1943,1956,1885,1518,1898,1993,1726,
992,1895,1752, 1019,1942,1779,1969,1408,1503,1883,
1516,1773,1840,1935,1894,1724,1989,1018,1778,1940,
1502,1015,1882,1529,1663,1744,1853,1934,1771,1879,
1961,1512,1892,1987,960,1720,1014, 1500,1662,1757,
1824,1471,1770,1851,1878,1932,1525,1905,1007,1986,
1767,1957,1871, 1012,1280,1470,1660,1755,1850,1945,
1496,1712,1876,1006,1523,1766,1847,1928,1955,1870,
1517,1897,1754,1468,1725,896,991,1522,1656,1751,1846,
1004,1941,1764,1954,1407,1488, 1868,1515,1839,1696,
990,1893,1723,1750,1017,1464,1777,1844,1939,1406,
1501,1000,1881, 1514,1648,1743,1838,1933,1864,1722,
1511,988,1891,1748,959,1938,1719,1013,1404,1499, 1661,
1742,1823,1456,1769,1836,1877,1931,1510,1890,768,
1985,958,1718,984,1498,1632,1011, 1279,1822,1469,1659,
1740,1849,1400,1930,1495,1711,1875,1005,1508,1765,
1832,1927,956, 1716,1869,1010,1278,1440,1658,1753,
1820,1467,1494,1710,895,1874,976,1521,1655,1736, 1845,
1003,1926,1763,1953,1392,1487,1867,952,1276,1466,
1600,1695,894,989,1492,1654, 1708,1749,1816,1002,1463,
1762,1843,1924,1405,1486,999,1866,1513,1647,1837,
1694,512,1863, 1721,892,1272,987,1462,1652,1747,1842,
944,1937,1376,1704,998,1403,1484,1646,1741, 1808,1455,
1835,1862,1692,1509,986,1889,767,1746,957,1460,1717,
888,983,1402,1497,1631, 996,1264,1821,1454,1644,1739,
1834,1399,1929,1480,1860,766,1507,928,1831,1688,955,
982, 1715,1630,1009,1277,1344,1439,1657,1738,1819,
1398,1452,1493,1709,880,1873,975,1506, 1640,1735,1830,
764,1925,954,1714,1391,980,1248,1438,1628,951,1275,
1818,1465,1599, 680,893,1396,974,1491,1653,1707,1734,
1815,1001,1448,1761,1828,1923,1390,1485,760,1865, 950,
1274,1436,1598,1693,864,511,1490,1624,1706,891,1271,
1814,972,1461,1651,1732,1841, 943,1922,1375,1703,997,
1388,1483,1645,1807,948,1216,510,1596,1861,1691,890,
1270,985, 1432,1650,752,1745,1812,942,1459,1374,1702,
887,968,1401,1482,1616,995,1263,1806,1453, 1643,1833,
1384,1690,1479,508,1859,765,832,1268,927,1458,1592,
1687,886,940,981,1372, 1700,1629,994,1262,1343,1424,
1642,1737,1804,1397,1451,1478,879,1858,736,1505,1639,
926,1829,763,1686,953,504,1713,884,1152,979,1247,1342,
1437,1627,936,1260,1817,1368,1450, 1584,1679,878,1395,
973,1476,1638,1733,1800,762,1447,924,1827,1684,1389,
978,1246, 759,1626,949,1273,1340,1435,1597,1678,863,
1394,496,1489,1623,1705,876,1256,1813,971, 1446,1636,
1731,1826,704,1921,1360,758,1387,920,1244,1434,1568,
947,1215,862,509,1595, 1622,1676,889,1269,1336,970,
1431,1649,751,1730,1811,941,1444,1373,1701,872,967,
1386, 1481,1615,756,1805,946,1214,480,1594,1383,1689,
860,1240,507,1430,1620,750,8311267,1810, 912,1457,
1591,1672,885,939,966,1371,1699,1614,993,1261,1328,
1423,1641,1803,1382, 1212,1477,506,640,1857,735,830,
1266,925,1428,1590,748,1685,856,938,503,1370,1698,883,
1151,964,1232,1341,1422,1612,935,1259,1802,1367,1449,
1583,877,1380,734,1475,1637,448, 1799,761,828,1208,
923,502,1588,1683,882,1150,977,1245,1312,744,1625,934,
1258,1339,1366, 1420,1582,1677,848,1393,495,1474,1608,
875,1255,1798,732,1445,1635,922,1825,703,1682, 1359,
500,757,824,1148,919,1243,1338,1433,1567,932,1200,861,
1364,494,1580,1621,1675, 874,1254,1335,969,1416,1634,
1729,1796,702,1443,1358,871,728,1385,918,1242,755,
1566, 945,1213,384,479,1593,1144,1674,859,1239,1334, 492,1429,1619,749,816,1252,1809,911,1442, 1576,1671,
870,700,965,1356,1613,754,1327,916,1184,478,1564,1381,
1211,858,1238,505, 639,1618,720,829,1265,1332,910,
1427,1589,747,1670,855,937,488,1369,1697,868,1136,963,
1231,1326,1421,1611,696,1801,1352,1210,476,638,1379,
733,800,1236,447,1426,1560,746,827, 1207,854,908,501,
1587,1668,881,1149,962,1230,1311,743,1610,933,1257,
1324,1365,1419, 1581,847,1378,256,1473,1607,446,636,
1797,731,826,1206,921,472,1586,688,1681,852,1120, 499,
1310,742,823,1147,904,1228,1337,1418,1552,931,1199,
846,1363,493,1579,1606,873,1253, 1320,730,1415,1633,
444,1795,701,1204,1357,498,632,727,822,1146,917,1241,
1308,740, 1565,930,1198,383,1362,464,1578,1143,1673,
844,1224,1333,491,1414,1604,815,1251,1794, 672,1441,
1575,869,699,726,1355,440,753,820,1088,915,1183,382,
477,1563,1142,1196,857,1237, 1304,490,624,1617,719,
814,1250,1331,909,1412,1574,1669,840,698,487,1354,867,
1135, 724,1325,914,1182,695,1562,1351,1209,380,475,
637,1140,718,799,1235,1330,432,1425,1559, 745,812,
1192,853,907,486,1572,1667,866,1134,961,1229,1296,
1609,694,1323,1350,1180,474, 608,1377,255,798,1234,
445,635,1558,716,825,1205,376,906,471,1585,687,1666,
851,1119, 484,1309,741,808,1132,903,1227,1322,1417,
1551,692,845,1348,254,1605,416,634,1319,729, 796,1176,
443,470,1556,686,1203,850,1118,497,631,712,821,1145,
902,1226,1307,739,1550, 929,1197,368,1361,463,1577,
1128,843,1223,1318,252,1413,1603,442,576,1793,671,
1202,468, 630,684,725,792,1116,439,1306,738,819,1087,
900,1168,381,462,1548,1141,1195,842,1222, 1303,489,
623,1602,813,1249,1316,670,1411,1573,839,697,248,1353,
438,628,723,818,1086, 913,1181,352,680,1561,1112,1194,
379,1302,460,622,1139,717,784,1220,1329,431,1410,1544,
811,1191,838,668,485,1571,865,1133,722,1295,436,693,
1084,1349,1179,378,473,607,138, 240,797,1233,1300,430,
620,1557,715,810,1190,375,905,456,1570,1665,836,1104,
4831,294, 807,1131,664,1321,178,691,606,1347,253,320,
415,633,1080,714,795,1175,374,428,469,1555, 685,1188,
849,1117,482,616,711,806,1130,901,1225,1292,1549,690,
367,1346,224,1127,414, 604,1317,251,794,1174,441,575,
1554,656,1201,372,467,629,683,710,791,1115,424,1305,
737, 804,1072,899, 167,366,461,1547,1126,841,1221,1288,
250,1601,412,574,1315,669,172,466, 600,682,247,790,
1114,437,627,708,817,1085,898,1166,351,679,1546,1111,
1193,364,1301,459, 621,1124,783,1219,1314,192,1409,
1543,572,837,667,246,408,626,721,788,1056,435,350,678,
1083,1110,1164,377,458,592,1137,239,782,1218,1299,429,
619,1542,809,1189,360,666,455, 1569,835,1103,244,1293,
434,568,663,1082,1177,348,676,605,1108,238,319,1298,
400,618, 1079,713,780,1160,373,427,454,1540,1187,834,
1102,481,615,805,1129,662,1291,689,128,1345, 223,318,
413,603,1078,236,793,1173,344,426,560,1553,655,1186,
371,452,614,709,776,1100, 423,1290,803,1071,660,365,
222,1125,602,1287,249,316,411,573,1076,654,1171,370,
465, 599,681,232,789,1113,422,612,707,802,1070,897,
1165,336,1545,1096,363,1286,220,1123,410, 544,1313,
191,1170,571,598,652,245,312,407,625,706,787,1055,420,
349,677,1068,1109,1163, 362,457,591,1122,781,1217,
1284,190,1541,570,359,665,216,406,596,243,786,1054,
433,567, 648,1081,1162,347,675,590,1107,237,304,1297,
399,617,1064,779,1159,358,188,453,1539, 833,1101,242,
404,566,661,1052,346,674,127,1106,208,317,398,588,
1077,235,778,1158,343, 425,559,1538,1185,356,451,613,
775,1099,184,1289,564,659,126,221,288,601,1048,234,
315, 342,396,558,1075,653,1156,369,450,584,231,774,
1098,421,611,801,1069,658,335,1095,124, 1285,219,314,
409,543,1074,176,1169,340,556,597,651,230,311,392,610,
705,772,1040,419,334, 1067,1094,361,218,1121,542,1283, 189,569,120,650,215,310,405,595,228,785,1053,418,552, 647,1066,1161,332,589,1092,303,1282,160,1063,540,357, 187,214,594,241,308,403,565,646, 1051,345,673,112,1105, 207,302,397,587,1062,777,1157,328,186,1537,355,212, 402,536,183, 1050,563,644,125,206,287,586,1047,233,300, 341,395,557,1060,1155,354,449,583,773,1097, 182,562, 657,96,286,123,1046,204,313,394,528,1073,175,1154,339, 555,582,229,296,391,609, 771,1039,180,333,1093,122,217, 284,541,1044,174,338,554,119,649,200,309,390,580,227, 770,1038,417,551,1065,331,1091,64,1281,159,539,118, 172,213,280,593,226,307,388,550,645, 1036,330,111,1090, 301,158,1061,538,327,185,116,211,306,401,535,168,1049, 548,643,110, 205,272,585,1032,299,326,156,1059,353,210, 534,181,561,642,95,285,108,1045,203,298,393, 527,1058, 1153,324,581,295,152,532,179,94,121,202,283,526,1043, 173,337,553,104,199,294, 389,579,769,1037,178,92,282, 63,1042,144,524,117,171,198,279,578,225,292,387,549, 1035,329, 1089,62,157,537,88,170,278,115,196,305,386, 520,167,1034,547,109,271,1031,60,325,155, 114,209,276, 533, 166,546,641,80,270,107,1030,297,154,1057,323,56, 151,531,164,93,106,201, 268,525,1028,322,103,293,150, 530,177,91,281,48,1041,143,523,102,197,264,577,291,148, 90,61,142,522,87,169,277,100,195,290,385,519,1033,32, 59,86,140,113,194,275,518,165,545, 79,269,1029,58,153, 84,274,55,136,516,163,78,105,267,1027,321,54,149,529, 162,76,266,47,1026, 101,263,52,147,89,46,141,521,72,262, 99,289,146,31,44,85,139,98,193,260,517,30,57,138, 83,273,40,135,515,77,28,82,53,134,514,161,75,265,1025, 24,51,132,74,45,71,261,50,145,16, 43,70,97,259,29,42,137, 68,258,39,27,81,38,133,513,26,23,36,131,73,22,49,130,15, 69,20,14, 41,67,257,12,66,37,25,8,35,21,34,129,19,13,18, 11,65,10,7,6,33,4,17,9,5,3,2,1.

(9) N=4096, and the first polarization weight vector is:
4096,4095,4094,4092,4088,4080,4093,4064,4091,4090, 4087,4032,4086,4079,4084, 4078,3968,4063,4076,4062, 4089,4072,4060,4031,4085,3840,4030,4056,4083,4077, 4028,4082, 3967,4048,4075,4024,3966,40614074071,3584, 3964,4071,384,39644059,4016,4058,38394029,3 960,4055, 4068,3838,4000,4027,4054,4081,3952,4047,3836,4026, 4052,4023,3965,4046,4073, 3072,3832,4022,3936,3583, 3963,4044,4015,4069,4020,3582,3962,4057,3824,4014, 3959,4040, 4067,3580,3837,3904,3999,3958,4012,4053, 4066,3951,3808,3998,3835,4025,3576,3956,4051, 4008, 3950,4045,3834,3996,3071,4050,3831,4021,2048,3935, 3568,3948,4043,3776,3070,3830, 3992,4019,3934,3581, 3961,4042,3823,4013,3944,4039,3068,3828,4018,3552, 3932,3579, 3822,3903,3984,3957,4011,4038,4065,3064, 3578,3712,3807,3902,3997,3820,3928,4010,3575, 3955, 4036,4007,3949,3806,3520,3833,3900,3995,3574,3954, 3056,4049,3816,4006,2047,3920, 3567,3947,3804,3994, 3775,3069,3572,3829,3896,3991,2046,4004,3933,3566, 3946,4041,3774, 3040,3943,3800,3067,3990,3827,4017, 3456,3551,2044,3931,3564,3821,3888,3983,3942, 3772, 4037,3066,3826,3988,3550,3063,3930,3577,3711,3792, 3901,3982,2040,3819,3927,4009, 3560,3940,4035,3008, 3768,3062,3548,3710,3805,3872,3519,3818,3899,3926, 3980,3573,3953, 3055,4034,3815,4005,2032,3919,3060, 3328,3518,3708,3803,3898,3993,3544,3760,3924,3054, 3571,3814,3895,3976,2045,4003,3918,3565,3945,3802, 3516,3773,2944,3039,3570,3704, 3799,3894,3052,3989, 3812,2016,4002,3455,3536,2043,3916,3563,3887,3744, 3038,3941,3771, 3798,3065,3512,3825,3892,3987,3454, 3549,2042,3048,3929,3562,3696,3791,3886,3981,2039, 3912,3770,3559,3036,3939,3796,3007,3986,3767,3061, 3452,3547,3709,1984,3790,3871,3 504,2038,3817,3884, 3925,3979,3558,3938,2816,4033,3006,3766,3032,2031, 3546,3680,3059, 3327,3870,3517,3707,3788,3897,3448,
3978,3543,2036,3759,3923,3053,35563813,3880,3975, 3004,2030,3764,3917,3058,3326,3488,3706,3801,3868, 3515,3542,3758,2943,3922,3024,3569, 3703,3784,3893, 3051,3974,1920,3811,2015,4001,3440,3535,2028,3915, 3000,3324,3514,3648, 3743,2942,3037,3540,3702,3756, 3797,3864,3050,3511,3810,3891,2014,3972,3453,3534, 2041,3047,3914,3561,3695,3885,3742,2024,2560,3911, 3769,2940,3320,3035,3510,3700,3795, 3890,2992,3985, 3424,3752,2012,3046,3451,3532,3694,1983,3789,3856, 3503,2037,3883,3910, 3740,3557,3034,3937,2815,3794, 3005,3508,3765,2936,3031,3450,1792,3545,3679,1982, 3044, 3312,3869,3502,3692,2008,3787,3882,3447,3977, 3528,2035,3908,2814,3555,2976,3879,3736, 3003,3030, 2029,3763,3678,3057,3325,3392,3487,3705,1980,3786, 3867,3446,3500,3541, 2034,3757,2928,3921,3023,3554, 3688,3783,3878,2812,3973,3002,1919,2000,3762,3439, 3028, 3296,2027,3486,3676,2999,3323,3866,3513,3647, 3728,2941,3444,3022,3539,3701,1976,3755, 3782,3863, 3049,3496,1918,3809,3876,2013,3971,3438,3533,2026, 2808,3913,2998,3322, 3484,3646,3741,2912,2023,2559, 3538,3672,3754,2939,3319, 3862,3020,3509,3699,3780, 3889, 1536,2991,3970,3423,1916,3751,2011,3045,3436, 3531,3693,1968,3855,2996,3264,2022,2558, 3644,3909, 3739,2938,3318,3033,3480,3698,2800,3793,3860,2990, 3507,3422,3750,2935,2010, 3016,3449,1791,3530,3664, 1981,3043,3311,3854,1912,3501,3691,2007,3881,3432, 3738, 3527,2020,2556,3907,2813,2880,3316,2975,3506, 3640,3735,2934,2988,3029,3420,1790,3748, 3677,1952, 3042,3310,3391,3472,3690,1979,2006,3785,3852,3445, 3499,3526,2033,2927,3906, 2784,3553,3687,2974,3877, 2811,3734,3001,1904,2552,1999,3761,2932,3200,3027, 3295,3390, 1788,3485,3675,1978,2984,3308,3865,3416, 3498,3632,2004,3727,2926,3443,3021,3524, 3686,1975, 3781,3848,2810,3495,2972,1917,3875,1998,3732,3437, 3026,3294,2025,2807,3674, 2997,3321,3388,3483,3645, 1024,3726,2911,3442,1784,2544,3537,3671,1974,3753, 2924,3304, 3861,3019,3494,3684,1888,3779,3874,1535, 2752,3969,3408,1915,1996,2806,3435,2968,3292, 1967, 3482,3616,2995,3263,2910,2021,2557,3643,3670,3724, 2937,3317,3384,3018,3479, 3697,1972,2799,3778,3859, 1534,2989,3492,3421,1914,3749,2920,2009,3015,3434, 1776,3529, 3663,1966,2804,3853,2994,1911,3262,1992, 2528,3642,3431,3737,2908,3288,2019,2555,3478, 3668, 2798,2879,3315,3858,2960,3505,3639,3720,2933,1532, 2987,3014,3419,1789,1856,3747, 3662,1951,3041,3309, 3376,1910,3471,3689,1964,2005,3851,3430,3260,3525, 2018,2554, 2688,3905,2783,2878,3314,2973,3476,3638, 2796,3733,2904,2986,1903,2551,3418,1760,3746, 2931, 3199,1950,3012,3280,3389,1787,3470,3660,1977,1528, 2983,3307,3850,3415,1908,3497, 3631,2003,2925,3428, 2782,3523,3685,1960,2496,3847,2809,2876,3256,2971, 1902,2550,3636, 1997,3731,2930,3198,3025,3293,3360, 1786,2792,3673,1948,2982,3306,3387,3414,3468, 3630, 1023,2002,3725,2896,3441,1783,2543,3522,3656,1973, 2923,3303,3846,2780,3493,3683, 2970,1887,3873,1520, 2751,3730,3407,1900,2548,1995,2805,2872,3196,2967, 3291,3386,1728, 3481,3615,1022,2980,3248,2909,3412, 1782,2542,3628,3669,1944,3723,2922,3302,3383,3017, 3464,3682,1971,1886,3777,3844,1533,2750,3491,3406, 1913,2919,1994,2776,3433,1775, 2966,3290,1965,2803, 3614,2993,1896,3261,2432,1991,2527,3641,1020,3192, 3722,2907,3287, 3382,1780,2540,3477,3667,1970,2797, 2864,3300,3857,1504,2959,3490,3624,1884,3719,2918, 1531,2748,3013,3404,1774,1855,3661,1936,2802,3375, 2964,1909,3232,1963,1990,2526,3612, 3429,3259,2906, 3286,2017,2553,2687,3666,2768,2877,3313,3380,2958, 3475,3637,1016, 2795,3718,2903,1530,2985,1664,2536, 3417,1759,1854,3745,2916,3184,1949,3011,3279,3374, 1772,1880,3469,3659,1962,1527,2744,3849,3400,1907, 3258,1988,2524,2686,3427,2781,2848, 3284,1959,2495, 3474,3608,2794,2875,3255,2902,2956,1901,2549,3635, 1758,3716,2929,3197, 1472,3010,3278,3359,1785,1852, 2791,3658,1947,1526,2981,3305,3372,3413,1906,3467, 3629,1008,2001,2895,3426,1768,2304,3521,3655,1958, 2494,2684,3845,2779,2874,3254,2969, 1872,2520,3634, 1519,2736,3729,2900,3168,1899,2547,3358,1756,2790, 2871,3195,1946,2952, 3276,3385,1727,3466,3600,1021, 1524,2979,3247,2894,3411,1781,1848,2541,3627,3654, 1943, 2921,3301,3368,2778,3463,3681,1956,2492,1885, 3843,1518,2749,3252,3405,1898,2546, 2680,1993,2775, 2870,3194,2965,3289,3356,1726,2788,3613,992,2978, 1895,3246,2431,3410, 1752,2512,3626,1019,3191,1942, 3721,2892,3272,3381,1779,2539,3462,3652,1969,1408, 2863, 3299,3842,1503,2720,3489,3623,1883,2917,1516, 2747,2774,3403,1773,1840,2488,1935,2801, 2868,3136, 2963,1894,3231,2430,1724,1989,2525,3611,1018,3190, 3244,2905,3285,3352,1778, 2538,2672,3665,1940,2767, 2862,3298,3379,1502,2957,3460,3622,1015,1882,3717, 2888, 1529,2746,1663,2535,3402,1744,1853,2915,3183, 1934,2772,3373,1771,2962,1879,3230,1961, 1512,2743, 3610,3399,1892,3257,2428,1987,2523,2685,960,3188, 2766,2847,3283,3378,1720, 2480,3473,3607,1014,2793, 2860,3240,2901,1500,2955,1662,2534,3620,1757,1824, 3715,2914, 3182,1471,3009,3277,3344,1770,1851,1878, 3657,1932,1525,2742,3371,3398,1905,3228,1007, 1986, 2522,2656,3425,1767,2303,2846,3282,1957,2493,2683, 3606,2764,2873,3253,2424, 2954,1871,2519,3633,1012, 1280,2735,3714,2899,3167,1470,1660,2532,3357,1755, 1850,2789, 2856,3180,1945,1496,2951,3275,3370,1712, 1876,3465,3599,1006,1523,2740,2893,3396,1766, 1847, 2302,3653,1928,2464,2682,3367,2777,2844,3224,1955, 2491,1870,2518,3604,1517,2734, 3251,2898,3166,1897, 2545,2679,1754,2760,2869,3193,1468,2950,3274,3355, 1725,896,2787, 3598,991,1522,2977,1656,3245,2416,3409, 1751,1846,2511,3625,1004,3176,1941,2891,3271, 3366, 1764,2300,3461,3651,1954,2490,1407,2624,3841,1488, 2719,3250,1868,2516,2678, 1515,2732,2773,2840,3164, 1839,2487,3354,1696,2786,2867,3135,990,2948,1893, 3216,2429, 1723,1750,2510,3596,1017,3189,1464,3243, 2890,3270,3351,1777,1844,2537,2671,3650,1939, 1406, 2861,3297,3364,1501,2718,3459,3621,1000,1881,2887, 1514,2745,1648,2296,3401,1743, 1838,2486,2676,1933, 2771,2866,3134,2961,1864,3229,2400,1722,1511,2728, 3609,988,3160, 1891,3242,2427,3350,1748,2508,2670,959, 3187,1938,2765,2832,3268,3377,1719,2479,3458, 3592, 1013,1404,2859,3239,2886,1499,2716,1661,2533,3619, 1742,1823,2913,3181,1456,2770, 3343,1769,1836,2484, 1877,1931,1510,2741,3132,3397,1890,3227,2426,768, 1985,2521,2655, 958,3186,2288,2845,3281,3348,1718, 2478,2668,3605,984,2763,2858,3238,2423,1498,2953, 1632,2504,3618,1011,1279,1822,3713,2884,3152,1469, 1659,2531,3342,1740,1849,1400,2855, 3179,1930,1495, 2712,3369,1711,1875,3226,1005,1508,2739,2654,3395, 1765,1832,2301, 2368,1927,2463,2681,956,3128,2762, 2843,3223,2422,1716,2476,1869,2517,3603,1010,1278, 2733,3236,2897,3165,1440,1658,2530,2664,1753,1820, 2759,2854,3178,1467,1494,2949,3273, 3340,1710,895, 1874,3597,976,1521,2738,1655,2415,3394,1736,1845, 2272,1003,3175,1926, 2462,2652,3365,1763,2299,2842, 3222,1953,2489,1392,2623,3602,1487,2704,3249,2420, 1867, 2515,2677,952,1276,2731,2758,2839,3163,1466, 1600,2472,3353,1695,894,2785,2852,3120, 989,1492,2947, 1654,3215,2414,1708,1749,1816,2509,3595,1002,3174, 1463,2889,3269,3336, 1762,1843,2298,3649,1924,2460, 1405,2622,3363,1486,2717,3220,999,1866,2514,2648, 1513, 2730,1647,2295,2838,3162,1837,2485,2675,1694, 2756,2865,3133,512,2946,1863,3214,2399, 1721,892,1272, 2727,3594,987,3159,1462,1652,3241,2412,3349,1747, 1842,2507,2669,944,3172, 1937,1376,2831,3267,3362, 1704,2240,3457,3591,998,1403,2620,2885,1484,2715, 1646,2294, 1741,1808,2456,2674,1455,2769,2836,3104, 1835,2483,1862,2398,1692,1509,2726,3131, 986,3158, 1889,3212,2425,767,1746,2506,2640,957,3185,1460,2287, 2830,3266,3347,1717,888, 2477,2667,3590,983,1402,2857, 3237,2408,1497,2714,1631,2503,3617,996,1264,1821, 2883, 3151,1454,1644,2292,3341,1739,1834,2482,1399, 2616,1929,1480,2711,3130,1860,3225,2396, 766,1507, 2724,2653,928,3156,1831,2286,2367,3346,1688,2448, 2666,955,3127,982,2761,2828, 3208,2421,1715,2475,1630, 2502,3588,1009,1277,1344,3235,2882,3150,1439,1657, 2529, 2663,1738,1819,1398,2853,3177,1452,1493,2710, 3339,1709,880,1873,975,1506,2737,1640,2176, 3393,1735, 1830,2271,2366,764,1925,2461,2651,954,3126,2284,2841, 32212392,1714,2474, 1391,2608,3601,980,1248,2703, 3234,2419,1438,1628,2500,2662,951,1275,1818,2757, 2824, 3148,1465,1599,2471,3338,1680,893,1396,2851, 3119,974,1491,2708,1653,2413,1707,1734, 1815,2270, 1001,3173,1448,2650,3335,1761,1828,2297,2364,1923, 2459,1390,2621,3124,1485, 2702,3219,2418,760,1865, 2513,2647,950,1274,2729,2280,2837,3161,1436,1598, 2470,2660, 1693,864,2755,2850,3118,511,1490,2945,1624, 3213,2384,1706,891,1271,1814,3593,972,3144, 1461,1651, 2411,3334,1732,1841,2268,943,3171,1922,2458,1375, 2592,3361,1703,2239,3218, 997,1388,2619,2646,1483, 2700,1645,2293,2360,1807,2455,2673,948,1216,2754, 2835,3103, 510,1596,2468,1861,2397,1691,890,1270,2725, 3116,985,3157,1432,1650,3211,2410,752,1745, 1812,2505, 2639,942,3170,1459,1374,2829,3265,3332,1702,887,2238, 3589,968,1401,2618, 2407,1482,27131616,2264,995,1263, 1806,2454,2644,1453,1643,2291,2834,3102,1833,2481, 1384,2615,1690,1479,2696,3129,508,1859,3210,2395,765, 832,1268,2723,2638,927,3155,1458, 1592,2285,2352,3345, 1687,886,2447,2665,940,3112,981,1372,2827,3207,2406, 1700,2236, 1629,2501,3587,994,1262,1343,2881,3149, 1424,16422290,1737,1804,2452,1397,2614,1451, 1478, 2709,3100,879,1858,2394,736,1505,2722,1639,2175, 9263154,1829,2256,2365,763,1686, 2446,2636,953,3125, 504,2283,2826,3206,2391,1713,884,2473,1152,2607,3586, 979,1247, 1342,3233,2404,1437,1627,2499,2661,936,1260, 1817,1368,2823,3147,1450,1584,2232,3337, 1679,878, 1395,2612,973,1476,2707,1638,2174,1733,1800,2269, 2336,762,1447,2649,924,3096, 1827,2282,2363,2390,1684, 2444,1389,2606,3123,978,1246,2701,3204,2417,759,1626, 2498, 2632,949,1273,1340,2279,2822,3146,1435,1597, 2469,2659,1678,863,1394,2849,3117,496, 1489,2706,1623, 2383,1705,876,1256,1813,971,3143,1446,1636,2172,3333, 1731,1826,2267,2362, 704,1921,2457,1360,2591,3122, 2224,3217,2388,758,1387,2604,2645,920,1244,2699,2278, 2359,1434,1568,2440,2658,947,1215,862,2753,2820,3088, 509,1595,2467,1622,2382,1676, 889,1269,1336,3115,970, 3142,1431,1649,2409,751,1730,1811,2266,941,3169,1444, 1373,2590, 3331,1701,872,2237,967,1386,2617,2168,1481, 2698,1615,2263,2358,756,1805,2453,2643, 946,1214,2276, 2833,3101,480,1594,2466,1383,2600,1689,860,1240,2695, 3114,507,1430,1620, 3209,2380,750,831,1267,1810,2637, 912,3140,1457,1591,2351,3330,1672,885,2208,939,3111, 966,1371,2588,2405,1699,2235,1614,2262,993,1261,1328, 2642,1423,1641,2289,2356,1803, 2451,1382,2613,1212, 1477,2694,3099,506,640,1857,2393,735,830,1266,2721, 2160,925,3153, 1428,1590,2255,2350,748,1685,856,2445, 2635,938,3110,503,1370,2825,3205,2376,1698, 883,2234, 1151,3585,964,1232,1341,2403,1422,1612,2260,935,1259,
1802,2450,1367,2584,1449, 1583,2231,3098,877,1380,
2611,734,1475,2692,1637,2173,448,1799,2254,2335,761,
828,1208, 2634,923,3095,502,1588,2281,2348,2389,1683,
882,2443,1150,2605,3108,977,1245,1312, 3203,2402,744,
1625,2497,2631,934,1258,1339,1366,2821,3145,1420,
1582,2230,1677,848,1393, 2610,495,1474,2705,1608,2144,
875,1255,1798,2334,732,1445,1635,2171,922,3094,1825,
2252,2361,703,1682,2442,1359,2576,3121,500,2223,3202,
2387,757,824,1148,2603,2630,919, 1243,1338,2277,2344,
1433,1567,2439,2657,932,1200,861,1364,2819,3087,494,
1580,2228, 1621,2381,1675,874,1254,1335,969,3141,1416,
1634,2170,1729,1796,2265,2332,702,1443,1358, 2589,
3092,871,2222,2386,728,1385,2602,2167,918,1242,2697,
2248,2357,755,1566,2438, 2628,945,1213,384,2275,2818,
3086,479,1593,2465,1144,2599,1674,859,1239,1334,3113,
492, 1429,1619,2379,749,816,1252,1809,911,3139,1442,
1576,2112,3329,1671,870,2207,700,965, 1356,2587,2166,
2220,1613,2261,2328,754,1327,2641,916,1184,2274,2355,
478,1564,2436,1381, 2598,1211,858,1238,2693,3084,505,
639,1618,2378,720,829,1265,1332,2159,910,3138,1427,
1589,2349,747,1670,855,2206,937,3109,488,1369,2586,
2375,1697,868,2233,1136,963,1231, 1326,2164,1421,1611,
2259,2354,696,1801,2449,1352,2583,1210,2216,3097,476,
638,1379, 2596,733,800,1236,2691,2158,447,1426,1560,
2253,2320,746,827,1207,854,2633,908,3080,501, 1587,
2347,2374,1668,881,2204,1149,3107,962,1230,1311,2401,
743,1610,2258,933,1257, 1324,1365,2582,1419,1581,2229,
847,1378,2609,256,1473,2690,1607,2143,446,636,1797,
2333, 731,826,1206,2156,921,3093,472,1586,2251,2346,
688,1681,852,2441,1120,2575,3106,499, 1310,3201,2372,
742,823,1147,2629,904,1228,1337,2343,1418,1552,2200,
931,1199,846,1363, 2580,493,1579,2227,1606,2142,873,
1253,1320,730,1415,1633,2169,444,1795,2250,2331,701,
1204,1357,2574,3091,498,632,2221,2385,727,822,1146,
2601,2152,917,1241,1308,2247,2342, 740,1565,2437,2627,
930,1198,383,1362,2817,3085,464,1578,2226,1143,1673,
844,1224,1333, 491,1414,1604,2140,815,1251,1794,2330,
672,1441,1575,2111,3090,869,2192,699,726,1355, 2572,
2165,440,2219,2246,2327,753,820,1088,2626,915,1183,
382,2273,2340,477,1563,2435, 1142,2597,1196,857,1237,
1304,3083,490,624,1617,2377,719,814,1250,1331,909,
3137,1412, 1574,2110,1669,840,2205,698,487,1354,2585,
2136,867,2218,1135,2326,724,1325,2163, 914,1182,2244,
2353,695,1562,2434,1351,2568,1209,380,2215,3082,475,
637,1140,2595,718, 799,1235,1330,2157,432,1425,1559,
2319,745,812,1192,853,907,3079,486,1572,2108,2373,
1667, 866,2203,1134,961,1229,1296,2162,1609,2257,2324,
694,1323,1350,2581,1180,2214,474, 608, 1377,2594,255,
798,1234,2689,2128,445,635,1558,2318,716,825,1205,376,
2155,906,3078, 471,1585,2345,687,1666,851,2202,1119,
3105,484,1309,2371,741,808,1132,903,1227,1322, 2104,
1417,1551,2199,692,845,1348,2579,254,2212,1605,2141,
416,634,1319,729,796,1176,2154, 443,470,1556,2249,
2316,686,1203,850,1118,2573,3076,497,631,2370,712,821,
1145,2151, 902,1226,1307,2341,739,1550,2198,929,1197,
368,1361,2578,463,1577,2225,1128,843,1223, 1318,252,
1413,1603,2139,442,576,1793,2329,671,1202,2096,3089,
468,630,2191,684,725,792, 1116,2571,2150,439,1306,
2245,2312,738,819,1087,2625,900,1168,381,2339,462,
1548,2196, 1141,1195,842,1222,1303,489,623,1602,2138,
813,1249,1316,670,1411,1573,2109,839,2190, 697,248,
1353,2570,2135,438,628,2217,2325,723,818,1086,2148,
913,1181,352,2243,2338, 680,1561,2433,1112,2567,1194,
379,1302,3081,460,622,1139,717,784,1220,1329,431,1410,
1544, 2080,811,1191,838,668,485,1571,2107,2134,865,
2188,1133,722,1295,2161,436,2242,2323, 693,1084,1349,
2566,1179,378,2213,473,607,1138,2593,240,797,1233,
1300,2127,430,620, 1557,2317,715,810,1190,375,905,
3077,456,1570,2106,1665,836,2201,1104,483,1294,2132,
807, 1131,2322,664,1321,2103,1178,2184,691,606,1347,
2564,253,320,2211,2126,415,633,1080, 714,795,1175,374,
2153,428,469,1555,2315,685,1188,849,1117,3075,482,616,
2369,711,806, 1130,901,1225,1292,2102,1549,2197,690,
367,1346,2577,224,2210, 1127,414,604,1317,251,794,
1174,2124,441,575,1554,2314,656,1201,372,2095,3074,
467,629,683,710,791,1115,2149,424, 1305,2311,737,804,
1072,899,1167,366,2100,461,1547,2195,1126,841,1221,
1288,250,1601, 2137,412,574,1315,669, 172,2094,466,600,
2189,682,247,790, 114,2569,2120,437,627,2310, 708,817,
1085,2147,898,1166,351,2337,679,1546,2194,1111,1193,
364,1301,459,621,1124,7 83,1219,1314,192,1409,1543,
2079,572,837,667,246,2092,2133,408,626,2187,721,788,
1056,2 146,435,350,2241,2308,678,1083,1110,2565,1164,
377,458,592,1137,239,782,1218,1299,429, 619,1542,2078,
809,1189,360,666,455,1569,2105,835,2186,1103,244,1293,
2131,434,568,232 1,663,1082,2088,1177,348,2183,676,
605,1108,2563,238,319,1298,2125,400,618,1079,713,78
0,1160,373,427,454,1540,2076,1187,834,1102,481,615,
2130,805,1129,662,1291,2101,2182,6 89,128,1345,2562,
223,318,2209,413,603,1078,236,793931173,344,2123,426,
560,1553,2313,65 5,1186,371,3073,452,614,709,776,1100,
423,1290,2072,803,1071,660,365,2099,222,2180,112
5,602,1287,249,316,2122,411,573,1076654,1171,370,2093,
465,599,681,232,789,1113,2119, 422,612,2309,707,802,
1070,897,1165,336,2098,1545,2193,1096,363,1286,220,
1123,410,544, 1313,191,1170,2064,571,598,652,245,312,
2091,2118,407,625,706,787,1055,2145,420,349,23 07,677,
1068,1109,1163,362,457,591,1122,781,1217,1284,190,
1541,2077,570,359,665,216,20 90,406,596,2185,243,786,
1054,2116,433,567,2306,648,1081,2087,1162,347,675,590,
1107,23 7,304,1297,399,617,1064,779,1159,358,188,453,
1539,2075,833,1101,242,2129,404,566,661, 1052,2086,
346,2181,674,127,1106,2561,208,317,398,588,1077,235,
778,1158,343,425,559,15 38,2074,1185,356,451,613,775,
1099,184,1289,2071,564,659,126,2084,221,288,2179,601,
104 8,234,315,342,2121,396,558,1075,653,1156,369,450,
584,231,774,1098,421,611,2070,801,10 69,658,335,2097,
2178,1095,124,1285,219,314,409,543,1074,176,1169,340,
2063,556,597,651, 230,311,2117,392,610,705,772,1040,
419,334,2068,1067,1094,361,218,1121,542,1283,189,2
062,569,120,650,215,310,2089,405,595,228,785,1053,
2115,418,552,2305,647,1066,1161,332, 589,1092,303,
1282,160,1063,540,357,187,214,2060,594,241,308,2114,
403,565,646,1051,20 85,345,673,112,1105,207,302,397,
587,1062,777,1157,328,186,1537,2073,355,212,402,536,1
83,1050,2056,563,644,125,2083,206,287,586,1047,233,
300,341,395,557,1060,1155,354,449, 583,773,1097,182,
2069,562,657,96,2082,286,2177,123,1046,204,313,394,
528,1073,175,1154, 339,555,582,229,296,391,609,771,
1039,180,333,2067,1093,122,217,284,541,1044,174,338,2
061,554,119,649,200,309,390,580,227,770,1038,417,551,
2066,1065,331,1091,64,1281,159,5 39,118,172,213,280,
2059,593,226,307,2113,388,550,645,1036,330,1111090,
301,158,1061,5 38,327,185,2058,116,211,306,401,535,168,
1049,2055,548,643,110,205,272,585,1032,299,32 6,156,
1059,353,210,534,181,2054,561,642,95,2081,285,108,
1045,203,298,393,527,1058,115 3,324,581,295,152,532,
179,94,2052,121,202,283,526,1043,173,337,553,104,199,
294,389,579, 769,1037,178,2065,92,282,63,1042,144,524,
117,171,198,279,578,225,292,387,549,1035,329, 1089,62,
157,537,88,170,278,2057,115,196,305,386,520,167,1034,
547,109,271,1031,60,325, 155,114,209,276,533,166,2053,
546,641,80,270,107,1030,297,154,1057,323,56,151,531, 164,9 3,2051,106,201,268,525,1028,322,103,293,150,530, 177,2050,91,281,48,1041,143,523,102,19 7,264,577,291, 148,90,61,142,522,87,169,277,100,195,290,385,519,1033, 32,59,86,140,113,19 4,275,518,165,545,79,269,1029,58, 153,84,274,55,136,516,163,78,105,267,1027,321,54,149,5 29,162,2049,76,266,47,1026,101,263,52,147,89,46,141, 521,72,262,99,289,146,31,44,85,139, 98,193,260,517,30, 57,138,83,273,40,135,515,77,28,82,53,134,514,161,75,265, 1025,24,51,13 2,74,45,71,261,50,145,16,43,70,97,259,29, 42,137,68,258,39,27,81,38,133,513,26,23,36,131,7 3,22,49, 130,15,69,20,14,41,67,257,12,66,37,25,8,35,21,34129,19, 13,18,11,65,10,7,6,33,4,17, 9,5,3,2,1.

The polarization weights in the first polarization weight vector may alternatively be sorted in ascending order. Herein, a minimum sequence number value is 1. Similarly, if a minimum sequence number value is 0, only subtracting 1 from all sequence numbers is required.

(1) N=16, and the first polarization weight vector is:
1,2,3,5,9,4,6,7,10,11,13,8,12,14,15,16.

(2) N=32, and the first polarization weight vector is:
1,2,3,5,9,17,4,6,7,10,11,18,13,19,21,8,25,12,14,20,15,22, 23,26,27,29,16,24,28,30, 31,32.

(3) N=64, and the first polarization weight vector is:
1,2,3,5,9,17,4,33,6,7,10,11,18,13,19,34,21,35,8,25,37,12, 41,14,20,15,49,22,36,23, 26,38,27,39,42,29,43,16,50,45,51, 24,53,28,40,57,30,44,31,46,52,47,54,55,58,59,32,61,48,56, 60,62,63,64.

(4) N=128, and the first polarization weight vector is:
1,2,3,5,9,17,4,33,6,7,10,65,11,18,13,19,34,21,35,8,25,37, 66,12,67,41,14,20,69,15, 49,22,73,36,23,26,38,81,27,39,68, 42,29,97,70,43,16,50,71,45,74,51,24,75,53,82,28,77,40,83, 57,30,98,85,44,31,99,72,46,89,52,101,47,76,54,105,78,55, 84,58,79,113,86,59,32,100,87,61,9 0,102,48,91,103,106,93, 56,107,80114,60,109,11588,62,117,6392104,121,94,108, 95,110,11 6,111,118,64,119,122,123,96,125,112,120,124, 126,127,128.

(5) N=256, and the first polarization weight vector is:
1,2,3,5,9,17,4,33,6,7,10,65,11, 18,13,19,129,34,21,35,8, 25,37,66, 12,67,41,14, 2069, 15,130,49,22,73,131,36,23,26, 133,38,81,27,39,68,137,42,29,97,70,43,16,145,50,71,45,74, 13 2,51,24,75,161,134,53,82,28,77,135,40,83,138,57,30, 193,98,139,85,44,31,146,99,72,141,46,8 9,147,52,101,47, 76,162,149,54,105,78,163,136,55,84,153,58,79,165,194, 113,140,86,59,32,19 5,100,169,87,142,61,90,148,197,102, 143,48,91,177,150,103,201,106,93,164,151,56,154,107, 80,166,209,114,155,60,109,167,196,115,170,88,157,62, 225,198,171,117,144,63,92178,199,1 04,173,202,121,94, 179,152,203,108,95,181,210,156,205,110,168,211,116,185, 158,111,226,2 13,172,118,159,64,227,200,11119,174,123, 96,182,233,206,125,183,2 12,186,207,112,241,214,187, 160,228,215,120,189,218,230,176,219,124,231,234,221, 126,184, 235,208,127,242,188,237,243,216,190,245,191, 220,232,249,222,236,223,128,238,244,239,2 46,192,247, 250,251,224,253,240,248,252,254,255,256.

(6) N=512, and the first polarization weight vector is:
1,2,3,5,9,17,4,33,6,7,10,65,11,18,13,19,129,34,21,35,8, 25,37,66,12,257,67,41,14,2 0,69,15,130,49,22,73,131,36, 23,26,133,38,81,27,39,258,68,137,42,29,259,97,70,43,16, 145,50, 261,71,45,74,132,51,24,265,75,161,134,53,82,28, 77,135,40,273,83,138,57,30,260,193,98,13 9,85,44,31,146, 289,99,262,72,141,46,89,147,52,263,101,47,266,76,162, 149,54,321,267,105,7 8,163,136,55,274,84,153,58,269,79, 165,275,194,113,140,86,59,32,385,290,195,100,277,169, 87,142,61,90,148,291,264,197,102,143,48,281,91,177,150, 293,103,322,268,201,106,93,164,1 51,56,323,154,297,107, 270,80,166,276,209,114,155,325,60,271,109,167,386,305, 196,115,27 8,170,88,157,62,329,387,292,225,279,198,171, 117,144,63,282,92,178,389,294,199,104,337,1 73,283,202, 121,94,179,152,295,324,393,298,203,108,285,95,181,210, 353,156,326,299,272,2 05,110,168,401,306,211,116,185, 327,158,301,111,330,388,307,226,280,213,172,118,159, 64,3 31,417,227,390,309,200,119,338,174,284,217,122, 333,180,391,296,229,339,175,394,313,204, 123,286,96, 182,449,354,395,341,300,233,287,206,125,183,402,212, 355,186,328,397,302,20 7,112,345,403,308,241,214,187, 357,160,303,332,418,228,405,310,215,120,189,218,361, 334, 419,392,311,230,340,176,409,314,219,124,335,421, 231,450,369,396,342,315,234,288,221,12 6,184,451,356, 425,343,235,398,317,208,127,346,404,242,453,188,358, 399,304,237,347,433, 243,406,216,359,190,457,362,349, 420,407,312,245,191,410,220,363,336,422,232,465,370,41 1,316,249,222,365,423,452,371,426,344,236,413,318,223, 128,481,454,427,373,400,319,238, 348,434,244,455,360, 429,239,458,377,350,435,408,246,192,459,364,351,437, 247,466,412,25 0,461,366,424,467,372,441,251,414,224, 367,482,469,428,374,415,320,253,483,456,375,430, 240, 473,378,436,485,431,460,379,352,438,248,489,462,381, 439,468,442,252,463,368,497,47 0,443,416,254,484,471, 376,445,255,474,486,432,475,380,487,490,477,382,440, 491,464,383, 498,444,493,499,472,446,256,501,447,476, 488,505,478,492,479,384,494,500,495,502,448,50 3,506, 507,480,509,496,504,508,510,511,512.

(7) N=1024, and the first polarization weight vector is:
1,2,3,5,9,17,4,33,6,7,10,65,11,18,13,19,129,34,21,35,8, 25,37,66,12,257,67,41,14,2 0,69,15,130,49,22,73,131,36, 23,26,513,133,38,81,27,39,258,68,137,42,29,259,97,70,43, 16,14 5,50,261,71,45,74,132,51,24,265,75,161,514,134,53, 8228,77,515,135,40,273,83,138,57,30,5 17,260,193,98,139, 85,44,31,146,289,99,262,72,521,141,46,89,147,52,263,101, 47,266,76,162, 529,149,54,321,267,105,78,163,516,136,55, 274,84,153,58,269,79,545,165,518,275,194,113,1 40,86,59, 32,519,385,290,195,100,277,169,87,522,142,61,90,148, 291,577,264,197,102,523,14 3,48,281,91,177,530,150,293, 103,322,525,268,201,106,93,164,531,151,56,323,154,297, 107,2 70,80,641,546,166,533,276,209,4,155,325,60,209, 114,155,32560,271,109,547,167,520,386,305,196,115, 278,1 70,88,537,157,62,329,549,387,292,225,578,279,198, 171,117,524,144,63,282,92,178,769,579, 389,294,199,104, 553,337,173,526,283,202,121,94,179,532,152,295,581,324, 527,393,298,203, 108,285,95,642,561,181,534,210,353, 156,326,299,585,272,205,110,643,548,168,535,401,30 6,211,116,185,327,538,158,301,111,330,645,550,388,307, 226,593,280,213,172,118,539,159, 64,331,551,417,770, 227,580,390,309,200,649,119,554,338,174,541,284,217, 122,333,180,771, 609,391,296,229,582,555,339,175,528, 394,313,204,123,286,96,657,562,182,773,583,449,35 4,557,395,341,300,233,586,287,206,125,644,563,183,536, 402,212,355,186,328,777,587,397, 302,207,112,673,345, 646,565,403,308,241,594,214,187,357,540,160,303,589, 332,647,552,41 8,785,228,595,405,310,215,650,120,569, 189,542,218,361,334,419,772,705,610,392,311,230, 651, 597,556,340,176,543,409,314,219,124,335,658,801,611, 421,774,231,584,450,369,653,55 8,396,342,315,234,601, 288,221,126,659,564,184,775,613,451,356,559,425,343, 778,235,588, 398,317,208,127,674,346,661,566,404,242, 833,453,188,358,779,617,399,304,237,590,675,34 7,648, 567,433,786,243,596,406,216,665,359,570,190,781,591, 457,362,677,349,420,787,706, 625,407,312,245,652,598, 571,191,544,410,220,363,336,897,802,707,612,422,789, 232,681,59 9,465,370,654,573,411,316,249,602,222,365, 660,803,423,776,709,614,452,371,655,560,426, 344,793, 236,603,413,318,223,128,689,662,805,615,481,834,454, 427,373,780,713,618,400,31 9,238,605,676,348,663,568, 434,244,835,455,666,360,809,619,429,782,239,592,458, 377,678, 350,435,788,721,626,408,246,667,837,572,192, 783,621,459,364,679,351,898,817,708,627,43 7,790,247, 682,600,466,669,574,412,250,841,461,366,899,804, 737, 424,791,710,683,629,467, 372,656,575,441,794,251,604, 414,224,367,690,901,806,711,616,482,849,685,469,428, 374,79 5,714,633,415,320,253,606,691,664,807,483,836, 456,905,375,810,715,620,430,797,240,607, 473,378,693, 436,722,865,485,668,838,811,431,784,717,622,460,379, 680,352,913,818,723,62 8,438,248,697,839,670,813,623, 489,842,462,381,900,819,738,439,792,725,684,630,468, 671, 576,442,252,843,463,368,929,739,902,821,712,631, 497,850,686,470,443,796,729,634,416,25 4,845,692,903, 808,741,484,851,687,471,906,376,825,716,635,445,798, 255,608,474,694,961, 866,486,907,853,812,745,432,799, 718,637,475,380,695,914,724,867,487,698,840,909814,71 9,624,490,857,477,382,915,820,753,440,726,699,869,672, 815,491,844,464,383,930,740,917, 822,727,632,498,701, 444,730,873,493,846,931,904,823,742,499,852,688,472, 921,826,731,63 6,446,256,847,933,743,962,881,501,908, 854,827,746,447,800,733,638,476,696,963,868,488, 937, 855,747,910,829,720,639,505,858,478,916,754,965,700, 870,911,816,749,492,859,479,38 4,945,755,918,728,871, 702,969,874,494,861,932,919,824,757,500,703,922,732, 875,495,848, 934,744,977,882,502,923,828,761,448,734, 877,935,964,883,503,938,856,748,925,830,735,64 0,506, 993,966,939,885,912,831,750,507,860,480,946,756,967, 872,941,751,970,889,509,862, 947,920,758,704,971,876, 496,863,949,759,978,924,762,973,878936,979,884,504, 953,763,92 6,736,879,994,981,940,886,927,832,765,508, 995,968,887,942,752,985,890,510,948,997,943, 972,891, 511,864,950,760,1001,974,893,951,980,954,764,975,880, 1009,982,955,928,766,996, 983,888,957,767,986,998,944, 987,892,512,999,1002,98894,952,1003,976,895,1010,956, 10 05,1011,984,958,768,1013,959,988,1000,1017,990, 1004,991,896,1006,1012,1007,1014,960,1 015,1018,1019, 992,1021,1008,1016,1020,1022,1023,1024.

(8) N=2048, and the first polarization weight vector is:
1,2,3,5,9,17,4,33,6,7,10,65,11,18,13,19,129,34,21,35,8, 25,37,66,12,257,67,41,14,2 0,69,15,130,49,22,73,131,36, 23,26,513,133,38,81,27,39,258,68,137,42,29,259,97,70,43, 16,14 5,50,261,71,45,74,132,51,24,1025,265,75,161,514, 134,53,82,28,77,515,135,40,273,83,138,57, 30,517,260, 193,98,139,85,44,31,146,289,99,262,72,521,141,46,89,147, 52,263,101,1026,47,2 66,76,162,529,149,54,321,1027,267, 105,78,163,516,136,55,274,84,153,58,1029,269,79,545,1 65,518,275,194,113,140,86,59,32,1033,519,385,290,195, 100,277,169,87,522,142,61,90,148,2 91,577,264,197,102, 523,143,1041,48,281,91,177,530,150,293,103,322,1028, 525,268,201,106, 93,164,531,151,56,323,1057,154,297, 1030,107,270,80,641,546,166,533,276,209,114,155,32 5,60,1031,271,109,547,1034,167,520,386,305,196,115,278, 170,88,537,157,62,1089,329,1035, 549,387,292,225,578, 279,198,171,117,524,144,1042,63,282,92,178,1037,769, 579,389,294,1 99,104,553,337,173,1043,526,283,202,121, 94,179,532,152,295,581,324,1153,1058,527,393,2 98,203, 1045,108,285,95,642,561,181,534,210,3531059,156,326, 299,1032,585,272,205,110,6 43,548,1049,168,535,401,306, 2,1116,185,327,538,1061,158,301,1090,111,330,1036,645, 55 0,388,307,226,593,280,213,172,118,539,159,1281,64, 1091,331,1065,551,417,1038,770,227,5 80,390,309,200, 649, 119,554,338,174,1044,541,284,217,122,1093,333,180, 1039,771,609,391, 296,229,582,555,339,1154,175,1073, 528,394,313,204,1046,123,286,96,657,562,182,1097,77 3,583,449,354,1155,1060,557,395,341,300,233,1047,586, 287,206,125,644,563,1050,183,536, 402,212,355,1537,186, 32815757777,1062,587,397,302,207,1105,112,673,345, 1051,646,565, 403,308,241,594,214,187,357,540,1063,160, 1282,303,1092,589,332,1161,1066,647,552,418, 1053,785, 228,595,405,310,215,650,120,569,189,1283,542,1121,218, 361,1094,1067,334,419, 1040,772,705,610,392,311,230, 651,597,556,340,1169,176,1074,543,409,314,219,1285, 124,1 095,335,658,1069,801,611,421,1098,774,231,584, 450,369,1156,653,1075,558,396,342,315,2 34,1048,601, 288,221,126,659,564,1289,184,1099,775,613,451,356, 1185,1538,559,425,343,1 158,778,235,1077,588,398,317, 208,1106,127,674,346,1052,661,566,404,242,1101,833, 1539, 453,188,358,1159,779,1064,617,399,1297,304,237, 1107,590,675,347,1162,1081,648,567,433, 1054,786,243, 596,406,216,665,359,570,1541,190,1284,1217,781,1122, 591,457,362,1163,11 09,1068,677,349,420,1055,787,706, 625,407,312,245,652,598,571,1170,191,1313,544,410,11 23,220,1286,363,1096,1109545,336,1165,897,1070,802, 707,612,422,1113,789,232,681599,465, 370,1171,654, 1076,573,411,316,249,1287,602,1125,222,365,660,1071, 803,1290,423,1100,77 6,709,614,452,371,1186,655,1553, 560,426,344,1173,793,236,1078,603,413,318,223,1345,12 8,689,1291,662,1129,805,615,481,1102,834,1187,1540, 454,427,373,1160,780,713,1079,618, 400,1298,319,238, 1108,605,676,348, 177,1082,663,568,434,1293,244,1103, 835,1569,455,66 6,360,1189,809,1542,619,4291299,1218, 782,239,1137,592,458,377,1164,1110,1083,678,350, 435, 1056,788,721,626,408,246,667,837,572,1543,1409,192, 1314,1219,783,1124,621,459,13 01,364,1193,1111,1546, 679,351,1166,898,1085,817,708,627,437,114,790,247,682, 600,466,1 172,669,1315,574,412,1601,250,1288,1221,841, 1126,1547,461,366,1167,899,1072,804,737,1 305,424, 1115,791,710,683,629,467,372,1201,656,1554,575,441, 1174,794,251,1317,604,414, 1127,224,1346,367,690,1549, 1292,1225,901,1130,806,711,616,482,1117,849,1188,685, 1555, 469,428,374,1175,795,714,1080,633,415,320,253, 1347,606,691,1178,1321,664,1131,807,129 4,483,1104, 836,1665,1570,456,905,375,1190,810,715,1557,620,430, 1300,1233,797,240,1138, 607,473,378,1179,1349,1084, 693,436,1295,722,1133,865,1571,485,668,838,1191,811, 1544, 1410,431,1329,1220,784,717,1139,622,460,1302, 379,1194,1112,1561,680,352,1181,913,108 6,818,723,628, 438,1353,248,697,839,1573,1411,670,1316,1249,813,1602, 623,489,1303,1222, 842,1195,1141,1548,462,381,1168, 900,1087,819,738,1306,439,1116,792,725,684,630,468,1 202,671,1793,576,442,1603,1413,252,1318,1223,843,1128, 1577,463,1361,368,1197,929,155 0,739,1307,1226,902, 1145,821,712,631,4971118,850,1203,686,1556,470,443, 1176,796,729, 1319,634,416,1605,254,1348,845,692,1551, 1417,1322,1227,903,1132808,741,1309484,111 9,851, 1666,687,1585,471,906,376,1205,825,716,1558,635,445, 1234,798,255,1377,608,474,1 180,1350,1323,694,1609, 1296,1229,961,1134,866,1667,1572,486,907,853,1192,812, 745,155 9,1425,432,1330,1235,799,718,1140,637,475,380, 1209,1351,1562,695,1182,914,1325,724,11 35,867,1354, 487,698,840,1669,1574,1412,909,1331,1250,814,719,1617, 624,490,1304,1237,8 57,1196,1142,1563,477,382,1183, 915,1088,820,753,440,1355,726,699,869,1575,1441,672,17 94,1251,815,1604,1414,491,1333,1224,844,1673,1143, 1578,464,1362,383,1198,930,1565,74 0,1308,1241,917, 1146,822,727,632,498,1357,1204,701,1795,444,1633,1415, 730,1320,1253,8 73,1606,1579,493,1363,846,1199,931, 1552,1418,1337,1228,904,1147,823,742,1310,499,112 0,852,1681,688,1586,472,921,1206,826,731,1797,636,446, 1607,1473,256,1378,847,1581,141 9,1365,1324,1257,933, 1610,743,1311,1230,962,1149,881,1668,1587,501,908,854, 1207,827,7 46,1560,1426,447,1236,800,733,1379,638,476, 1210,1352,1801,696,1611,1421,1326,1231,96 3,1136,868, 1697,1369,488,937,855,1670,747,1589,1427,910,1332, 1265,829,720,1618,639,50 5,1238,858,1211,1381,1564, 478,1186,1327,754,1613,1356,965,700,870,1671,1576, 1442, 911,1809,1252,816,749,1619,1429,492,1334,1239, 8591674,1144,1593,479,384,1213,945,15 66,755,1242,918, 1385,728,871,1358,1443,702,1796,1729,1634,1416,969, 1335,1254,874,167 5,1621,1580,494,1364,86,11200,932, 1567,1433,1338,1243,919, 148,824,757,500,1359,1682, 703,1825,922,1635,1445,732,1798,1255,875,1608,1474, 495,1393,848,1677,1582,1420,1366, 1339,1258,934,1625, 744,1312,1245,977,1150,882,1683,1588,502,923,1208,828, 761,1799,44 8,1637,1475,734,1380,877,1583,1449,1367, 1802,1259,935,1612,1422,1341,1232,964, 1151,8 83,1698, 1370,503,938,856,1685,748,1590,1428,925,1266,830,735, 1857,640,506,1477,1212, 1 382,1803,1641,1423,1328, 1261,993,1614,1699,1371,966,939,885,1672,1591,1457, 912,1810, 1267,831,750,1620,1430,507,1240,860,1689, 1383,1594,480,1214,946,1805,756,1615,1481,1 386,967, 872,1701,1373,1444,941,1811,1730,751,1649,1431,970, 1336,1269,889,1676,1622,1 595,509,862,1215,947,1568, 1434,1244,920,1387,758,1360,1921,704,1826,1731,1636, 1446,9 71,1813,1256,876,1705,1623,1489,496,1394,863, 1678,1597,1435,1340,1273,949,1626,759,1 246,978,1389, 1684,1827,924,1447,762,1800,1733,1638,1476,973,1395, 878,1679,1584,1450, 1368,1817,1260,936,1627,1437,1342, 1247,979,1152,884,1713,504,953,1686,763,1829,926,1 639,1505,736,1858,879,1478,1451,1397,1804,1737,1642, 1424,1343,1262,994,1629,1700,137 2,981,940,886,1687, 1592,1458,927,1268,832,765,1859,508,1479,1690,1384, 1833,1643,1453, 1806,1263,995,1616,1482,1401,968,887, 1702,1374,1459,942,1812,1745,752,1650,1432,985, 1270, 890,1691,1861,1596,510,1216,948,1807,1645,1483,1388, 997,1703,1375,1922,943,1841, 1732,1651,1461,972,1814, 1271,891,1706,1624,1490,511,864,1693,1598,1436,1274, 950,186 5,760,1485,1390,1923,1828,1761,18,1761, 1448001,1815173,11707,1653,1491,974,1396,893,1680, 1599,1465,1818,1275,951,1628,1438,1248,980,1391,1714, 954,1925,764,1830,1735,1640,150 6,975,1873,880,1709, 1493,1452,1398,1819,1738,1657,1439,1344,1277,1009, 1630,1715,982, 955,1688,1831,928,1507,766,1860,1480, 1929,1399,1834,1739,1644,1454,1821,1264,996,163 1,1497,1402,983,888,1717,1460,957,1746,767,1889,986, 1509,1692,1862,1835,1455,1808,17 41,1646,1484,1403, 998,1704,1376,1937,944,1842,1747,1652,1462,987,1272, 892,1721,1863, 512,1694,1837,1647,1513,1866,999,1486, 1405,1924,1843,1762,1463,1002,1816,1749,1708,1 654, 1492,989,894,1695,1600,1466,1276,952,1867,1487,1392, 1953,1763,1926,1003,1845,173 6,1655,1521,976,1874,895, 1710,1494,1467,1820,1753,1658,1440,1278,1010,1869, 1716,956, 1927,1832,1765,1508,1005,1875,1711,1495, 1930,1400,1849,1740,1659,1469,1822,1279,101 1,1632, 1498,984,1718,958,1985,768,1890,1510,1931,1877,1836, 1769,1456,1823,1742,1661, 1499,1404,1013,1719,1938, 959,1748,1891,988,1511,1722,1864,1933,1838,1743,1648, 15141 881,1000,1501,1406,1939,1844,1777,1464,1017, 1750,1723,1893,990,1696,1839,1515,1868,1 488,1407, 1954,1764,1941,1004,1846,1751,1656,1522,991,896,1725, 1468,1754,1897,1517,18 70,1955,1928,1847,1766,1523, 1006,1876,1712,1496,1945,1850,1755,1660,1470,1280, 1012,1 871,1957,1767,1986,1007,1905,1525,1932,1878, 1851,1770,1471,1824,1757,1662,1500,1014, 1720,960, 1987,1892,1512,1961,1879,1771,1934,1853,1744,1663, 1529,1882,1015,1502,1940, 1778,1018,1989,1724,1894, 1935,1840,1773,1516,1883,1503,1408,1969,1779,1942, 1019,175 2,1895,992,1726,1993,1898,1518,1885,1956, 1943,1848,1781,1524,1021,1727,1946,1756,189 9,1519, 1872,1958,1768,2001,1008,1906,1526,1947,1852,1785, 1472,1758,1901,1959,1988,19 07,1527,1962,1880,1772, 1949,1854,1759,1664,1530,1016,2017,1990,1963,1909, 1936,1855,1 774,1531,1884,1504,1970,1780,1020,1991, 1896,1965,1775,1994,1913,1533,1886,1971,1944, 1782, 1022,1728,1995,1900,1520,1887,1973,1783,2002,1023, 1948,1786,1997,1902,1960,200 3,1908,1528,1977,1787, 1950,1760,1903,2018,2005,1964,1910,1951,1856,1789, 1532,2019,19 92,1911,1966,1776,2009,1914,1534,1972, 2021,1967,1996,1915,1535,1888,1974,1784,1024,2 025, 1998,1917,1975,2004,1978,1788,1999,1904,2033,2006, 1979,1952,1790,2020,2007,1912, 1981,1791,2010,2022, 1968,2011,1916,1536,2023,2026,2013,1918,1976,2027, 2000,1919,203 4,1980,2029,2035,2008,1982,1792,2037, 1983,2012,2024,2041,2014,2028,2015,1920,2030,20 36,2031,2038,1984,2039,2042,2043,2016,2045,2032,2040, 2044,2046,2047,2048.

(9) N=4096, and the first polarization weight vector is:
1,2,3,5,9,17,4,33,6,7,10,65,11,18,13,19,129,3421,35,825, 37,66,12,257,67,41,14,2 0,69,15,130,49,22,73,131,36,23, 26,513,133,38,81,27,39,258,68,137,42,29,259,97,70,43,16, 14 5,50,261,71,45,74,132,51,24,1025,265,75,161,514,134, 53,82,28,77,515,135,40,273,83,138,57, 30,517,260,193,98, 139,85,44,31,146,289,99,262,72,521,141,46,89,147,52,263, 101,1026,47,2 66,76,2049,162,529,149,54,321,1027,267, 105,78,163,516,136,55,274,84,153,58,1029,269,79, 545, 165,518,275,194,113,140,86,59,32,1033,519,385,290,195, 100,277,169,87,522,142,61,90, 148,291,577,264,197,102, 523,143,1041,48,281,91,2050,177,530,150,293,103,322, 1028,525,2 68,201,106,2051,93,164,531,151,56,323,1057, 154,297,1030,107,270,80,641,546,2053,166,53 3,276,209, 114,155,325,60,1031,271,109,547,1034,167,520,386,305, 196,115,2057,278,170,88, 537,157,62,1089,329,1035,549, 387,292,225,578,279,198,171,117,524,144,1042,63,282, 92,2 065,178,1037,769,579,389,294,199,104,553,337,173, 1043,526,283,202,121,2052,94,179,532, 152,295,581,324, 1153,1058,527,393,298,203,1045,108,285,2081,95,642, 561,2054,181,534,2 10,353,1059,156,326,299,1032,585, 272,205,110,643,548,2055,1049,168,535,401,306,211,11 6,2058,185,327,538,1061,158,301,1090,111,330,1036,645, 550,388,2113,307,226,593,2059,2 80,213,172,118,539,159, 1281,64,1091,331,1065,2066,551,417,1038,770,227,580, 390,309,20 0,649,119,554,2061,338,174,1044,541,284,217, 122,1093,2067,333,180,1039,771,609,391,29 6,229,582, 555,339,1154,175,1073,528,394,313,204,1046,123,2177, 286,2082,96,657,562,206 9,182,1097,773,583,449,354, 1155,1060,557,395,341,300,233,1047,586,287,206,2083, 125,64 4,563,2056,1050,183,536,402,212,355,2073,1537, 186,328,1157,777,1062,587,397,302,207,1 105,112,673, 345,2085,1051,646,565,403,2114,308,241,594,2060,214, 187,357,540,1063,160, 1282,303,1092,589,332,1161,1066, 647,2305,552,418,2115,1053,785,228,595,405,2089,310,2 15,650,120,569,2062,189,1283,542,1121,218,361,1094, 1067,2068,334,419,1040,772,705,610, 392,2117,311,230, 651,597,556,2063,340,1169,176,1074,543,409,314,219, 1285,124,1095,21 78,2097,335,658,1069,801,2070,611, 421,1098,774,231,584,450,369,1156,653,1075,558,396, 2121,342,315,234,1048,601,2179,288,221,2084,126,659, 564,2071,1289,184,1099,775,613,45 1,356,1185,2074, 1538,559,425,343,1158,778,235,1077,588398,317,208, 2561,1106,127,674, 2181,346,2086,1052,661,566,404, 2129,242,1101,833,2075,1539,453,188,358,1159,779,1064, 617,399,1297,304,237,1107,590,675,347,1162,2087,1081, 648,2306,567,433,2116,1054,786,2 43,2185,596,406,2090, 216,665,359,570,2077,1541,190,1284,1217,781,1122,591, 457,362,116 3,1109,1068,677,2307,349,420,2145,1055, 787,706,625,407,2118,2091,312,245,652,598,571, 2064, 1170,191,1313,544,410,1123,220,1286,363,1096,2193, 1545,2098,336,1165,897,1070,8 02,707,2309,612,422, 2119,1113,789,232,681,599,465,2093,370,1171,654,1076, 573,411,2122, 316,249,1287,602,1125,2180,222,2099,365,
660,1071,803,2072,1290,423,1100,776,709,614, 452,3073,
371,1186,655,2313,1553,560,426,2123,344,1173,793,236,
1078,603,413,2209,318,2     23,2562,1345,128,689,2182,
2101,1291,662,1129,805,2130,615,481,1102,834,1187,
2076,154 0,454,427,373,1160,780,713,1079,618,400,2125,
1298,319,238,2563,1108,605,676,2183,348,     1177,2088,
1082,663,2321,568,434,2131,293,244,1103,2186,835,
2105,1569,455,666,360,11    89,809,2078,1542,619,429,
1299,1218,782,239,1137,592,458,377,1164,2565,1110,
1083,678,2    308,2241,350,435,2146,1056,788,721,2187,
626,408,2133,2092,246,667,837,572,2079,1543,1 409,192,
1314,1219,783,1124,621,459,1301,364,1193,1111,2194,
1546,679,2337,351,1166,898,     2147,1085,817,708,2310,
627,437,2120,2569,1114,790,247,682,2189,600,466,2094,
1172,669,     1315,574,412,2137,1601,250,1288,1221,841,
1126,2195,1547,461,2100,366,1167,899,1072,8    04,737,
2311,1305,424,2149, 115,791,710,683,629,467,3074,2095,
372,1201,656,2314,1554,5    75,441,2124,1174,794,251,
1317,604,414,1127,2210,224,2577,1346,367,690,2197,
1549,2102,     1292,1225,901,1130,806,711,2369,616,482,
3075,1117,849,1188,685,2315,1555,469,428,215   3,374,
1175,795,714,1080,633,415,2126,2211,320,253,2564,1347,
606,691,2184,1178,2103,13    21,664,2322,1131,807,2132,
1294,483,1104,2201,836,1665,2106,1570,456,3077,905,
375,119  0,810,715,2317,1557,620,430,2127,1300,1233,
797,240,2593,1138,607,473,2213,378,1179,25    66,1349,
1084,693,2323,2242,436,2161,1295,722,1133,2188,865,
2134,2107,1571,485,668,83    8,1191,811,2080,1544,1410,
431,1329,1220,784,717,1139,622,460,3081,1302,379,1194,
2567,     1112,2433,1561,680,2338,2243,352,1181,913,2148,
1086,818,723,2325,2217,628,438,2135,2     570,1353,248,
697,2190,839,2109,1573,1411,670,1316,1249,813,2138,
1602,623,489,1303,12    22,842,1195,1141,2196,1548,462,
2339,381,1168,900,2625,1087,819,738,2312,2245,1306,43
9,2150,2571,1116,792,725,684,2191,630,468,3089,2096,
1202671,2329,1793,576,442,2139,1     603,1413,252,1318,
1223,843,1128,2225,1577,463,2578,1361,368,1197,929,
2198,1550,739,2     341,1307,1226,902,21511145821,712,
2370,631,497,3076,2573,1118,850,1203,686,2316,22
49,1556,470,443,2154,1176,796,729,1319,634,4162141,
1605,2212,254,2579,1348,845,692,2 199,1551,1417,2104,
1322,1227,903,1132,808,741,2371,1309,484,3105,1119,
2202,851,1666,     687,2345,1585,471,3078,906,2155,376,
1205,825,716,2318,1558,635,445,2128,2689,1234,79
8,255,2594,1377,608,474,2214,1180,2581,1350,1323,694,
2324,2257,1609,2162,1296,1229,9 61,1134,2203,866,1667,
2373,2108,1572,486,3079,907,853,1192,812,745,2319,
1559,1425,43    2,2157,1330,1235,799,718,2595,1140,637,
475,3082,2215,380,1209,2568,1351,2434,1562,69 5,2353,
2244,1182,914,2163,1325,724,2326,1135,2218,867,2136,
2585,1354,487,698,2205,84 0,1669,2110,1574,1412,3137,
909,1331,1250,814,719,2377,1617,624,490,3083,1304,
1237,85 7,1196,2597,1142,2435,1563,477,2340,2273,382,
1183,915,2626,1088,820,753,2327,2246,22 19,440,2165,
2572,1355,726,699,2192,869,3090,2111,1575,1441,672,
2330,1794,1251,815,21 40,1604,1414,491,1333,1224,844,
1673,1143,2226,1578,464,3085,2817,1362,383,1198,930,2
627,2437,1565,740,2342,2247,1308,1241,917,2152,2601,
1146,822,727,2385,2221,632,498,3    091,2574,1357,1204,
701,2331,1250,1795,444,2169,1633,1415,730,1320,1253,
873,2142,1606,    2227,1579,493,2580,1363,846,1199,931,
2200,1552,1418,2343,1337,1228,904,2629,1147,82 3,742,
2372,3201,1310,499,3106,2575,1120,2441,852,1681,688,
2346,2251,1586,472,3093,92    1,2156,1206,826,731,2333,
1797,636,446,2143,1607,2690,1473,256,2609,1378,847,
2229,158 1,1419,2582,1365,1324,1257,933,2258,1610,743, 2401,1311,1230,962,3107,1149,2204,881,1 668,2374,2347,
1587,501,3080,908,2633,854,1207,827,746,2320,2253,
1560,1426,447,2158,2    691,1236,800,733,2596,1379,638,
476,3097,2216,1210,2583,1352,2449,1801,696,2354,2259,
1611,1421,2164,1326,1231,963,1136,2233,868,1697,2375,
2586,1369,488,3109,937,2206,855,     1670,747,2349,1589,
1427,3138,910,2159,1332,1265,829,720,2378,1618,639,
505,3084,2693,    1238,858,1211,2598,1381,2436,1564,478,
2355,2274,1184,916,2641,1327,754,2328,2261,161 3,2220,
2166,2587,1356,965,700,2207,870,1671,3329,2112,1576,
1442,3139,911,1809,1252,8    16,749,2379,1619,1429,492,
3113,1334,1239,859,1674,2599,1144,2465,1593,479,3086,
2818,  2275,384,1213,945,2628,2438,1566,755,2357,2248,
2697,1242,918,2167,2602,1385,728,2386,     2222,871,3092,
2589,1358,1443,702,2332,2265,1796,1729,2170,1634,
1416,3141,969,1335,1 254,874,1675,2381,1621,2228,1580,
494,3087,2819,1364,861,1200,932,2657,2439,1567,1433,
2344,2277,1338,1243,919,2630,2603,1148,824,757,2387,
3202,2223,500,3121,2576,1359,24 42,1682,703,2361,2252,
1825,3094,922,2171,1635,1445,732,2334,1798,1255,875,
2144,1608, 2705,1474,495,2610,1393,848,1677,2230,1582,
1420,3145,2821,1366,1339,1258,934,2631,24 97,1625,744,
2402,3203,1312,1245,977,3108,2605,1150,2443,882,1683,
2389,2348,2281,1588,   502,3095,923,2634,1208,828,761,
2335,2254,1799,448,2173,1637,2692,1475,734,2611,1380,
877,3098,2231,1583,1449,2584,1367,2450,1802,1259,935,
2260,1612,1422,2403,1341,1232,9 64,3585,1151,2234,883,
1698,2376,3205,2825,1370,503,3110,938,2635,2445,856,
1685,748,2 350,2255,1590,1428,3153,925,2160,2721,1266,
830,735,2393,1857,640,506,3099,2694,1477,     1212,2613,
1382,2451,1803,2356,2289,1641,1423,2642,1328,1261,
993,2262,1614,2235,1699,  2405,2588,1371,966,3111,939,
2208,885,1672,3330,2351,1591,1457,3140,912,2637,1810,
126 7,831,750,2380,3209,1620,1430,507,3114,2695,1240,
860,1689,2600,1383,2466,1594,480,31 01,2833,2276,1214,
946,2643,2453,1805,756,2358,2263,1615,2698,1481,2168,
2617,1386,967, 2237,872,1701,3331,2590,1373,1444,3169,
941,2266,1811,1730,751,2409,1649,1431,3142,9 70,3115,
1336,1269,889,1676,2382,1622,2467,1595,509,3088,2820,
2753,862,1215,947,2658, 2440,1568,1434,2359,2278,2699,
1244,920,2645,2604,1387,758,2388,3217,2224,3122,
2591,1 360,2457,1921,704,2362,2267,1826,1731,3333,
2172,1636,11446,3143,971,1813,1256,876,170 5,2383,
1623,2706,1489,496,3117,2849,1394,863,1678,2659,2469,
1597,1435,3146,2822,2279,    1340,1273,949,2632,2498,
1626,759,2417,3204,2701,1246,978,3123,2606,1389,2444,
1684,2 390,2363,2282,1827,3096,924,2649,1447,762,2336,
2269,1800,1733,2174,1638,2707,1476,97 3,2612,1395,878,
1679,3337,2232,1584,1450,3147,2823,1368,1817,1260,
936,2661,2499,1627, 1437,2404,3233,1342,1247,979,3586,
2607,1152,2473,884,1713,2391,3206,2826,2283,504,3 125,
953,2636,2446,1686,763,2365,2256,1829,3154,926,2175,
1639,2722,1505,736,2394,1858, 879,3100,2709,1478,1451,
2614,1397,2452,1804,1737,2290,1642,1424,3149,2881,
1343,1262,    994,3587,2501,1629,2236,1700,2406,3207,
2827,1372,981,3112,940,2665,2447,886,1687,33 45,2352,
2285,1592,1458,3155,927,2638,2723,1268,832,765,2395,
3210,1859,508,3129,2696,    1479,1690,2615,1384,2481,
1833,3102,2834,2291,1643,1453,2644,2454,1806,1263,
995,2264, 1616,2713,1482,2407,2618,1401,968,3589,2238,
887,1702,3332,3265,2829,1374,1459,3170,9 42,2639,2505,
1812,1745,752,2410,1650,1432,3157,985,3116,2725,1270,
890,1691,2397, 1861,2468,1596,510,3103,2835,2754,1216,
948,2673,2455,1807,2360,2293,1645,2700,1483,    2646,
2619,1388,997,3218,2239,1703,3361,2592,1375,2458,
1922,3171,943,2268,1841,1732,3    334,2411,1651,1461,
3144,972,3593,1814,1271,891,1706,2384,3213,1624,2945, 1490,511,311 8,2850,2755,864,1693,2660,2470,1598,1436, 3161,2837,2280,2729,1274,950,2647,2513,1865, 760,2418, 3219,2702,1485,3124,2621,1390,2459,1923,2364,2297, 1828,1761,3335,2650,1448, 3173,1001,2270,1815,1734, 1707,2413,1653,2708,1491,974,3119,2851,1396,893,1680, 3338, 2471,1599,1465,3148,2824,2757,1818,1275,951, 2662,2500,1628,1438,2419,3234,2703,1248, 980,3601, 2608,1391,2474,1714,2392,3221,2841,2284,3126,954, 2651,2461,1925,764,2366,22 71,1830,1735,3393,2176, 1640,2737,1506,975,1873,880,1709,3339,2710,1493,1452, 3177,285 3,1398,1819,1738,2663,2529,1657,1439,3150, 2882,3235,1344,1277,1009,3588,2502,1630,24 75,1715, 2421,3208,2828,2761,982,3127,955,2666,2448,1688,3346, 2367,2286,1831,3156,928, 2653,2724,1507,766,2396,3225, 1860,3130,2711,1480,1929,2616,1399,2482,1834,1739, 3341, 2292,1644,1454,3151,2883,1821,1264,996,3617, 2503,1631,2714,1497,2408,3237,2857,1402, 983,3590, 2667,2477,888,1717,3347,3266,2830,2287,1460,3185,957, 2640,2506,1746,767,24 25,3212,1889,3158,986,3131,2726, 1509,1692,2398,1862,2483,1835,3104,2836,2769,1455,26 74,2456,1808,1741,2294,1646,2715,1484,2885,2620,1403, 998,3591,3457,2240,1704,3362,32 67,2831,1376,1937, 3172,944,2669,2507,1842,1747,3349,2412,3241,1652, 1462,3159,987,359 4,2727,1272,892,1721,2399,3214,1863, 2946,512,3133,2865,2756,1694,2675,2485,1837,3162, 2838,2295,1647,2730,1513,2648,2514,1866,999,3220, 2717,1486,3363,2622,1405,2460,1924, 3649,2298,1843, 1762,3336,3269,2889,1463,3174,1002,3595,2509,1816, 1749,1708,2414,321 5,1654,2947,1492,989,3120,2852, 2785,894,1695,3353,2472,1600,1466,3163,2839,2758, 2731, 1276,952,2677,2515,1867,2420,3249,2704,1487, 3602,2623,1392,2489,1953,3222,2842,2299, 1763,3365, 2652,2462,1926,3175,1003,2272,1845,1736,3394,2415, 1655,2738,1521,976,3597, 1874,895,1710,3340,3273,2949, 1494,1467,3178,2854,2759,1820,1753,2664,2530,1658, 1440, 3165,2897,3236,2733,1278,1010,3603,2517,1869, 2476,1716,2422,3223,2843,2762,3128,956, 2681,2463, 1927,2368,2301,1832,1765,3395,2654,2739,1508,1005, 3226,1875,1711,3369,271 2,1495,1930,3179,2855,1400, 1849,1740,3342,2531,1659,1469,3152,2884,3713,1822, 1279,10 11,3618,2504,1632,2953,1498,2423,3238,2858, 2763,984,3605,2668,2478,1718,3348,3281,28 45,2288, 3186,958,2655,2521,1985,768,2426,3227,1890,3397,3132, 2741,1510,1931,1877,248 4,1836,1769,3343,2770,1456, 3181,2913,1823,1742,3619,2533,1661,2716,1499,2886, 3239,28 59,1404,1013,3592,3458,2479,1719,3377,3268, 2832,2765,1938,3187,959,2670,2508,1748,33 50,2427, 3242,1891,3160,988,3609,2728,1511,1722,2400,3229, 1864,2961,3134,2866,2771,19 33,2676,2486,1838,1743, 3401,2296,1648,2745,1514,2887,1881,1000,3621,3459, 2718,1501,3 364,3297,2861,1406,1939,3650,2671,2537, 1844,1777,3351,3270,2890,3243,1464,3189,1017, 3596, 2510,1750,1723,2429,3216,1893,2948,990,3135,2867, 2786,1696,3354,2487,1839,3164, 2840,2773,2732,1515, 2678,2516,1868,3250,2719,1488,3841,2624,1407,2490, 1954,3651,346 1,2300,1764,3366,3271,2891,1941,3176, 1004,3625,2511,1846,1751,3409,2416,3245,1656,29 77,1522,991,3598,2787,896,1725,3355,3274,2950,1468, 3193,2869,2760,1754,2679,2545,189 7,3166,2898,3251, 2734,1517,3604,2518,1870,2491,1955,3224,2844,2777, 3367,2682,2464,19 28,3653,2302,1847,1766,3396,2893, 2740,1523,1006,3599,3465,1876,1712,3370,3275,295, 1 496,1945,3180,2856,2789,1850,1755,3357,2532,1660, 1470,3167,2899,3714,2735,1280,1012, 3633,2519,1871, 2954,2424,3253,2873,2764,3606,2683,2493,1957,3282, 2846,2303,1767,342 5,2656,2522,1986,1007,3228,1905, 3398,3371,2742,1525,1932,3657,1878,1851,1770,3344,32 77,3009,1471,3182,2914,3715,1824,1757,3620,2534,1662, 2955,1500,2901,3240,2860,2793,1 014,3607,3473,2480, 1720,3378,3283,2847,2766,3188,960,2685,2523,1987, 2428,3257,1892,3 399,3610,2743,1512,1961,3230,1879, 2962,1771,3373,2772,1934,3183,2915,1853,1744,3402, 2535,1663,2746,1529,2888,3717,1882,1015,3622,3460, 2957,1502,3379,3298,2862,2767,194 0,3665,2672,2538, 1778,3352,3285,2905,3244,3190,1018,3611,2525,1989, 1724,2430,3231,18 94,2963,3136,2868,2801,1935,2488, 1840,1773,3403,2774,2747,1516,2917,1883,3623,3489,2 720,1503,3842,3299,2863,1408,1969,3652,3462,2539, 1779,3381,3272,2892,3721,1942,3191, 1019,3626,2512, 1752,3410,2431,3246,1895,2978,992,3613,2788,1726, 3356,3289,2965,3194, 28702775,1993,2680,2546,1898, 3405,3252,2749,1518,3843,1885,2492,1956,3681,3463,277 8,3368,3301,2921,1943,3654,3627,2541,1848,1781,3411, 2894,3247,2979,1524,1021,3600,34 66,1727,3385,3276, 2952,1946,3195,2871,2790,1756,3358,2547,1899,3168, 2900,3729,2736, 519,3634,2520,1872,2969,3254,2874, 2779,3845,2684,2494,1958,3655,3521,2304,1768,3426, 2895,2001,1008,3629,3467,1906,3413,3372,3305,2981, 1526,1947,3658,2791,1852,1785,335 9,3278,3010,1472, 3197,2929,3716,1758,3635,2549,1901,2956,2902,3255, 2875,2794,3608,34 74,2495,1959,3284,2848,2781,3427, 2686,2524,1988,3258,1907,3400,3849,2744,1527,1962,3 659,3469,1880,1772,3374,3279,3011,1949,3184,2916, 3745,1854,1759,3417,2536,1664,2985, 1530,2903,3718, 2795,1016,3637,3475,2958,3380,3313,2877,2768,3666, 2687,2553,2017,328 6,2906,3259,3429,3612,2526,1990, 1963,3232,1909,2964,3375,2802,1936,3661,1855,1774,34 04,3013,2748,1531,2918,3719,1884,3624,3490,2959, 1504, 3857,3300,2864,2797,1970,3667,3 477,2540,1780,3382, 3287,2907,3722,3192,1020,3641,2527,1991,2432,3261, 1896,2993,3614, 2803,1965,3290,2966,1775,3433,2776, 1994,2919,1913,3406,3491,2750,1533,3844,3777,188 6,1971,3682,3464,3017,3383,3302,2922,3723, 1944,3669, 3628,2542,1782,3412,2909,3248,29 80,1022,3615,3481, 1728,3386,3291,2967,3196,2872,2805,1995,2548,1900, 3407,3730,2751,1 520,3873,1887,2970,3683,3493,2780, 3846,3303,2923,1973,3656,3522,2543,1783,3441,2896, 3725,2002,1023,3630,3468,3414,3387,3306,2982,1948, 3673,2792,1786,3360,3293,3025,319 8,2930,3731,1997, 3636,2550,1902,2971,3256,2876,2809,3847,2496,1960, 3685,3523,2782,34 28,2925,2003,3631,3497,1908,3415, 3850,3307,2983,1528,1977,3660,3470,1787,3389,3280,3 012,1950,3199,2931,3746,1760,3418,2551,1903,2986, 2904,3733,2796,3638,3476,2973,3314, 2878,2783,3905, 2688,2554,2018,3525,3260,3430,3851,2005,1964,3689, 3471, 1910,3376,330 9,3041,1951,3662,3747,1856,1789, 3419,3014,2987,1532,2933,3720,3639,3505,2960,3858,33 15,2879,2798,3668,3478,2555,2019,3288,2908,3737,3431, 3642,2528,1992,3262,1911,2994,3 853,2804,1966,3663, 3529,1776,3434,3015,2009,2920,3749,1914,3421,3492, 2989,1534,3859, 3778,2799,1972,3697,3479,3018,3384, 3317,2937, 3724,3670,3643,2557,2021,2910,3263,299 5,3616,3482,1967,3292,2968,3435,2806,1996,1915,3408, 3969,2752,1535,3874,3779,1888,36 84,3494,3019,3861, 3304,2924,3753,1974,3671,3537,2544,1784,3442,2911, 3726,1024,3645,3 483,3388,3321,2997,3674,2807,2025, 3294,3026,3437,3732,1998,3875,1917,2972,3495,2810, 3848,3781,1975,3686,3524,3021,3443,2926,3727,2004, 3632,3498,3416,3865,3308,2984,197 8,3675,3485,1788, 3390,3295,3027,3200,2932,3761,1999,2552,1904,3001, 3734,2811,3877,29 74,3687,3553,2784,3906,2927,2033, 3526,34993445,3852,3785,2006,1979,3690,3472,3391,3 310,3042,1952,3677,3748,1790,3420,3029,2988,2934, 3735,3640,3506,2975,3316,2880,2813, 3907,2556,2020, 3527,3738,3432,3881,2007,3691,3501,1912,3854,3311,
3043,1981,3664,353 0, 1791,3449,3016,2010,2935,3750,
3422,3507,2990,3860,3793,2800,3698,3480,3033,3318,29
38,3739,3909,3644,2558,2022,3264,2996,3855,1968,3693,
3531,3436,3045,2011,3751,1916,3 423,3970,2991,1536,
3889,3780,3699,3509,3020,3862,3319,2939,3754,3672,
3538,2559,2023, 2912,3741,3646,3484,3322,2998,3913,
2808,2026,3533,3438,3971,2013,3876,3809,1918,349
6,3049,3863,3782,3755,1976,3701,3539,3022,3444,2941,
3728,3647,3513,3866,3323,2999,36 76,3486,2027,3296,
3028,3439,3762,2000,1919,3002,3973,2812,3878,3783,
3688,3554,3023,3 921,2928,3757,2034,3541,3500,3446,
3867,3786,1980,3705,3487,3392,3325,3057,3678,3763,
2029,3030,3003,3736,3879,2976,3555,2814,3908,2035,
3528,3977,3447,3882,3787,2008,369 2,3502,3869,3312,
3044,1982,3679,3545,1792,3450,3031,2936,3765,3508,
3005,3794,2815,39 37,3034,3557,3740,3910,3883,2037,
3503,3856,3789,1983,3694,3532,3451,3046,2012,3752,3
424,3985,2992,3890,3795,3700,3510,3035,3320,2940,
3769,3911,2560,2024,3742,3885,3695, 3561,3914,3047,
2041,3534,3453,3972,2014,3891,3810,3511,3050,3864,
3797,3756,3702,354 0,3037,2942,3743,3648,3514,3324,
3000,3915,2028,3535,3440,4001,2015,3811,1920,3974,30
51,3893,3784,3703,3569,3024,3922,2943,3758,3542,3515,
3868,3801,3706,3488,3326,3058,3 917,3764,2030,3004,
3975,3880,3813,3556,3053,3923,3759,2036,3543,3978,
3448,3897,3788, 3707,3517,3870,3327,3059,3680,3546,
2031,3032,3766,3006,4033,2816,3938,3558,3979,392
5,3884,3817,2038,3504,3871,3790,1984,3709,3547,3452,
3061,3767,3986,3007,3796,3939,30 36,3559,3770,3912,
2039,3981,3886,3791,3696,3562,3929,3048,2042,3549,
3454,3987,3892,3 825,3512,3065,3798,3771,3941,3038,
3744,3887,3563,3916,2043,3536,3455,4002,2016,3812,
3989,3052,3894,3799,3704,3570,3039,2944,3773,3516,
3802,3945,3565,3918,4003,2045,397 6,3895,3814,3571,
3054,3924,3760,3544,3993,3898,3803,3708,3518,3328,
3060,3919,2032,40 05,3815,4034,3055,3953,3573,3980,
3926,3899,3818,3519,3872,3805,3710,3548,3062,3768,3
008,4035,3940,3560,4009,3927,3819,2040,3982,3901,
3792,3711,3577,3930,3063,3550,3988, 3826,3066,4037,
3772,3942,3983,3888,3821,3564,3931,2044,3551,3456,
4017,3827,3990,306 7,3800,3943,3040,3774,4041,3946,
3566,3933,4004,2046,3991,3896,3829,3572,3069,3775,39
94,3804,3947,3567,3920,2047,4006,3816,4049,3056,3954,
3574,3995,3900,3833,3520,3806,3 949,4007,4036,3955,
3575,4010,3928,3820,3997,3902,3807,3712,3578,3064,
4065,40384011, 3957,3984,3903,3822,3579,3932,3552,
4018,3828,30684039,3944,4013,3823,4042,3961,358
1,3934,4019,3992,3830,3070,3776,4043,3948,3568,3935,
2048,4021,3831,4050,3071,3996,38 34,4045,3950,4008,
4051,3956,3576,4025,3835,3998,3808,3951,4066,4053,
4012,3958,3999,3 904,3837,3580,4067,4040,3959,4014,
3824,4057,3962,3582,4020,4069,4015,4044,3963,3583,
3936,4022,3832,3072,4073,4046,3965,4023,4052,4026,
3836,4047,3952,4081,4054,4027,400 0,3838,4068,4055,
3960,4029,3839,4058,4070,4016,4059,3964,3584,4071,
4074,4061,3966,40 24,4075,4048,3967,4082,4028,4077,
4083,4056,4030,3840,4085,4031,4060,4072,4089,4062,4
076,4063,3968,4078,4084,4079,4086,4032,4087,4090,
4091,4064,4093,4080,4088,4092,4094, 4095,4096.

It can be easily learned that the corresponding first polarization weight vector in which the polarization weights are sorted in ascending order and the corresponding first polarization weight vector in which the polarization weights are sorted in descending order are mutually in a reverse order. In other words, the former can be obtained by sequentially reading the latter in reverse order, or vice versa.

Both a first polarization weight vector that is corresponding to any N or $N_{max}$ and in which polarization weights are sorted in descending order and a first polarization weight vector that is corresponding to any N or $N_{max}$ and in which polarization weights are sorted in ascending order can be prestored.

Figure 10:
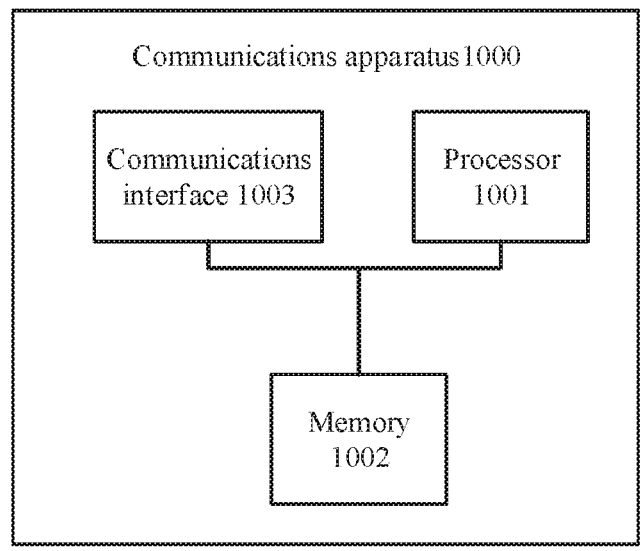
FIG. 10 is a schematic structural diagram of an embodiment of a communications apparatus according to this application.

FIG. 10 is a schematic structural diagram of an example of a communications apparatus according to this application. The communications apparatus may be a base station or a terminal. Based on the same idea, this application provides a communications apparatus, configured to perform the foregoing method procedure. As shown in FIG. 10, the apparatus 1000 includes a processor 1001, a memory 1002, and a communications interface 1003. The processor 1001, the memory 1002, and the communications interface 1003 are mutually coupled.

The memory 1002 may include a volatile memory (volatile memory), for example, a RAM. The memory may alternatively include a non-volatile memory (non-volatile memory), for example, a flash memory (flash memory), an HDD, or an SSD. The memory 1002 may alternatively include a combination of the foregoing types of memories.

The communications interface 1003 may be a wired communications interface, a wireless communications interface, or a combination thereof. The wired communications interface may be, for example, an Ethernet interface. The Ethernet interface may be an optical interface, an electrical interface, or a combination thereof. The wireless communications interface may be a WLAN interface.

The processor 1001 may be a CPU, an NP, or a combination of a CPU and an NP.

The processor 1001 may further include a hardware chip. The hardware chip may be an ASIC, a PLD, or a combination thereof. The PLD may be a CPLD, an FPGA, a GAL, or any combination thereof. In some embodiments, the memory 1002 may be further combined with the processor 1001, for example, may be implemented by using a circuit.

Optionally, the memory 1002 may be further configured to store an instruction for performing various operations. The processor 1001 invokes the instruction stored in the memory 1002, to perform one or more steps or optional implementations in the foregoing embodiments, so that the communications apparatus 1000 implements the foregoing methods, for example, calculates or stores at least one first polarization weight vector that is corresponding to N and in which polarization weights are sequentially sorted. A polarization weight of each polarized channel may be calculated in a manner including but not limited to the methods disclosed in the foregoing embodiments.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer instructions are loaded and executed on the computer, the procedures or functions according to the embodiments of the present invention are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, a computer, a server, or a data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk (SSD)), or the like.

A person skilled in the art should understand that the embodiments of the present invention may be provided as a method or a computer program product. Therefore, the present invention may use a form of hardware only embodiments, software only embodiments, or embodiments with a combination of software and hardware. Moreover, the present invention may use a form of a computer program product that is implemented on one or more computer-usable storage media (including but not limited to a disk memory, a CD-ROM, an optical memory, and the like) that include computer-usable program code.

The present invention is described with reference to the flowcharts and/or the block diagrams of the method, the device (system), and the computer program product according to the embodiments of the present invention. It should be understood that computer program instructions may be used to implement each process and/or each block in the flowcharts and/or the block diagrams, and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by the computer or the processor of any other programmable data processing device generate an apparatus for implementing a specified function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specified function in one or more processes in the flowcharts and/or in one or more blocks in the block diagrams.

These computer program instructions may alternatively be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specified function in one or more processes in the flowcharts and/or in one or more blocks in the block diagrams.

Although some embodiments of the present invention have been described, a person skilled in the art can make changes and modifications to these embodiments once they learn of the basic inventive concept. Therefore, the following claims are intended to be construed as to cover the embodiments and all changes and modifications falling within the scope of the present invention.

Obviously, a person skilled in the art can make various modifications and variations to the present invention without departing from the scope of the present invention. The present invention is intended to cover these modifications and variations provided that they fall within the scope of protection defined by the following claims and their equivalent technologies.

What is claimed is:

1. An encoding method performed by at least one processor of a first communications apparatus for wireless communications with a second wireless communications apparatus, comprising:

obtaining, by a first communications apparatus, information bits;

obtaining, by the first communications apparatus, a vector comprising N sequence numbers corresponding to N polarized channels for information bit selection the N sequence numbers in the vector are sorted according to arranging reliabilities of the N polarized channels in an ascending order, the minimum value of the N sequence numbers is 1;

determining, by the first communications apparatus, positions of each of the information bits based on the vector;

determining, by the first communications apparatus, N bits that correspond to the N polarized channels, wherein the N bits comprise the information bits and frozen bits;

performing, by the first communications apparatus, polar encoding on the N bits to obtain polar-encoded bits; and outputting, by the first communications apparatus, the polar-encoded bits;

wherein when N=1024:

a polarized channel corresponding to a sequence number 1 in the vector is in a $1^{st}$ position in the ascending order;

a polarized channel corresponding to a sequence number 5 in the vector is in a $4^{st}$ position in the ascending order;

a polarized channel corresponding to a sequence number 9 in the vector is in a $5^{th}$ position in the ascending order;

a polarized channel corresponding to a sequence number 17 in the vector is in a $6^{th}$ position in the ascending order;

a polarized channel corresponding to a sequence number 6 in the vector is in a $9^{th}$ position in the ascending order;

a polarized channel corresponding to a sequence number 10 in the vector is in a $11^{th}$ position in the ascending order;

a polarized channel corresponding to a sequence number 34 in the vector is in a $18^{th}$ position in the ascending order;

a polarized channel corresponding to a sequence number 67 in the vector is in a $27^{th}$ position in the ascending order;

a polarized channel corresponding to a sequence number 69 in the vector is in a $31^{th}$ position in the ascending order;

a polarized channel corresponding to a sequence number 137 in the vector is in a $49^{th}$ position in the ascending order;

a polarized channel corresponding to a sequence number 145 in the vector is in a $57^{th}$ position in the ascending order;

a polarized channel corresponding to a sequence number 162 in the vector is in a $107^{th}$ position in the ascending order;

a polarized channel corresponding to a sequence number 275 in the vector is in a $128^{th}$ position in the ascending order;

a polarized channel corresponding to a sequence number 290 in the vector is in a 137$^{th}$ position in the ascending order;
a polarized channel corresponding to a sequence number 195 in the vector is in a 138$^{th}$ position in the ascending order;
a polarized channel corresponding to a sequence number 277 in the vector is in a 140$^{th}$ position in the ascending order;
a polarized channel corresponding to a sequence number 205 in the vector is in a 258$^{th}$ position in the ascending order;
a polarized channel corresponding to a sequence number 211 in the vector is in a 266$^{th}$ position in the ascending order;
a polarized channel corresponding to a sequence number 307 in the vector is in a 278$^{th}$ position in the ascending order;
a polarized channel corresponding to a sequence number 118 in the vector is in a 284$^{th}$ position in the ascending order;
a polarized channel corresponding to a sequence number 331 in the vector is in a 288$^{th}$ position in the ascending order;
a polarized channel corresponding to a sequence number 355 in the vector is in a 346$^{th}$ position in the ascending order;
a polarized channel corresponding to a sequence number 595 in the vector is in a 376$^{th}$ position in the ascending order;
a polarized channel corresponding to a sequence number 610 in the vector is in a 391$^{th}$ position in the ascending order;
a polarized channel corresponding to a sequence number 356 in the vector is in a 431$^{th}$ position in the ascending order;
a polarized channel corresponding to a sequence number 570 in the vector is in a 470$^{th}$ position in the ascending order;
a polarized channel corresponding to a sequence number 410 in the vector is in a 490$^{th}$ position in the ascending order;
a polarized channel corresponding to a sequence number 371 in the vector is in a 520$^{th}$ position in the ascending order;
a polarized channel corresponding to a sequence number 426 in the vector is in a 523$^{th}$ position in the ascending order;
a polarized channel corresponding to a sequence number 413 in the vector is in a 528$^{th}$ position in the ascending order;
a polarized channel corresponding to a sequence number 244 in the vector is in a 553$^{th}$ position in the ascending order;
a polarized channel corresponding to a sequence number 455 in the vector is in a 555$^{th}$ position in the ascending order;
a polarized channel corresponding to a sequence number 682 in the vector is in a 591$^{th}$ position in the ascending order;
a polarized channel corresponding to a sequence number 629 in the vector is in a 608$^{th}$ position in the ascending order;
a polarized channel corresponding to a sequence number 439 in the vector is in a 689$^{th}$ position in the ascending order;
a polarized channel corresponding to a sequence number 635 in the vector is in a 731$^{th}$ position in the ascending order;
a polarized channel corresponding to a sequence number 380 in the vector is in a 750$^{th}$ position in the ascending order;
a polarized channel corresponding to a sequence number 909 in the vector is in a 758$^{th}$ position in the ascending order;
a polarized channel corresponding to a sequence number 915 in the vector is in a 766$^{th}$ position in the ascending order;
a polarized channel corresponding to a sequence number 852 in the vector is in a 797$^{th}$ position in the ascending order;
a polarized channel corresponding to a sequence number 859 in the vector is in a 844$^{th}$ position in the ascending order;
a polarized channel corresponding to a sequence number 479 in the vector is in a 845$^{th}$ position in the ascending order;
a polarized channel corresponding to a sequence number 871 in the vector is in a 851$^{th}$ position in the ascending order;
a polarized channel corresponding to a sequence number 932 in the vector is in a 857$^{th}$ position in the ascending order;
a polarized channel corresponding to a sequence number 938 in the vector is in a 883$^{th}$ position in the ascending order;
a polarized channel corresponding to a sequence number 748 in the vector is in a 885$^{th}$ position in the ascending order;
a polarized channel corresponding to a sequence number 860 in the vector is in a 899$^{th}$ position in the ascending order;
a polarized channel corresponding to a sequence number 926 in the vector is in a 932$^{th}$ position in the ascending order;
a polarized channel corresponding to a sequence number 994 in the vector is in a 935$^{th}$ position in the ascending order;
a polarized channel corresponding to a sequence number 940 in the vector is in a 937$^{th}$ position in the ascending order;
a polarized channel corresponding to a sequence number 765 in the vector is in a 941$^{th}$ position in the ascending order;
a polarized channel corresponding to a sequence number 997 in the vector is in a 952$^{th}$ position in the ascending order;
a polarized channel corresponding to a sequence number 996 in the vector is in a 974$^{th}$ position in the ascending order;
a polarized channel corresponding to a sequence number 944 in the vector is in a 981$^{th}$ position in the ascending order;
a polarized channel corresponding to a sequence number 976 in the vector is in a 991$^{th}$ position in the ascending order;
a polarized channel corresponding to a sequence number 895 in the vector is in a 992$^{th}$ position in the ascending order;
a polarized channel corresponding to a sequence number 1010 in the vector is in a 993$^{th}$ position in the ascending order;

a polarized channel corresponding to a sequence number 956 in the vector is in a 994$^{th}$ position in the ascending order;
a polarized channel corresponding to a sequence number 1005 in the vector is in a 995$^{th}$ position in the ascending order;
a polarized channel corresponding to a sequence number 1011 in the vector is in a 996$^{th}$ position in the ascending order;
a polarized channel corresponding to a sequence number 990 in the vector is in a 1005$^{th}$ position in the ascending order;
a polarized channel corresponding to a sequence number 1004 in the vector is in a 1006$^{th}$ position in the ascending order;
a polarized channel corresponding to a sequence number 991 in the vector is in a 1007$^{th}$ position in the ascending order;
a polarized channel corresponding to a sequence number 992 in the vector is in a 1017$^{th}$ position in the ascending order; and
a polarized channel corresponding to a sequence number 1024 in the vector is in a 1024$^{th}$ position in the ascending order; and wherein
the polar-encoded bits are to be transmitted by the first communications apparatus to a second communications apparatus through wireless communications.

2. The method according to claim 1, wherein the obtaining the vector comprises:
calculating the reliability $w_i$ of the N polarized channels according to the following formula to obtain the vector:

$$W_i = \sum_{j=0}^{n-1} B_j * (2^j + \phi)^\alpha,$$

wherein
$i \triangleq B_{n-1} B_{n-2} \ldots B_0$, i is a channel index number, $B_{n-1} B_{n-2} \ldots B_0$ is a binary representation of i, $B_{n-1}$ is a most significant bit, $B_0$ is a least significant bit, $B_j \in \{0,1\}$, $j \in \{0, 1, \ldots, n-1\}$, $i \in \{0, 1, \ldots, N-1\}$, $N=2^n$, $\phi$ and $\alpha$ are parameters that are preset based on a target code length and a code rate of a polar code, and n is a positive integer.

3. The method according to claim 2, wherein $\phi=0$, and $\alpha=\frac{1}{4}$.

4. The method according to claim 2, wherein when a reliability of a first polarized channel is greater than that of a second polarized channel, the first polarized channel is before the second polarized channel in the vector.

5. The method according to claim 1, wherein the obtaining a vector comprises:
obtaining the vector $W_0^{N-1}$ through recursion calculation according to the following formulas:

$\beta_i = (2^{i-1} + \phi)^\alpha;$ $W_{2^{i-1}}^{2^i-1} = W_0^{2^{i-1}-1} + \beta_i;$ and $W_0^{2^i-1} = [W_0^{2^{i-1}-1}, W_{2^{i-1}}^{2^i-1}],$ wherein $W_0^1 = [W_0, W_1], W_0^{2^i-1} = [W_0, W_1, \ldots, W_{2^i-1}],$ wherein $i \in \{1, \ldots, N-1\}$, $\beta_i$ is an intermediate variable related to a channel index number i, $\phi$ and $\alpha$ are parameters that are preset based on the target code length and a code rate of a polar code, and $W_0$ is an arbitrary constant.

6. The method according to claim 1, wherein the quantity N of bits is determined based on a target code length M.

7. A communications apparatus, comprising:
at least one processor; and
a non-transitory computer-readable storage medium coupled to the at least one processor and storing programming instructions for execution by the at least one processor, the programming instructions instruct the at least one processor to:
obtain information bits;
obtaining a vector comprising N sequence numbers corresponding to N polarized channels for information bit selection the N sequence numbers in the vector are sorted according to arranging reliabilities of the N polarized channels in an ascending order, the minimum value of the N sequence numbers is 1;
determining positions of each of the information bits based on the vector;
determining N bits that correspond to the N polarized channels, wherein the N bits comprise the information bits and frozen bits;
performing polar encoding on the N bits to obtain polar-encoded bits; and
outputting the polar-encoded bits;
wherein when N=1024:
a polarized channel corresponding to a sequence number 1 in the vector is in a 1$^{st}$ position in the ascending order;
a polarized channel corresponding to a sequence number 5 in the vector is in a 4$^{th}$ position in the ascending order;
a polarized channel corresponding to a sequence number 9 in the vector is in a 5$^{th}$ position in the ascending order;
a polarized channel corresponding to a sequence number 17 in the vector is in a 6$^{th}$ position in the ascending order;
a polarized channel corresponding to a sequence number 6 in the vector is in a 9$^{th}$ position in the ascending order;
a polarized channel corresponding to a sequence number 10 in the vector is in a 11$^{th}$ position in the ascending order;
a polarized channel corresponding to a sequence number 34 in the vector is in a 18$^{th}$ position in the ascending order;
a polarized channel corresponding to a sequence number 67 in the vector is in a 27$^{th}$ position in the ascending order;
a polarized channel corresponding to a sequence number 69 in the vector is in a 31$^{th}$ position in the ascending order;
a polarized channel corresponding to a sequence number 137 in the vector is in a 49$^{th}$ position in the ascending order;
a polarized channel corresponding to a sequence number 145 in the vector is in a 57$^{th}$ position in the ascending order;
a polarized channel corresponding to a sequence number 162 in the vector is in a 107$^{th}$ position in the ascending order;
a polarized channel corresponding to a sequence number 275 in the vector is in a 128$^{th}$ position in the ascending order;
a polarized channel corresponding to a sequence number 290 in the vector is in a 137$^{th}$ position in the ascending order;
a polarized channel corresponding to a sequence number 195 in the vector is in a 138$^{th}$ position in the ascending order;

a polarized channel corresponding to a sequence number 277 in the vector is in a 140$^{th}$ position in the ascending order;

a polarized channel corresponding to a sequence number 205 in the vector is in a 258$^{th}$ position in the ascending order;

a polarized channel corresponding to a sequence number 211 in the vector is in a 266$^{th}$ position in the ascending order;

a polarized channel corresponding to a sequence number 307 in the vector is in a 278$^{th}$ position in the ascending order;

a polarized channel corresponding to a sequence number 118 in the vector is in a 284$^{th}$ position in the ascending order;

a polarized channel corresponding to a sequence number 331 in the vector is in a 288$^{th}$ position in the ascending order;

a polarized channel corresponding to a sequence number 355 in the vector is in a 346$^{th}$ position in the ascending order;

a polarized channel corresponding to a sequence number 595 in the vector is in a 376$^{th}$ position in the ascending order;

a polarized channel corresponding to a sequence number 610 in the vector is in a 391$^{th}$ position in the ascending order;

a polarized channel corresponding to a sequence number 356 in the vector is in a 431$^{th}$ position in the ascending order;

a polarized channel corresponding to a sequence number 570 in the vector is in a 470$^{th}$ position in the ascending order;

a polarized channel corresponding to a sequence number 410 in the vector is in a 490$^{th}$ position in the ascending order;

a polarized channel corresponding to a sequence number 371 in the vector is in a 520$^{th}$ position in the ascending order;

a polarized channel corresponding to a sequence number 426 in the vector is in a 523$^{th}$ position in the ascending order;

a polarized channel corresponding to a sequence number 413 in the vector is in a 528$^{th}$ position in the ascending order;

a polarized channel corresponding to a sequence number 244 in the vector is in a 553$^{th}$ position in the ascending order;

a polarized channel corresponding to a sequence number 455 in the vector is in a 555$^{th}$ position in the ascending order;

a polarized channel corresponding to a sequence number 682 in the vector is in a 591$^{th}$ position in the ascending order;

a polarized channel corresponding to a sequence number 629 in the vector is in a 608$^{th}$ position in the ascending order;

a polarized channel corresponding to a sequence number 439 in the vector is in a 689$^{th}$ position in the ascending order;

a polarized channel corresponding to a sequence number 635 in the vector is in a 731$^{th}$ position in the ascending order;

a polarized channel corresponding to a sequence number 380 in the vector is in a 750$^{th}$ position in the ascending order;

a polarized channel corresponding to a sequence number 909 in the vector is in a 758$^{th}$ position in the ascending order;

a polarized channel corresponding to a sequence number 915 in the vector is in a 766$^{th}$ position in the ascending order;

a polarized channel corresponding to a sequence number 852 in the vector is in a 797$^{th}$ position in the ascending order;

a polarized channel corresponding to a sequence number 859 in the vector is in a 844$^{th}$ position in the ascending order;

a polarized channel corresponding to a sequence number 479 in the vector is in a 845$^{th}$ position in the ascending order;

a polarized channel corresponding to a sequence number 871 in the vector is in a 851$^{th}$ position in the ascending order;

a polarized channel corresponding to a sequence number 932 in the vector is in a 857$^{th}$ position in the ascending order;

a polarized channel corresponding to a sequence number 938 in the vector is in a 883$^{th}$ position in the ascending order;

a polarized channel corresponding to a sequence number 748 in the vector is in a 885$^{th}$ position in the ascending order;

a polarized channel corresponding to a sequence number 860 in the vector is in a 899$^{th}$ position in the ascending order;

a polarized channel corresponding to a sequence number 926 in the vector is in a 932$^{th}$ position in the ascending order;

a polarized channel corresponding to a sequence number 994 in the vector is in a 935$^{th}$ position in the ascending order;

a polarized channel corresponding to a sequence number 940 in the vector is in a 937$^{th}$ position in the ascending order;

a polarized channel corresponding to a sequence number 765 in the vector is in a 941$^{th}$ position in the ascending order;

a polarized channel corresponding to a sequence number 997 in the vector is in a 952$^{th}$ position in the ascending order;

a polarized channel corresponding to a sequence number 996 in the vector is in a 974$^{th}$ position in the ascending order;

a polarized channel corresponding to a sequence number 944 in the vector is in a 981$^{th}$ position in the ascending order;

a polarized channel corresponding to a sequence number 976 in the vector is in a 991$^{th}$ position in the ascending order;

a polarized channel corresponding to a sequence number 895 in the vector is in a 992$^{th}$ position in the ascending order;

a polarized channel corresponding to a sequence number 1010 in the vector is in a 993$^{th}$ position in the ascending order;

a polarized channel corresponding to a sequence number 956 in the vector is in a 994$^{th}$ position in the ascending order;

a polarized channel corresponding to a sequence number 1005 in the vector is in a 995$^{th}$ position in the ascending order;

a polarized channel corresponding to a sequence number 1011 in the vector is in a 996$^{th}$ position in the ascending order;
a polarized channel corresponding to a sequence number 990 in the vector is in a 1005$^{th}$ position in the ascending order;
a polarized channel corresponding to a sequence number 1004 in the vector is in a 1006$^{th}$ position in the ascending order;
a polarized channel corresponding to a sequence number 991 in the vector is in a 1007$^{th}$ position in the ascending order;
a polarized channel corresponding to a sequence number 992 in the vector is in a 1017$^{th}$ position in the ascending order; and
a polarized channel corresponding to a sequence number 1024 in the vector is in a 1024$^{th}$ position in the ascending order; and wherein
the polar-encoded bits are to be transmitted by the communications apparatus to another communications apparatus through wireless communications.

8. The communications apparatus according to claim 7, wherein the at least one processor is configured to:
calculate the reliability $w_i$ of the N polarized channels according to the following formula to obtain the vector:

$$W_i = \sum_{j=0}^{n-1} B_j * (2^j + \phi)^\alpha,$$

wherein
$i \triangleq B_{n-1}B_{n-2} \ldots B_0$, i is a channel index number, $B_{n-1}B_{n-2} \ldots B_0$ is a binary representation of i, $B_{n-1}$ is a most significant bit, $B_0$ is a least significant bit, $B_j \in \{0,1\}$, $j \in \{0, 1, \ldots, n-1\}$, $i \in \{0, 1, \ldots, N-1\}$, $N=2^n$, $\phi$ and $\alpha$ are parameters that are preset based on a target code length and a code rate of a polar code, and n is a positive integer.

9. The communications apparatus according to claim 8, wherein $\phi=0$, and $\alpha=\frac{1}{4}$.

10. The communications apparatus according to claim 8, wherein when a reliability of a first polarized channel is greater than that of a second polarized channel, the first polarized channel is before the second polarized channel in the vector.

11. The communications apparatus according to claim 7, wherein the at least one processor is configured to:
obtain the vector $W_0^{N-1}$ through recursion calculation according to the following formulas:

$\beta_i = (2^{i-1} + \phi)^\alpha;$ $W_{2^{i-1}}^{2^i-1} = W_0^{2^{i-1}-1} + \beta_i;$ and $W_0^{2^i-1} = [W_0^{2^{i-1}-1}, W_{2^{i-1}}^{2^i-1}],$ wherein $W_0^1 = [W_0, W_1], W_0^{2^i-1} = [W_0, W_1, \ldots, W_{2^i-1}],$ wherein $i \in \{1, \ldots, N-1\}$, $\beta_i$ is an intermediate variable related to a channel index number i, $\phi$ and $\alpha$ are parameters that are preset based on the target code length and a code rate of a polar code, and $W_0$ is an arbitrary constant.

12. The communications apparatus according to claim 7, wherein the quantity N of bits is determined based on a target code length M.

13. A non-transitory computer readable storage medium comprising instructions executable by a communications apparatus to perform operations comprising:
obtaining information bits;
obtaining a vector comprising N sequence numbers corresponding to N polarized channels for information bit selection the N sequence numbers in the vector are sorted according to arranging reliabilities of the N polarized channels in an ascending order, the minimum value of the N sequence numbers is 1;
determining positions of each of the information bits based on the vector;
determining N bits that correspond to the N polarized channels, wherein the N bits comprise the information bits and frozen bits;
performing polar encoding on the N bits to obtain polar-encoded bits; and
outputting the polar-encoded bits;
wherein when N=1024:
a polarized channel corresponding to a sequence number 1 in the vector is in a 1$^{st}$ position in the ascending order;
a polarized channel corresponding to a sequence number 5 in the vector is in a 4$^{th}$ position in the ascending order;
a polarized channel corresponding to a sequence number 9 in the vector is in a 5$^{th}$ position in the ascending order;
a polarized channel corresponding to a sequence number 17 in the vector is in a 6$^{th}$ position in the ascending order;
a polarized channel corresponding to a sequence number 6 in the vector is in a 9$^{th}$ position in the ascending order;
a polarized channel corresponding to a sequence number 10 in the vector is in a 11$^{th}$ position in the ascending order;
a polarized channel corresponding to a sequence number 34 in the vector is in a 18$^{th}$ position in the ascending order;
a polarized channel corresponding to a sequence number 67 in the vector is in a 27$^{th}$ position in the ascending order;
a polarized channel corresponding to a sequence number 69 in the vector is in a 31$^{th}$ position in the ascending order;
a polarized channel corresponding to a sequence number 137 in the vector is in a 49$^{th}$ position in the ascending order;
a polarized channel corresponding to a sequence number 145 in the vector is in a 57$^{th}$ position in the ascending order;
a polarized channel corresponding to a sequence number 162 in the vector is in a 107$^{th}$ position in the ascending order;
a polarized channel corresponding to a sequence number 275 in the vector is in a 128$^{th}$ position in the ascending order;
a polarized channel corresponding to a sequence number 290 in the vector is in a 137$^{th}$ position in the ascending order;
a polarized channel corresponding to a sequence number 195 in the vector is in a 138$^{th}$ position in the ascending order;
a polarized channel corresponding to a sequence number 277 in the vector is in a 140$^{th}$ position in the ascending order;
a polarized channel corresponding to a sequence number 205 in the vector is in a 258$^{th}$ position in the ascending order;
a polarized channel corresponding to a sequence number 211 in the vector is in a 266$^{th}$ position in the ascending order;

a polarized channel corresponding to a sequence number 307 in the vector is in a 278$^{th}$ position in the ascending order;
a polarized channel corresponding to a sequence number 118 in the vector is in a 284$^{th}$ position in the ascending order;
a polarized channel corresponding to a sequence number 331 in the vector is in a 288$^{th}$ position in the ascending order;
a polarized channel corresponding to a sequence number 355 in the vector is in a 346$^{th}$ position in the ascending order;
a polarized channel corresponding to a sequence number 595 in the vector is in a 376$^{th}$ position in the ascending order;
a polarized channel corresponding to a sequence number 610 in the vector is in a 391$^{th}$ position in the ascending order;
a polarized channel corresponding to a sequence number 356 in the vector is in a 431$^{th}$ position in the ascending order;
a polarized channel corresponding to a sequence number 570 in the vector is in a 470$^{th}$ position in the ascending order;
a polarized channel corresponding to a sequence number 410 in the vector is in a 490$^{th}$ position in the ascending order;
a polarized channel corresponding to a sequence number 371 in the vector is in a 520$^{th}$ position in the ascending order;
a polarized channel corresponding to a sequence number 426 in the vector is in a 523$^{th}$ position in the ascending order;
a polarized channel corresponding to a sequence number 413 in the vector is in a 528$^{th}$ position in the ascending order;
a polarized channel corresponding to a sequence number 244 in the vector is in a 553$^{th}$ position in the ascending order;
a polarized channel corresponding to a sequence number 455 in the vector is in a 555$^{th}$ position in the ascending order;
a polarized channel corresponding to a sequence number 682 in the vector is in a 591$^{th}$ position in the ascending order;
a polarized channel corresponding to a sequence number 629 in the vector is in a 608$^{th}$ position in the ascending order;
a polarized channel corresponding to a sequence number 439 in the vector is in a 689$^{th}$ position in the ascending order;
a polarized channel corresponding to a sequence number 635 in the vector is in a 731$^{th}$ position in the ascending order;
a polarized channel corresponding to a sequence number 380 in the vector is in a 750$^{th}$ position in the ascending order;
a polarized channel corresponding to a sequence number 909 in the vector is in a 758$^{th}$ position in the ascending order;
a polarized channel corresponding to a sequence number 915 in the vector is in a 766$^{th}$ position in the ascending order;
a polarized channel corresponding to a sequence number 852 in the vector is in a 797$^{th}$ position in the ascending order;
a polarized channel corresponding to a sequence number 859 in the vector is in a 844$^{th}$ position in the ascending order;
a polarized channel corresponding to a sequence number 479 in the vector is in a 845$^{th}$ position in the ascending order;
a polarized channel corresponding to a sequence number 871 in the vector is in a 851$^{th}$ position in the ascending order;
a polarized channel corresponding to a sequence number 932 in the vector is in a 857$^{th}$ position in the ascending order;
a polarized channel corresponding to a sequence number 938 in the vector is in a 883$^{th}$ position in the ascending order;
a polarized channel corresponding to a sequence number 748 in the vector is in a 885$^{th}$ position in the ascending order;
a polarized channel corresponding to a sequence number 860 in the vector is in a 899$^{th}$ position in the ascending order;
a polarized channel corresponding to a sequence number 926 in the vector is in a 932$^{th}$ position in the ascending order;
a polarized channel corresponding to a sequence number 994 in the vector is in a 935$^{th}$ position in the ascending order;
a polarized channel corresponding to a sequence number 940 in the vector is in a 937$^{th}$ position in the ascending order;
a polarized channel corresponding to a sequence number 765 in the vector is in a 941$^{th}$ position in the ascending order;
a polarized channel corresponding to a sequence number 997 in the vector is in a 952$^{th}$ position in the ascending order;
a polarized channel corresponding to a sequence number 996 in the vector is in a 974$^{th}$ position in the ascending order;
a polarized channel corresponding to a sequence number 944 in the vector is in a 981$^{th}$ position in the ascending order;
a polarized channel corresponding to a sequence number 976 in the vector is in a 991$^{th}$ position in the ascending order;
a polarized channel corresponding to a sequence number 895 in the vector is in a 992$^{th}$ position in the ascending order;
a polarized channel corresponding to a sequence number 1010 in the vector is in a 993$^{th}$ position in the ascending order;
a polarized channel corresponding to a sequence number 956 in the vector is in a 994$^{th}$ position in the ascending order;
a polarized channel corresponding to a sequence number 1005 in the vector is in a 995$^{th}$ position in the ascending order;
a polarized channel corresponding to a sequence number 1011 in the vector is in a 996$^{th}$ position in the ascending order;
a polarized channel corresponding to a sequence number 990 in the vector is in a 1005$^{th}$ position in the ascending order;
a polarized channel corresponding to a sequence number 1004 in the vector is in a 1006$^{th}$ position in the ascending order;

a polarized channel corresponding to a sequence number 991 in the vector is in a 1007$^{th}$ position in the ascending order;

a polarized channel corresponding to a sequence number 992 in the vector is in a 1017$^{th}$ position in the ascending order; and a polarized channel corresponding to a sequence number 1024 in the vector is in a 1024$^{th}$ position in the ascending order; and wherein the polar-encoded bits are to be transmitted by the communications apparatus to another communications apparatus through wireless communications.

14. The non-transitory computer readable storage medium according to claim 13, wherein the obtaining a polarization weight vector comprises:

calculating the polarization weights $w_i$ of the N polarized channels according to the following formula to obtain the polarization weight vector:

$$W_i = \sum_{j=0}^{n-1} B_j * (2^j + \phi)^\alpha,$$

wherein $i \triangleq B_{n-1} B_{n-2} \ldots B_0$, i is a channel index number, $B_{n-1} B_{n-2} \ldots B_0$ is a binary representation of i, $B_{n-1}$ is a most significant bit, $B_0$ is a least significant bit, $B_j \in \{0,1\}$, $j \in \{0, 1, \ldots, n-1\}$, $i \in \{0, 1, \ldots, N-1\}$, $N=2^n$, $\phi$ and $\alpha$ are parameters that are preset based on a target code length and a code rate of a polar code, and n is a positive integer.

15. The non-transitory computer readable storage medium according to claim 14, wherein $\phi=0$, and $\alpha=\frac{1}{4}$.

16. The non-transitory computer readable storage medium according to claim 14, wherein when a reliability of a first polarized channel is greater than that of a second polarized channel, the first polarized channel is before the second polarized channel in the vector.

17. The non-transitory computer readable storage medium according to claim 13, wherein the operations further comprising:

obtaining the first vector $W_0^{N-1}$ through recursion calculation according to the following formulas:

obtaining the vector $W_0^{N-1}$ through recursion calculation according to the following formulas:

$\beta_i = (2^{i-1} + \phi)^\alpha;$ $W_{2^{i-1}}^{2^i-1} = W_0^{2^{i-1}-1} + \beta_i;$ and $W_0^{2^i-1} = [W_0^{2^{i-1}-1}, W_{2^{i-1}}^{2^i-1}]$, wherein $W_0^1 = [W_0, W_1], W_0^{2^i-1} = = [W_0, W_1, \ldots, W_{2^i-1}]$, wherein $i \in \{1, \ldots, N-1\}$, $\beta_i$ is an intermediate variable related to a channel index number i, $\phi$ and $\alpha$ are parameters that are preset based on the target code length and a code rate of a polar code, and $W_0$ is an arbitrary constant.

18. The non-transitory computer readable storage medium according to claim 13, wherein the quantity N is determined based on a target code length M.

* * * * *